United States Patent
Wen et al.

(10) Patent No.: US 12,540,275 B2
(45) Date of Patent: Feb. 3, 2026

(54) ORGANIC COMPOUNDS, MIXTURES AND APPLICATIONS THEREOF IN ORGANIC ELECTRONIC DEVICES

(71) Applicant: Zhejiang Brilliant Optoelectronic Technology Co.,Ltd., Taizhou (CN)

(72) Inventors: Lei Wen, Taizhou (CN); Huaijun Chen, Taizhou (CN); Junyou Pan, Taizhou (CN)

(73) Assignee: Zhejiang Brilliant Optoelectronic Technology Co., Ltd., Taizhou (CN)

( * ) Notice: Subject to any disclaimer, the term of this patent is extended or adjusted under 35 U.S.C. 154(b) by 188 days.

(21) Appl. No.: 18/351,649

(22) Filed: Jul. 13, 2023

(65) Prior Publication Data

US 2023/0380280 A1    Nov. 23, 2023

Related U.S. Application Data

(63) Continuation of application No. PCT/CN2022/071813, filed on Jan. 13, 2022.

(30) Foreign Application Priority Data

Jan. 13, 2021   (CN) .......................... 202110041212.4

(51) Int. Cl.
  *C09K 11/06*    (2006.01)
  *C07C 211/54*   (2006.01)
  *C07D 471/16*   (2006.01)
  *C07D 471/22*   (2006.01)
  *C07D 487/06*   (2006.01)
  *C07D 495/04*   (2006.01)
  *C07D 519/00*   (2006.01)
  *H10K 85/00*    (2023.01)
  *H10K 85/60*    (2023.01)
  *H10K 50/11*    (2023.01)
  *H10K 101/00*   (2023.01)

(52) U.S. Cl.
  CPC ............ *C09K 11/06* (2013.01); *C07C 211/54* (2013.01); *C07D 471/16* (2013.01); *C07D 471/22* (2013.01); *C07D 487/06* (2013.01); *C07D 495/04* (2013.01); *C07D 519/00* (2013.01); *H10K 85/00* (2023.02); *H10K 85/615* (2023.02); *H10K 85/633* (2023.02); *H10K 85/654* (2023.02); *H10K 85/657* (2023.02); *H10K 85/6572* (2023.02); *C07C 2603/26* (2017.05); *C09K 2211/1007* (2013.01); *C09K 2211/1011* (2013.01); *C09K 2211/1014* (2013.01); *C09K 2211/1018* (2013.01); *H10K 50/11* (2023.02); *H10K 85/626* (2023.02); *H10K 2101/90* (2023.02)

(58) Field of Classification Search
  CPC .................................................. C07D 487/06
  See application file for complete search history.

(56) References Cited

U.S. PATENT DOCUMENTS

| | | |
|---|---|---|
| 3,567,450 A | 3/1971 | Brantly et al. |
| 3,615,404 A | 10/1971 | Price et al. |
| 4,720,432 A | 1/1988 | VanSlyke et al. |
| 5,061,569 A | 10/1991 | VanSlyke et al. |
| 6,824,895 B1 | 11/2004 | Sowinski et al. |
| 6,830,828 B2 | 12/2004 | Thompson et al. |
| 6,835,469 B2 | 12/2004 | Kwong et al. |
| 7,029,766 B2 | 4/2006 | Huo et al. |
| 2001/0053462 A1 | 12/2001 | Mishima |
| 2005/0258742 A1 | 11/2005 | Tsai et al. |
| 2007/0087219 A1 | 4/2007 | Ren et al. |
| 2007/0252517 A1 | 11/2007 | Owczarczyk et al. |
| 2008/0027220 A1 | 1/2008 | Stossel et al. |
| 2009/0061681 A1 | 3/2009 | McMunigal et al. |
| 2009/0134784 A1 | 5/2009 | Lin et al. |
| 2012/0004407 A1 | 1/2012 | Stoessel et al. |
| 2012/0217869 A1 | 8/2012 | Adachi et al. |
| 2016/0293856 A1 | 10/2016 | Ji et al. |
| 2017/0092880 A1 | 3/2017 | Boudreault et al. |
| 2018/0006247 A1 | 1/2018 | Zeng et al. |

FOREIGN PATENT DOCUMENTS

| | | | |
|---|---|---|---|
| CN | 102282150 A | 12/2011 | |
| CN | 102822174 A | 12/2012 | |
| CN | 103483332 A | 1/2014 | |
| CN | 110268037 A | 9/2019 | |
| CN | 110746430 A | * 2/2020 | ........... C07D 487/06 |
| CN | 111718355 A | * 9/2020 | ........... C07D 487/16 |
| CN | 112375082 A | 2/2021 | |
| CN | 112480128 A | 3/2021 | |
| EP | 1191612 A2 | 3/2002 | |
| EP | 1191613 A2 | 3/2002 | |
| EP | 1191614 A2 | 3/2002 | |
| EP | 3301097 A2 | 4/2018 | |

(Continued)

OTHER PUBLICATIONS

Adachi et al., High-efficiency red electrophosphorescence devices, Applied Physics Letters, 2001, vol. 78, No. 11, pp. 1622-1624, dated Mar. 12, 2001.

Baldo et al., High-efficiency fluorescent organic light-emitting devices using a phosphorescent sensitizer, Nature, vol. 403, pp. 750-753, dated Feb. 17, 2000.

Bulovic et al., Transparent light-emitting devices, Nature, 1996, 380, p. 29, dated Mar. 7, 1996.

Dias et al., Triplet Harvesting with 100% Efficiency by Way of Thermally Activated Delayed Fluorescence in Charge Transfer OLED Emitters, Advanced Materials, vol. 25, pp. 3707-3714, dated Jul. 19, 2013.

Endo et al., Efficient up-conversion of triplet excitons into a singlet state and its application for organic light emitting diodes, Applied Physics Letters, 2011, 98(8), 083302, pp. 1-3, dated Feb. 24, 2011.

(Continued)

*Primary Examiner* — Khanh T Nguyen

(74) *Attorney, Agent, or Firm* — Westbridge IP LLC

(57) ABSTRACT

Provided are organic compounds including a structure of formula (I). Also provided are mixtures containing the organic compounds. Further provided are organic electronic devices containing the organic compounds or the mixtures.

19 Claims, No Drawings

(56) References Cited

FOREIGN PATENT DOCUMENTS

| | | | |
|---|---|---|---|
| KR | 20150077220 A | 7/2015 | |
| KR | 20190007792 A * | 1/2019 | .......... C07D 487/14 |
| TW | 201309696 A | 3/2013 | |
| TW | 201309778 A | 3/2013 | |
| TW | 201343874 A | 11/2013 | |
| TW | 201350558 A | 12/2013 | |
| WO | 0070655 A2 | 11/2000 | |
| WO | 0141512 A1 | 6/2001 | |
| WO | 0202714 A2 | 1/2002 | |
| WO | 0215645 A1 | 2/2002 | |
| WO | 2005019373 A2 | 3/2005 | |
| WO | 2005033244 A1 | 4/2005 | |
| WO | 2007063754 A1 | 6/2007 | |
| WO | 2007063796 A1 | 6/2007 | |
| WO | 2007095118 A2 | 8/2007 | |
| WO | 2009118087 A1 | 10/2009 | |
| WO | 2009146770 A2 | 12/2009 | |
| WO | 2010015307 A1 | 2/2010 | |
| WO | 2010031485 A1 | 3/2010 | |
| WO | 2010054728 A1 | 5/2010 | |
| WO | 2010054731 A1 | 5/2010 | |
| WO | 2010086089 A1 | 8/2010 | |
| WO | 2010099852 A1 | 9/2010 | |
| WO | 2010102709 A1 | 9/2010 | |
| WO | 2010135519 A1 | 11/2010 | |
| WO | 2010136109 A1 | 12/2010 | |
| WO | 2011110277 A1 | 9/2011 | |
| WO | 2011141110 A2 | 11/2011 | |
| WO | 2011157339 A1 | 12/2011 | |
| WO | 2012007086 A1 | 1/2012 | |
| WO | 2012007087 A1 | 1/2012 | |
| WO | 2012007088 A1 | 1/2012 | |
| WO | 2013094620 A1 | 6/2013 | |
| WO | 2013107487 A1 | 7/2013 | |
| WO | 2013133359 A1 | 9/2013 | |
| WO | 2013154064 A1 | 10/2013 | |
| WO | 2013174471 A1 | 11/2013 | |
| WO | 2014007565 A1 | 1/2014 | |
| WO | 2014008982 A1 | 1/2014 | |
| WO | 2014023377 A2 | 2/2014 | |
| WO | 2014024131 A1 | 2/2014 | |
| WO | 2014031977 A1 | 2/2014 | |
| WO | 2014038456 A1 | 3/2014 | |
| WO | 2014112450 A1 | 7/2014 | |
| WO | 2020138726 A1 | 7/2020 | |

OTHER PUBLICATIONS

Endo et al., Thermally Activated Delayed Fluorescence from Sn4+-Porphyrin Complexes and Their Application to Organic Light-Emitting Diodes—A Novel Mechanism for Electroluminescence, Advanced Materials, 2009, vol. 21, pp. 4802-4806, dated Aug. 12, 2009.
Goushi et al., Organic light-emitting diodes employing efficient reverse intersystem crossing for triplet-to-singlet state conversion, Nature Photonics, vol. 6, pp. 253-258, dated Mar. 11, 2012.
Gu et al., Transparent organic light emitting devices, Applied Physics Letters, 1996, 68(19), p. 2606-2608, dated May 6, 1996.
Helmut Kipphan, Handbook of Print Media Technologies and Production Methods, Springer-Verlag Berlin Heidelberg New York, 2001, ISBN 3-540-67326-1, Section 1.5, pp. 117-144, dated Dec. 31, 2001.
Ishimatsu et al., Solvent Effect on Thermally Activated Delayed Fluorescence by 1,2,3,5-Tetrakis(carbazol-9-yl)-4,6-dicyanobenzene, Journal of Physical Chemistry A, vol. 117, pp. 5607-5612, dated Jun. 12, 2013.
Johnson et al., Luminescent Iridium( I ), Rhodium( I ), and Platinum( II ) Dithiolate Complexes, Journal of the American Chemical Society, vol. 105, No. 7, pp. 1795-1802, dated Apr. 1, 1983.
Kido et al., Bright red lightemitting organic electroluminescent devices having a europium complex as an emitter, Applied Physics Letters, 1994, vol. 65, No. 17, pp. 2124-2126, dated Oct. 24, 1994.
Kido et al., Electroluminescence in a Terbium Complex, Chemistry Letters, vol. 19, No. 4, pp. 657-660, dated Apr. 1, 1990.
Komino et al., Suppression of Efficiency Roll-Off Characteristics in Thermally Activated Delayed Fluorescence Based Organic Light-Emitting Diodes Using Randomly Oriented Host Molecules, Chemistry of Materials, vol. 25, pp. 3038-3047, dated Jul. 18, 2013.
Lee et al., High-efficiency organic light-emitting diodes utilizing thermally activated delayed fluorescence from triazine-based donor-acceptor hybrid molecules, Applied Physics Letters, 2012, 101(9), 093306, pp. 1-4, dated Aug. 30, 2012.
Lee et al., Oxadiazole- and triazole-based highly-efficient thermally activated delayed fluorescence emitters for organic light-emitting diodes, Journal of Materials Chemistry C, vol. 1, No. 30, pp. 4599-4604, dated May 24, 2013.
Li et al., Highly Effi cient Organic Light-Emitting Diode Based on a Hidden Thermally Activated Delayed Fluorescence Channel in a Heptazine Derivative, Advanced Materials, vol. 25, pp. 3319-3323, dated Jun. 25, 2013.
Ma et al., Electroluminescence from triplet metal-ligand charge-transfer excited state of transition metal complexes, Synthetic Metals, 1998, vol. 94, No. 3, pp. 245-248, dated May 15, 1998.
Mehes et al., Enhanced Electroluminescence Efficiency in a Spiro-Acridine Derivative through Thermally Activated Delayed Fluorescence, Angewandte Chemie International Edition, vol. 51, pp. 11311-11315, dated Oct. 8, 2012.
Nakagawa et al., Electroluminescence based on thermally activated delayed fluorescence generated by a spirobifluorene donor-acceptor structure, Chemical Communications, vol. 48, No. 77, pp. 9580-9582, dated Apr. 17, 2012.
Nasu et al., A highly luminescent spiro-anthracenone-based organic light-emitting diode exhibiting thermally activated delayed fluorescence, Chemical Communications, vol. 49, No. 88, pp. 10385-10387, dated Sep. 27, 2013.
Newkome et al., Dendrimers and Dendrons: Concepts, Syntheses, Applications, Wiley-VCH Verlag Gmbh & Co. KGaA, 2002, ISBN 3-527-29997-1, Section 3-4, pp. 51-190, dated Sep. 13, 2001.
Tanaka et al., Efficient green thermally activated delayed fluorescence (TADF) from a phenoxazine-triphenyltriazine (PXZ-TRZ) derivative, Chemical Communications, vol. 48, No. 93, pp. 11392-11394, dated Oct. 11, 2012.
Tanaka et al., Twisted Intramolecular Charge Transfer State for Long-Wavelength Thermally Activated Delayed Fluorescence, Chemistry of Materials, vol. 25, pp. 3766-3771, dated Sep. 13, 2013.
Uoyama et al., Highly efficient organic light-emitting diodes from delayed fluorescence, Nature, vol. 492, pp. 234-238, dated Dec. 13, 2012.
Wrighton et al., The Nature of the Lowest Excited State in Tricarbonylchloro-1, 10-phenanthrolinerhenium( I ) and Related Complexes, Journal of the American Chemical Society, vol. 96, No. 4, pp. 998-1003, dated Feb. 20, 1974.
Zhang et al., Design of Efficient Thermally Activated Delayed Fluorescence Materials for Pure Blue Organic Light Emitting Diodes, Journal of the American Chemical Society, vol. 134, pp. 14706-14709, dated Aug. 29, 2012.

* cited by examiner

ORGANIC COMPOUNDS, MIXTURES AND APPLICATIONS THEREOF IN ORGANIC ELECTRONIC DEVICES

CROSS-REFERENCE TO RELATED APPLICATIONS

The present application is a continuation of International Application No. PCT/CN2022/071813, filed on Jan. 13, 2022, which claims priority to Chinese Patent Application No. 202110041212.4, filed on Jan. 13, 2021. All of the aforementioned applications are incorporated herein by reference in their entireties.

TECHNICAL FIELD

The present disclosure relates to the technical field of organic electroluminescence, and in particular to an organic compound, a mixture, and an organic electronic device thereof.

BACKGROUND

Due to the diversity of synthesis, low manufacturing cost, excellent optical, and electrical properties, organic light-emitting diodes (OLEDs) have great potential for the realization of novel optoelectronic devices, such as in flat-panel displays and lighting applications.

The organic electroluminescent phenomenon refers to a phenomenon of converting electrical energy to photonic energy with organic substance. An organic electroluminescent element utilizing the organic electroluminescent phenomenon usually has a structure comprising an anode, a cathode, and an organic layer therebetween. In order to improve the efficiency and lifetime of the organic electroluminescent element, the organic layer has a multi-layer structure, and each layer comprises different organic substances. For example, each layer can be a hole-injection layer, a hole-transport layer, a light-emitting layer, an electron-transport layer, an electron-injection layer, etc. When a voltage is applied between two electrodes of such an organic electroluminescent element, holes are injected into the organic layer from the anode, electrons are injected into an organic layer from the cathode; and an exciton is formed when an injected hole and an injected electron recombine in the emission layer. The exciton emits light when it transitions back to the ground state. The organic electroluminescent element has characteristics of self-emission, high luminance, high efficiency, low driving voltage, wide viewing angle, high contrast, high responsivity, etc.

Theories and experiments have confirmed that the emitting material is the most important factor affecting the efficiency of OLEDs. At present, the light-emitting layer of the organic electroluminescent element usually uses the host & dopant hybrid system as an emitting material to improve color purity, luminescence efficiency, and stability. In general, the selection of the host material is critical for the host & dopant hybrid system, because the host material greatly affects the efficiency and stability of OLEDs. Preferably, the host material should have a suitable molecular weight for the vacuum-deposition, a high glass transition temperature and a high thermal decomposition temperature for the good thermal stability, a high electrochemical stability for a long operation lifetime, and it should be easy to form an amorphous film, leading to a good interfacial interaction with the adjacent functional layer and less molecular movement.

A large number of host materials have been reported in the existing patents and literatures. For example, due to high carrier transport capability, photoelectric response property, and thermal stability, indolocarbazole derivatives have become the focus of the academia and industry, and are widely used in organic light-emitting diodes. However, most of the current indolocarbazole derivatives developed still suffer from poor chemical/environmental stability. The main reason is that the lone pairs of electrons of the nitrogen atom in such materials (patents WO2007063796A1, WO2007063754A1, US2016293856A1) are conjugated to the benzene rings, forming C—H bonds with higher electron cloud density and higher reactivity, resulting in poor chemical/environmental stability and short device lifetime. Researchers have also developed indolofluorene derivatives (patent WO2010136109A1), but the device performance needs to be further improved.

Therefore, there is still a need to improve the materials, especially the host materials for the co-host system, especially the n-type host materials with electron-transport property, and the p-type material paired with it.

SUMMARY

In one aspect, the present disclosure provides an organic compound comprising a structure of formula (I):

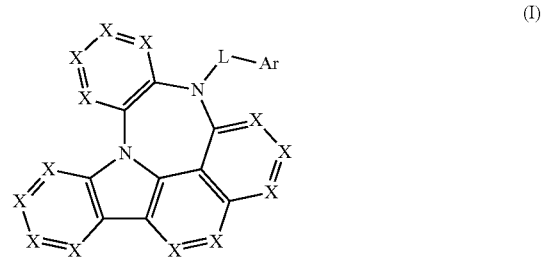

Where each X independently represents N or $CR_1$, and at least one X is $CR_1$, and when adjacent Xs are $CR_1$s, they can be fused with each other to form a ring;

each $R_1$ is independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof, where one or more $R_1$s may form a ring system with each other and/or with the groups bonded thereto;

L is a linking group selected from the group consisting of a single bond, a $C_6$-$C_{60}$ arylene group, a $C_2$-$C_{60}$ heteroaromatic group, a $C_3$-$C_{60}$ aliphatic ring, a $C_6$-$C_{60}$ fused aromatic ring group, and any combination thereof;

Ar is selected from the group consisting of a substituted/unsubstituted aromatic or heteroaromatic group containing 5 to 40 ring atoms, an aryloxy or heteroaryloxy group containing 5 to 40 ring atoms, and any combination thereof, where one or more Ars may form a monocyclic or polycyclic aliphatic or aromatic ring system with each other and/or with the rings bonded thereto.

In another aspect, the present disclosure also provides a polymer comprising at least one repeating unit, and at least one of the repeating unit comprises a structure corresponding to the organic compound as described herein.

In yet another aspect, the present disclosure further provides a mixture comprising an organic compound H1 and an organic compound H2; the organic compound H1 is selected from an organic compound or a polymer as described herein; the organic compound H2 is another organic functional material, and is selected from one or more of the following: a hole-injection material, a hole-transport material, an electron-transport material, an electron-injection material, an electron-blocking material, a hole-blocking material, an emitting material, a host material, an organic dye.

In addition or alternatively, the organic compound H2 of the mixture comprises a structure of formula (III):

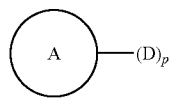

(III)

Where A is selected from a $C_1$-$C_{30}$ substituted/unsubstituted alkyl group, a $C_3$-$C_{30}$ substituted/unsubstituted cycloalkyl group, or a $C_5$-$C_{60}$ substituted/unsubstituted aromatic hydrocarbon or aromatic heterocyclic group; D is an electron-rich group; p is an integer from 1 to 6.

In yet another aspect, the present disclosure further provides a formulation comprising at least one organic compound, or a polymer, or a mixture as described herein, and at least one organic solvent.

In yet another aspect, the present disclosure further provides an organic electronic device comprising a functional layer, the functional layer comprises an organic compound, or a polymer, or a mixture as described herein.

Beneficial effects: the use of the organic compounds as described herein in OLEDs, particularly in the light-emitting layer, can provide superior device performance. Possible reasons therefor are as follows, but not limited thereto, the organic compounds as described herein have more balanced charge carrier transport property, which are conducive to improve the efficiency and lifetime of the related materials and devices.

DETAILED DESCRIPTION OF THE EMBODIMENTS

The present disclosure provides an organic compound, a mixture and the applications thereof in organic electronic devices, aiming to solve the problems of efficiency and lifetime of the existing OLEDs. In order to make the objects, technical solutions, and effects of the present disclosure more clear and definite, the present disclosure is further described in detail below. It should be understood that the embodiments described herein are only intended to explain the present disclosure, and are not intended to limit the present disclosure.

As used herein, the terms "formulation", "printing ink", and "ink" have the same meaning, and they are interchangeable with each other.

As used herein, the terms "host material", "matrix material" have the same meaning, and they are interchangeable with each other.

As used herein, the term "substituted" means that a hydrogen atom of the compound is substituted.

As used herein, the term "the number of ring atoms" means that the number of atoms constituting the ring itself of a structural compound (e. g., a monocyclic compound, a fused ring compound, a cross-linked compound, a carbocyclic compound, and a heterocyclic compound) by covalent bonding. When the ring is substituted with a substituent, the atoms contained in the substituent are not included in the ring atoms. The above rule applies for all cases without further specific description. For example, the number of ring atoms of a benzene ring is 6, the number of ring atoms of a naphthalene ring is 10, and the number of ring atoms of a thienyl group is 5.

In the embodiments of the present disclosure, the energy level structure of the organic material, the singlet energy level $E_{S1}$, triplet energy level $E_{T1}$, HOMO, and LUMO play key roles. The determination of these energy levels is introduced as follows.

HOMO and LUMO energy levels can be measured by photoelectric effects, for example by XPS (X-ray photoelectron spectroscopy), UPS (UV photoelectron spectroscopy), or by cyclic voltammetry (hereinafter referred to as CV). Recently, quantum chemical methods, such as density functional theory (hereinafter referred to as DFT), are becoming effective methods for calculating the molecular orbital energy levels.

The singlet energy level $E_{S1}$ of the organic material can be determined by the emission spectrum, and the triplet energy level $E_{T1}$ can be measured by a low-temperature time-resolved spectroscopy. $E_{S1}$ and $E_{T1}$ can also be calculated by quantum simulation (for example, by Time-dependent DFT), for instance with the commercial software Gaussian 09W (Gaussian Inc.). The specific simulation method can be found in WO2011141110 or as described in the examples below. $\Delta E_{ST}$ is defined as ($E_{S1}$-$E_{T1}$).

It should be noted that the absolute values of HOMO, LUMO, $E_{S1}$, and $E_{T1}$ may vary depending on the measurement method or calculation method used. Even for the same method, different ways of evaluation, for example, using either the onset or peak value of a CV curve as reference, may result in different (HOMO/LUMO) values. Therefore, reasonable and meaningful comparison should be carried out by using the same measurement and evaluation methods. In the embodiments of the present disclosure, the values of HOMO, LUMO, $E_{S1}$, and $E_{T1}$ are based on Time-dependent DFT simulation, which however should not exclude the applications of other measurement or calculation methods.

In the present disclosure, (HOMO-1) is defined as the second highest occupied orbital level, (HOMO-2) is defined as the third highest occupied orbital level, and so on. (LUMO+1) is defined as the second lowest unoccupied orbital level, (LUMO+2) is defined as the third lowest occupied orbital level, and so on.

In one aspect, the present disclosure relates to an organic compound comprising a structure of formula (I):

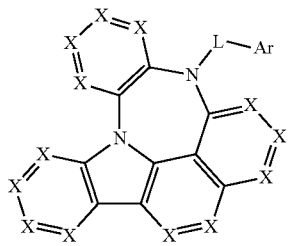

(I)

Where each X independently represents N or $CR_1$, at least one X is $CR_1$, and when adjacent Xs are $CR_1$s, they can be fused with each other to form a ring; each $R_1$ is independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group (—CN), a carbamoyl group (—C(=O)NH$_2$), a haloformyl group (—C(=O)—X where X represents a halogen atom), a formyl group (—C(=O)—H), an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof, where one or more $R_1$s may form a ring system with each other and/or with the groups bonded thereto; L is a linking group selected from the group consisting of a single bond, a $C_6$-$C_{60}$ arylene group, a $C_2$-$C_{60}$ heteroaromatic group, a $C_3$-$C_{60}$ aliphatic ring, a $C_6$-$C_{60}$ fused aromatic ring group, and any combination thereof; Ar is selected from the group consisting of a substituted/unsubstituted aromatic or heteroaromatic group containing 5 to 40 ring atoms, an aryloxy or heteroaryloxy group containing 5 to 40 ring atoms, and any combination thereof, where one or more Ars may form a monocyclic or polycyclic aliphatic or aromatic ring system with each other and/or with the rings bonded thereto.

In some embodiments, $R_1$ at each occurrence is independently selected from the group consisting of H, D, a cyano group, a $C_1$-$C_{18}$ linear alkyl group, a $C_3$-$C_{18}$ branched/cyclic alkyl group, a $C_3$-$C_{18}$ branched/cyclic alkoxy group, a $C_3$-$C_{18}$ branched/cyclic thioalkoxy group, a $C_3$-$C_{18}$ branched/cyclic silyl group, and a $C_5$-$C_{30}$ substituted/unsubstituted aryl or heteroaryl or aryloxy or heteroaryloxy group. In some embodiments, $R_1$ at each occurrence is independently selected from the group consisting of H, D, a $C_1$-$C_{12}$ linear alkyl group, and a $C_5$-$C_{20}$ substituted/unsubstituted aryl or heteroaryl or aryloxy or heteroaryloxy group. In some embodiments, $R_1$ at each occurrence is independently selected from H, D, a $C_1$-$C_6$ linear alkyl group, and a $C_5$-$C_{15}$ substituted/unsubstituted aryl or heteroaryl or aryloxy or heteroaryloxy group.

In some embodiments, $R_1$ at each occurrence may be fully deuterated or partially deuterated, respectively.

In some embodiments, each X of formula (I) is $CR_1$, and the adjacent two $CR_1$s can be fused to form a ring.

In some embodiments, the organic compound comprises a structure of formula (II):

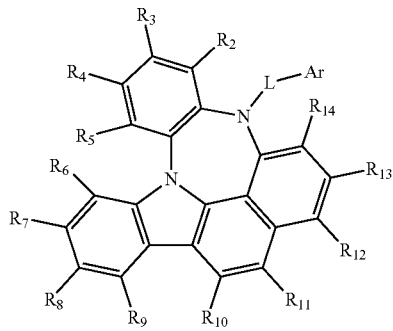

(II)

Where L and Ar are identically defined as described above. each of $R_2$ to $R_{14}$ is a substituent, and at each occurrence is independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof, where one or more $R_2$-$R_{14}$ may form a ring system with each other and/or with the groups bonded thereto.

In some embodiments, $R_1$ to $R_{14}$, L, Ar of the organic compound are independently selected from one or combinations of more than one of the following groups:

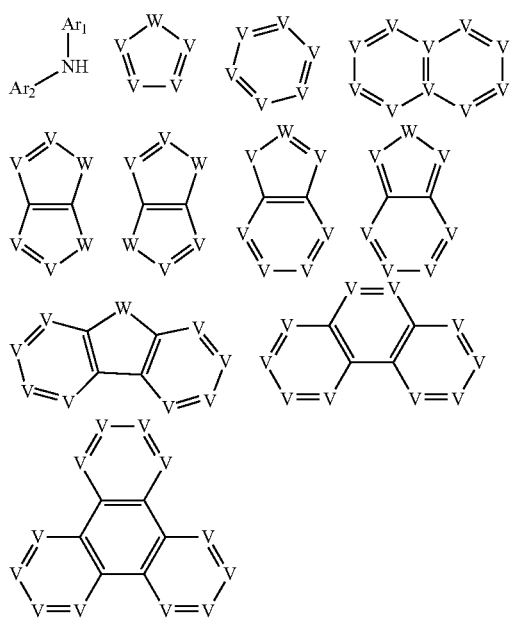

Where V in multiple occurrences, is independently selected from $CR_{15}$ or N; W, in multiple occurrences, is independently selected from $CR_{16}R_{17}$, $SiR_{18}R_{19}$, $NR_{20}$, C(=O), S, or O; $Ar_1$ and $Ar_2$ are identically defined as the above-mentioned Ar; $R_{15}$ to $R_{20}$ are substituents, and at each occurrence are independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof, where one or more $R_{15}$-$R_{20}$ may form a ring system with each other and/or with the groups bonded thereto.

Further, each of $R_{15}$ to $R_{20}$ at each occurrence is independently selected from the group consisting of -D, a cyano group, a $C_1$-$C_{18}$ linear alkyl group, a $C_3$-$C_{18}$ branched/cyclic alkyl group, a $C_3$-$C_{18}$ branched/cyclic alkoxy group, a $C_3$-$C_{18}$ branched/cyclic thioalkoxy group, a $C_3$-$C_{18}$ branched/cyclic silyl group, and a $C_5$-$C_{30}$ substituted/unsubstituted aryl or heteroaryl or aryloxy or heteroaryloxy group. In some embodiments, each of $R_{15}$ to $R_{20}$ at each occurrence is independently selected from the group consisting of -D, a $C_1$-$C_{12}$ linear alkyl group, and a $C_5$-$C_{20}$ substituted/unsubstituted aryl or heteroaryl or aryloxy or heteroaryloxy group. In some embodiments, each of $R_{15}$ to $R_{20}$ at each occurrence is independently selected from the group consisting of -D, a $C_1$-$C_6$ linear alkyl group, and a $C_5$-$C_{15}$ substituted/unsubstituted aryl or heteroaryl or aryloxy or heteroaryloxy group.

In some embodiments, L is biphenyl, or a structure in which one or more carbon atoms in biphenyl are substituted with N atoms.

In some embodiments, L is benzene, or a structure in which one or more carbon atoms in benzene are substituted with N atoms.

In some embodiments, L of the organic compound is preferably selected from combinations of one or more structures of the following formulas in which the H atom on the ring can be arbitrarily substituted:

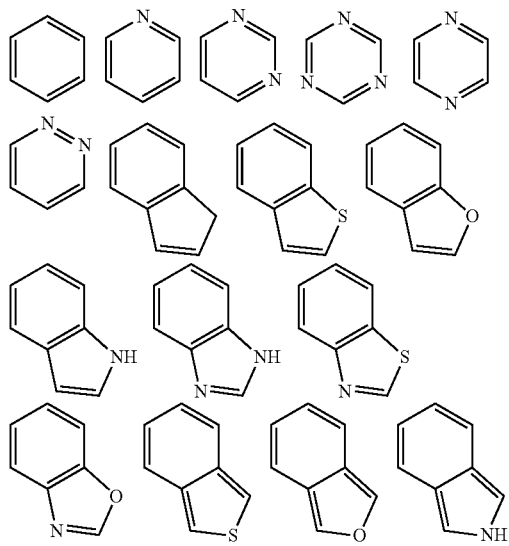

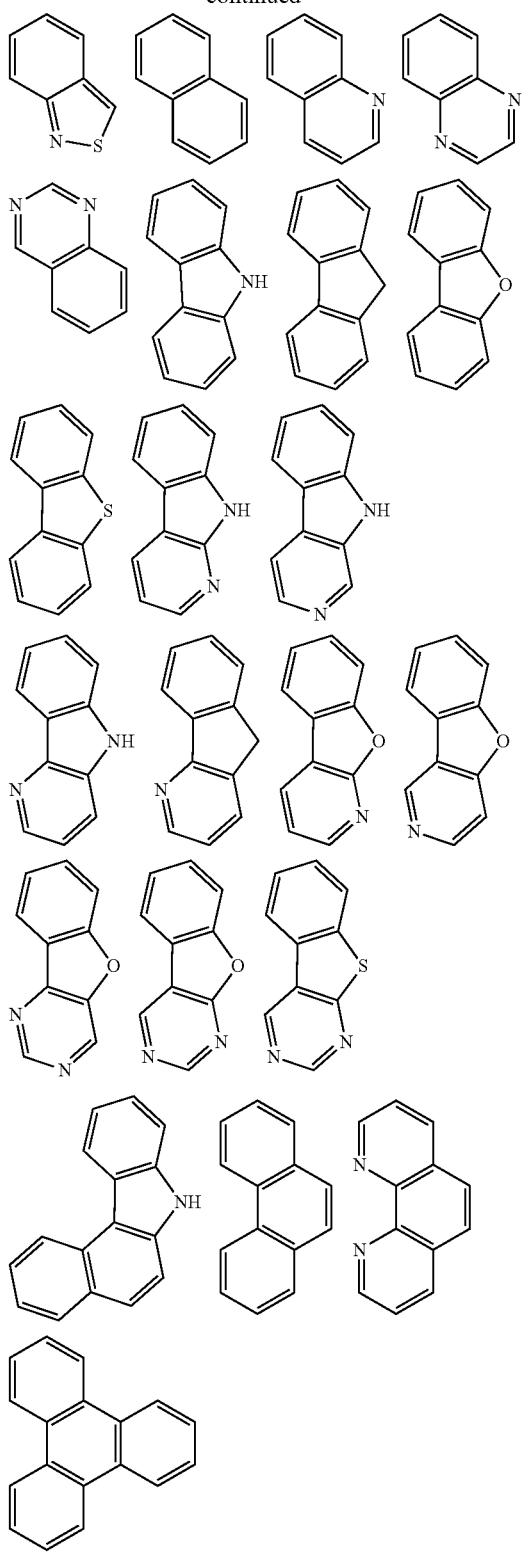

In some embodiments, L of the organic compound may comprise a structure of the following formulas in which the H atom on the ring can be arbitrarily substituted:

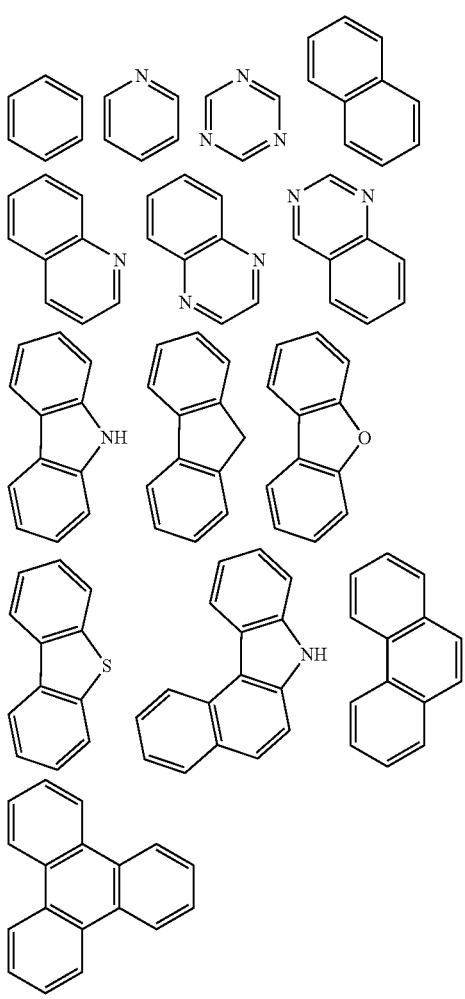

Ar at each occurrence is independently selected from the group consisting of a $C_5$-$C_{40}$ substituted/unsubstituted aromatic or heteroaromatic or aryloxy or heteroaryloxy group, and any combination thereof, where one or more Ars may form a polycyclic aliphatic or aromatic ring system with each other and/or with the rings bonded thereto.

In some embodiments, Ar may be selected from the group consisting of a $C_5$-$C_{20}$ deuterated/undeuterated substituted/unsubstituted aromatic/heteroaromatic group, a $C_5$-$C_{20}$ deuterated/undeuterated aryloxy/heteroaryloxy group, and any combination thereof, where one or more Ars may form a monocyclic or polycyclic aliphatic or aromatic ring system with each other and/or with the rings bonded thereto.

In some embodiments, Ar may be selected from the group consisting of a $C_5$-$C_{15}$ deuterated/undeuterated substituted/unsubstituted aromatic or heteroaromatic group, a $C_5$-$C_{15}$ deuterated/undeuterated aryloxy or heteroaryloxy group, and any combination thereof, where one or more Ars may form a monocyclic or polycyclic aliphatic or aromatic ring system with each other and/or with the rings bonded thereto.

In some embodiments, Ar is selected from benzene, naphthalene, phenanthrene, triphenylene, biphenyl, terphenyl, or a structure in which one or more carbon atoms of these structures are substituted with N atoms.

In the present disclosure, the term "aromatic group" refers to a hydrocarbon group consisting of an aromatic ring, including monocyclic groups and polycyclic systems. The term "heteroaromatic group" refers to a heteroaromatic group consisting of at least one heteroaromatic ring, including monocyclic groups and polycyclic systems. The polycyclic systems contain two or more rings, in which two carbon atoms are shared by two adjacent rings, i.e. fused rings. Specifically, at least one of the rings in the polycyclic rings are aromatic or heteroaromatic. For the purposes of the present disclosure, the aromatic ring groups or heteroaromatic groups comprise not only aromatic or heteroaromatic systems, but also a plurality of aromatic or heteroaromatic groups are interconnected by short non-aromatic units (for example C, N, O, Si, S, P atoms). Therefore, systems such as 9,9'-spirobifluorene, 9,9-diaryl fluorene, triarylamine, diaryl ethers, and other systems, should also be considered as aromatic groups for the purpose of this disclosure.

Specifically, examples of the aromatic groups include benzene, naphthalene, anthracene, phenanthrene, perylene, tetracene, pyrene, benzopyrene, triphenylene, acenaphthylene, fluorene, and derivatives thereof.

Specifically, examples of heteroaromatic groups include: furan, benzofuran, thiophene, benzothiophene, pyrrole, pyrazole, triazole, imidazole, oxazole, oxadiazole, thiazole, tetrazole, indole, carbazole, pyrroloimidazole, pyrrolopyrrole, thienopyrrole, thienothiophene, furopyrrole, furofuran, thienofuran, benzisoxazole, benzisothiazole, benzimidazole, pyridine, pyrazine, pyridazine, pyrimidine, triazine, quinoline, isoquinoline, o-diazonaphthalene, quinoxaline, phenanthridine, pyrimidine, quinazoline, quinazolinone, and derivatives thereof.

In some embodiments, the organic compound as described herein has electron-transport property.

In some embodiments, Ar of the organic compound comprises an electron-accepting group, or is substituted with an electron-accepting group. The suitable electron-accepting groups may be independently selected from F, a cyano group, or one of the following groups:

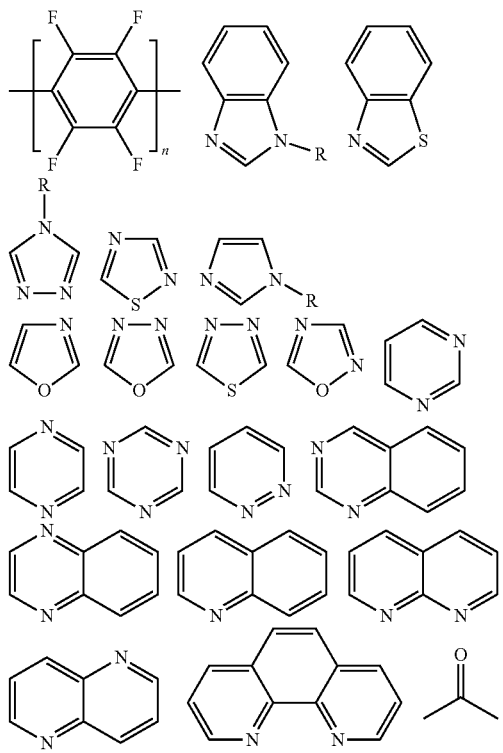

11

-continued

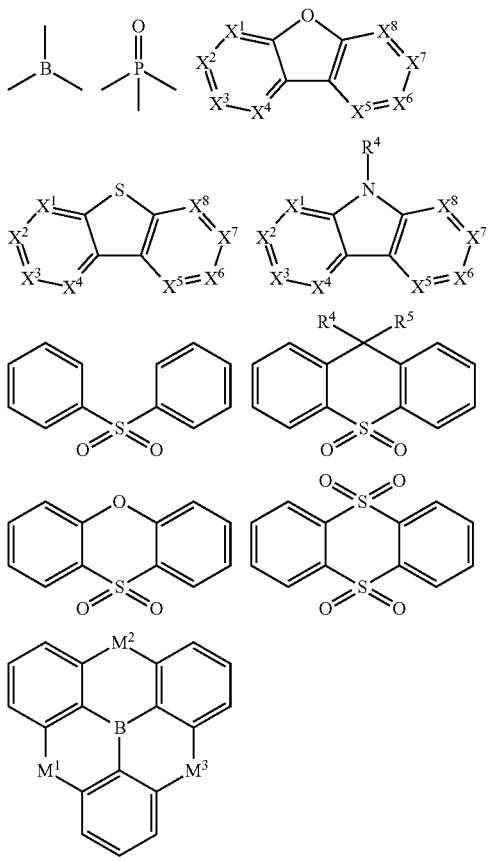

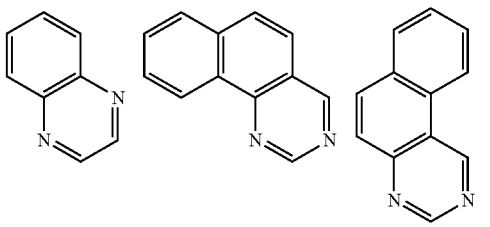

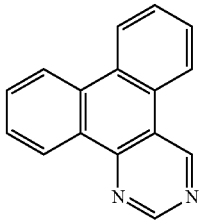

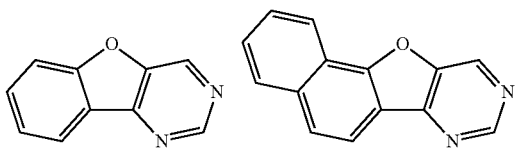

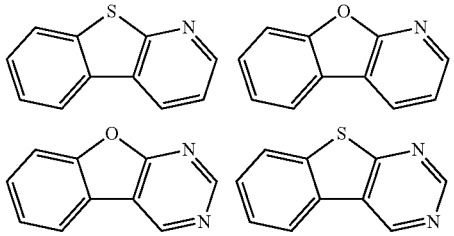

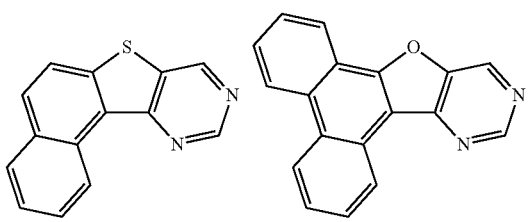

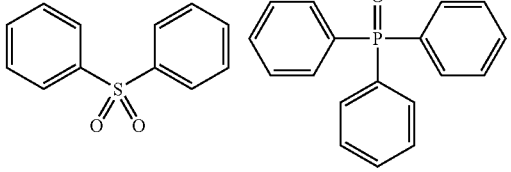

Where n is an integer from 1 to 3; each of $X^1$ to $X^8$ is CRS or N, at least one is N, and any adjacent two $R^5$ can form a monocyclic or polycyclic aliphatic or aromatic ring system; $M^1$, $M^2$, $M^3$ independently represent $N(R^6)$, $C(R^7)_2$, $Si(R^8)_2$, O, $C=N(R^9)$, $C=C(R^{10})_2$, $P(R^{11})$, $P(=O)R^{12}$, S, S=O, $SO_2$, or null; $R^1$ to $R^{12}$ are identically defined as the above-mentioned $R_1$. $R^1$ to $R^{12}$ may be the same or different from each other, and any one of $R^1$ to $R^{12}$ may be the same or different at the various occurrences.

In some embodiments, the electron-accepting group of the organic compound is selected from combinations of one or more following groups:

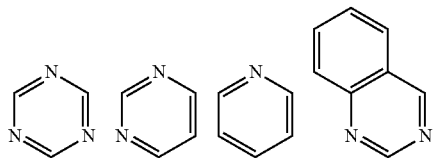

12

-continued

In some embodiments, the organic compound as described herein has a small singlet-triplet energy level difference ($\Delta E_{st}$), typically $\Delta E_{st} \leq 0.3$ eV, preferably $\Delta E_{st} \leq 0.2$ eV, more preferably $\Delta E_{st} \leq 0.15$ eV, and most preferably $\Delta E_{st} \leq 0.10$ eV.

Specific examples of the organic compounds of formula (I) as described herein are listed below, but not limited thereto.

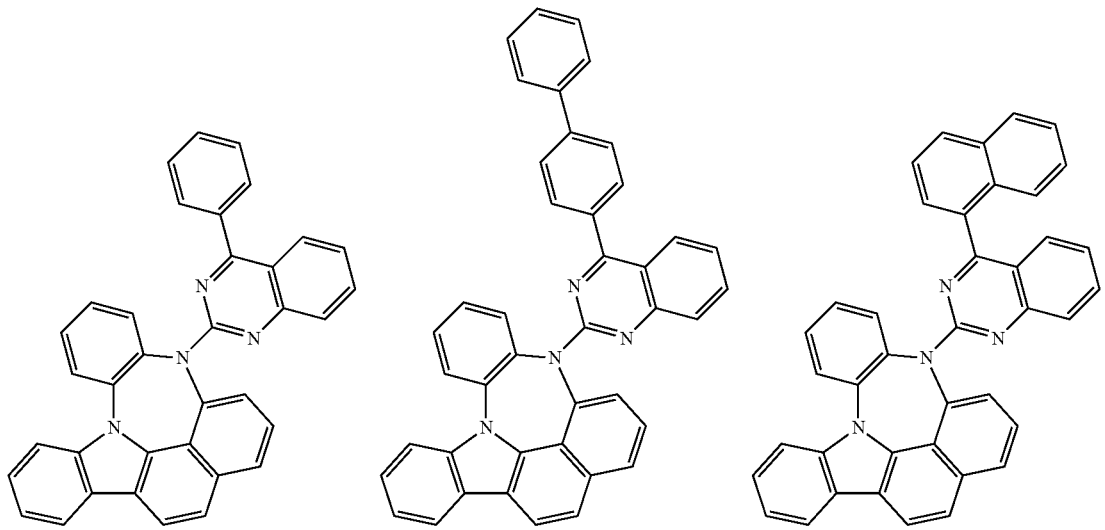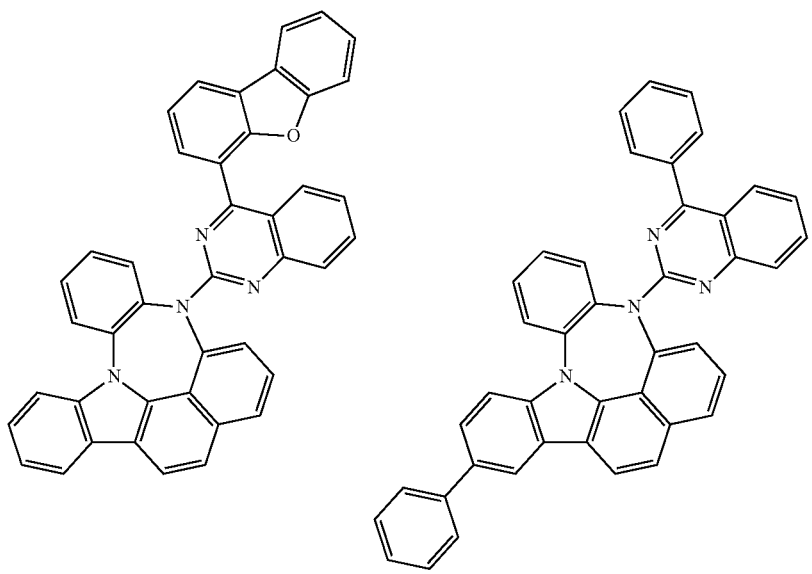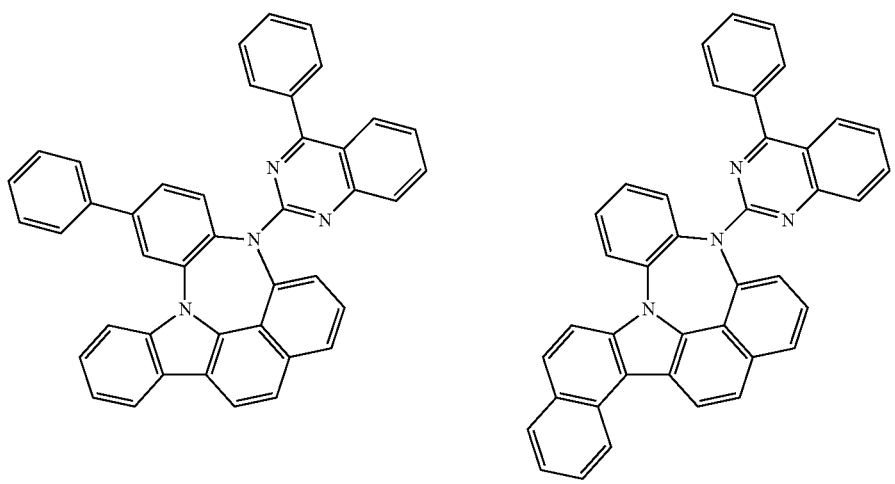

-continued
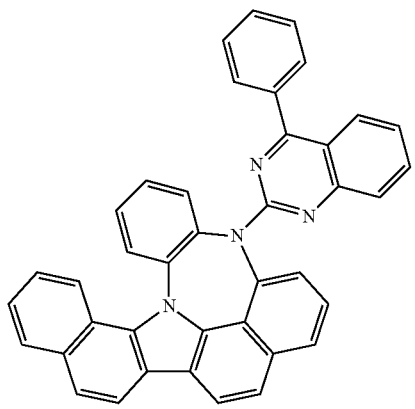
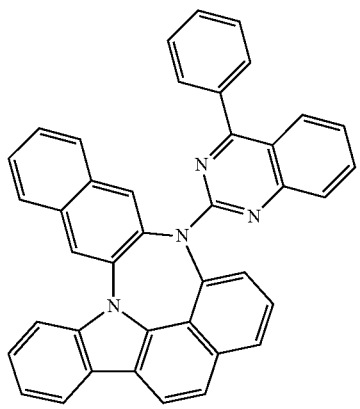
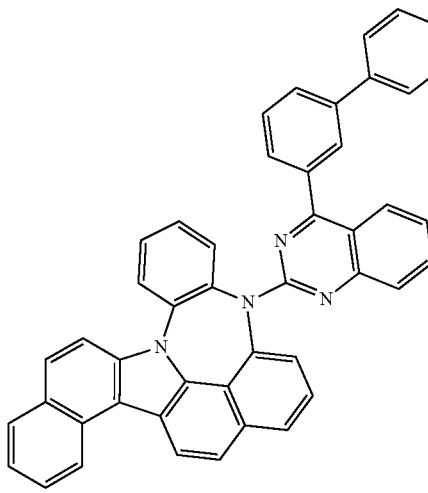
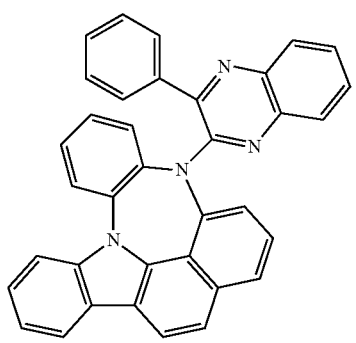
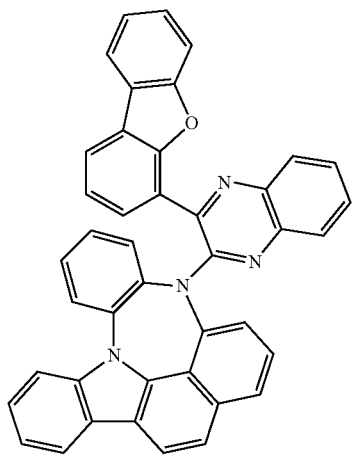
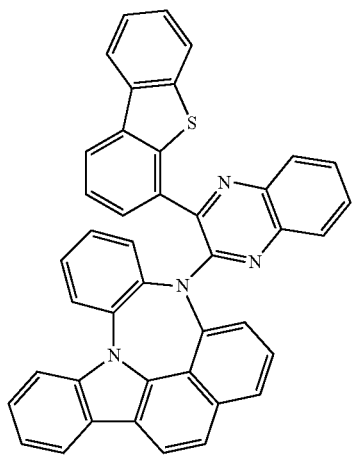
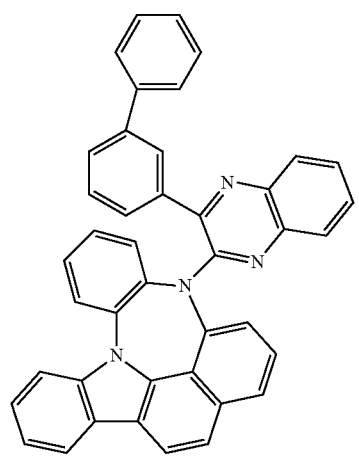

-continued
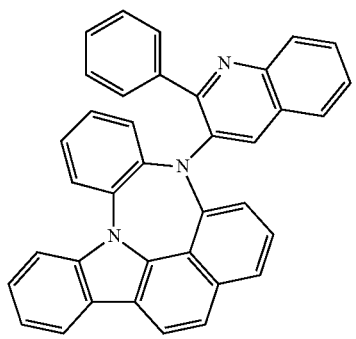
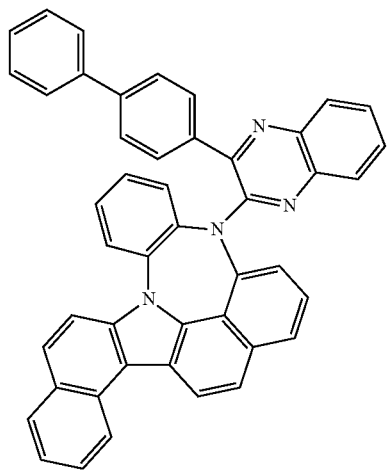
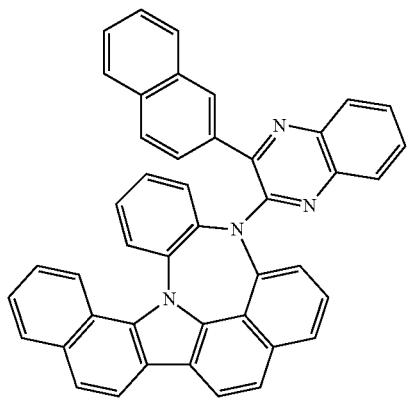
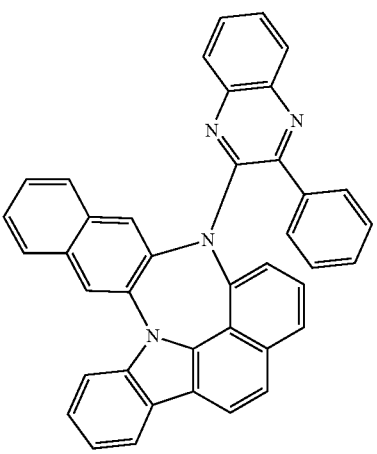
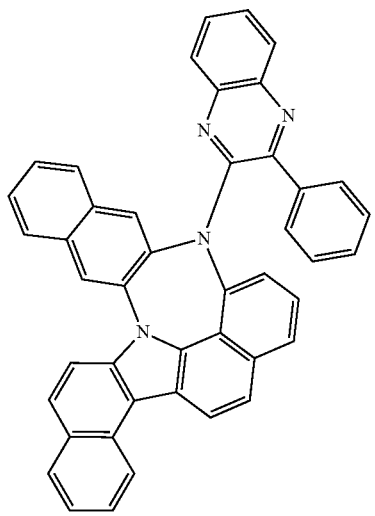
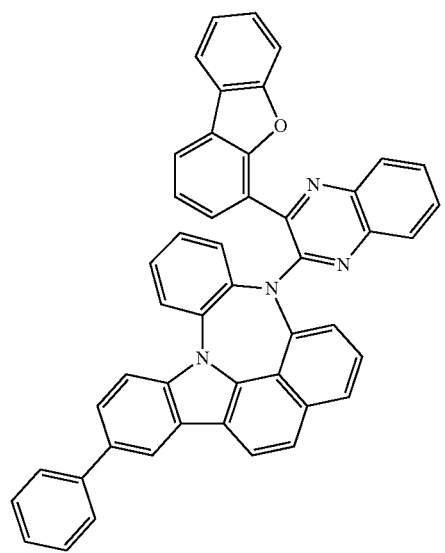

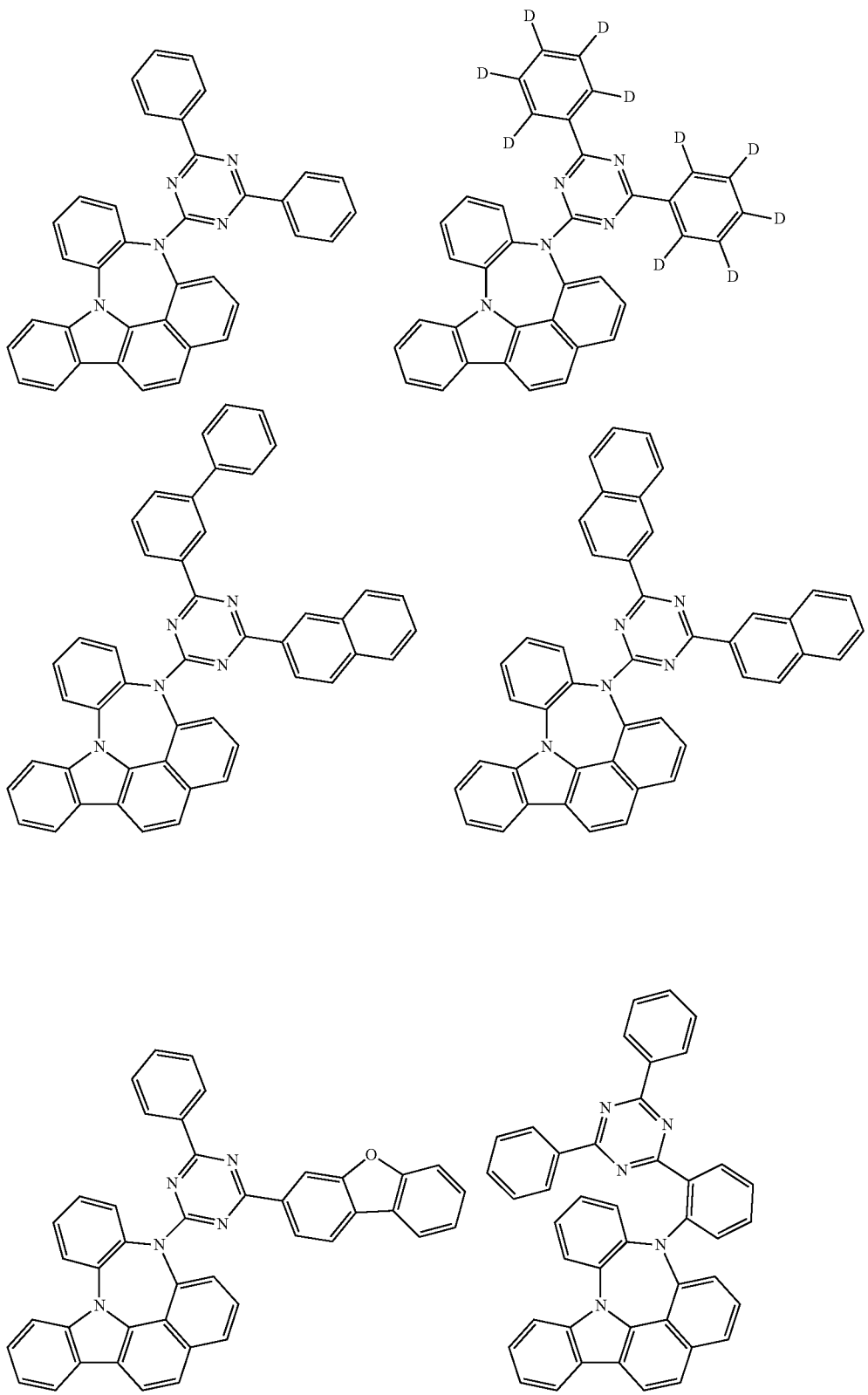

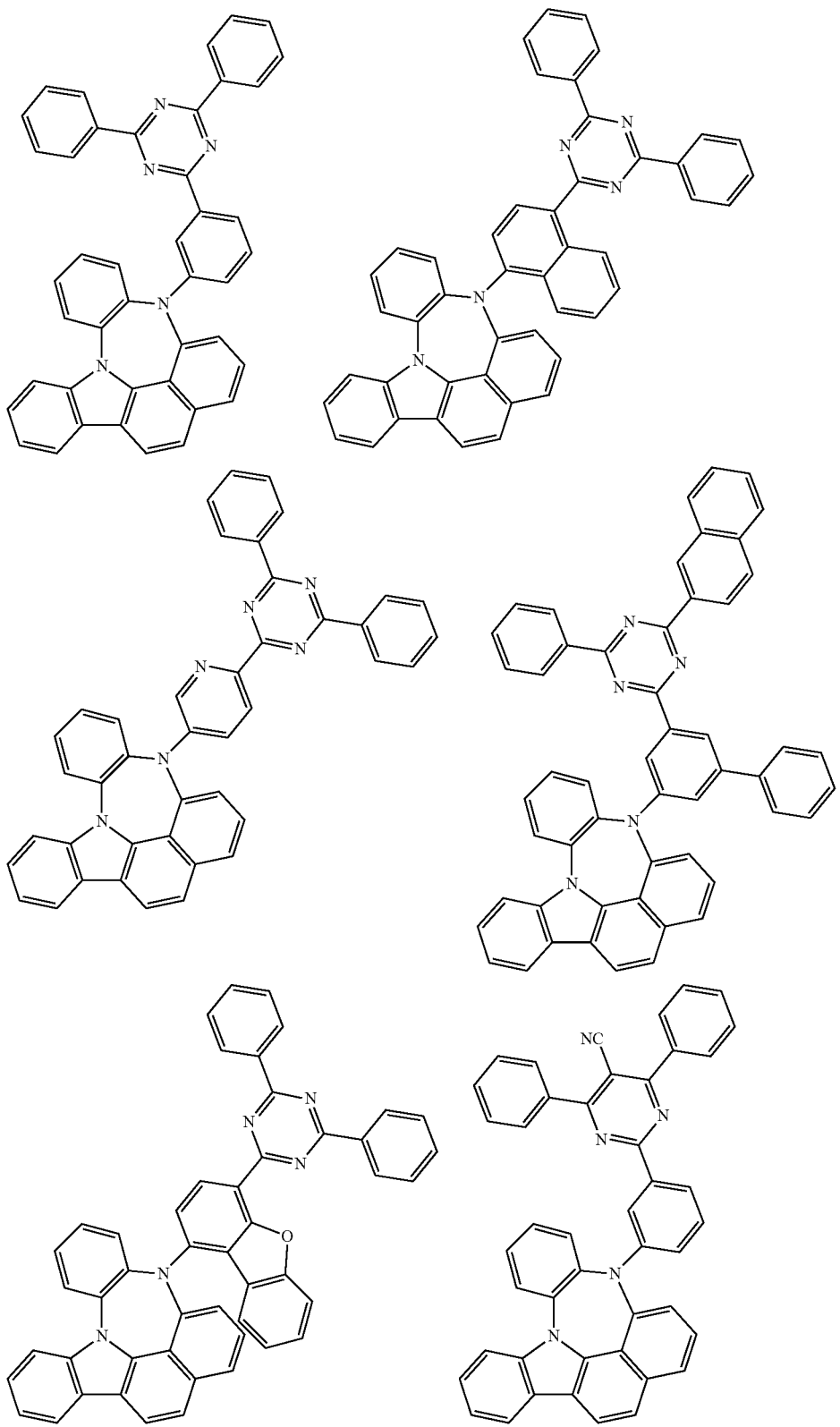

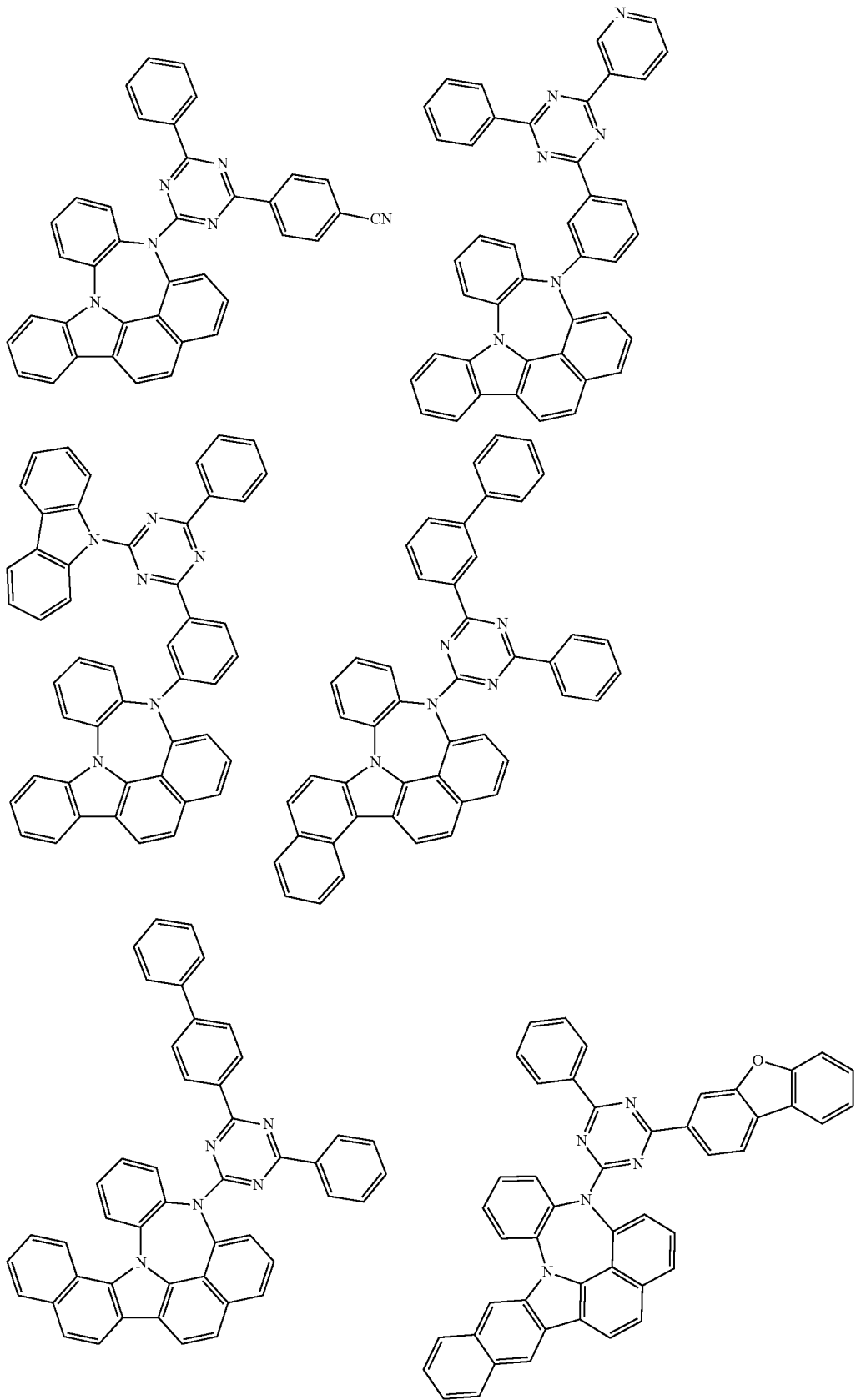

-continued
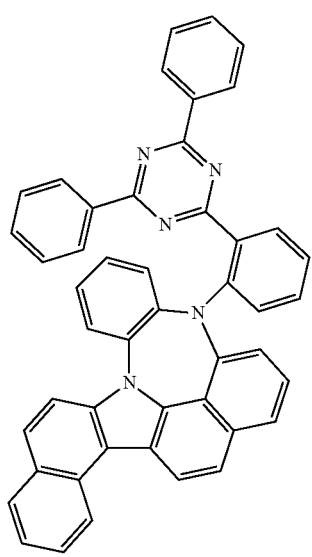
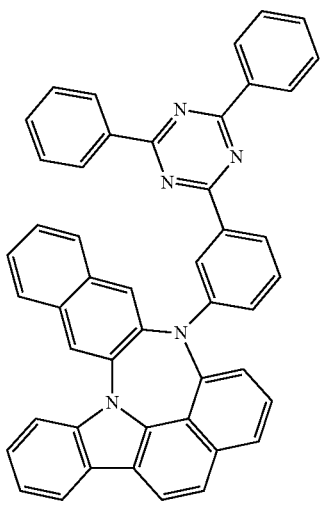
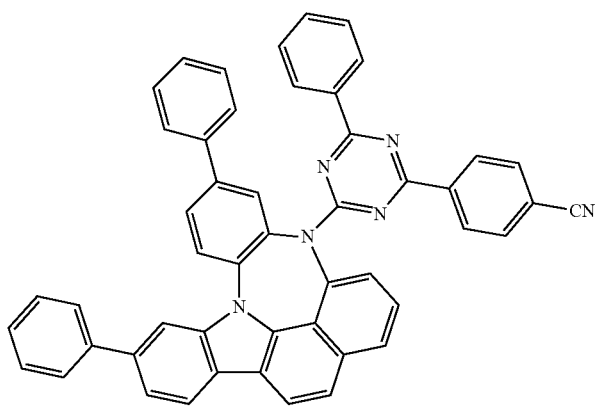
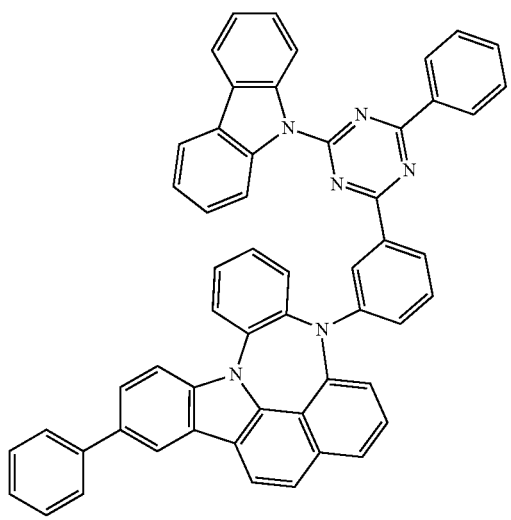
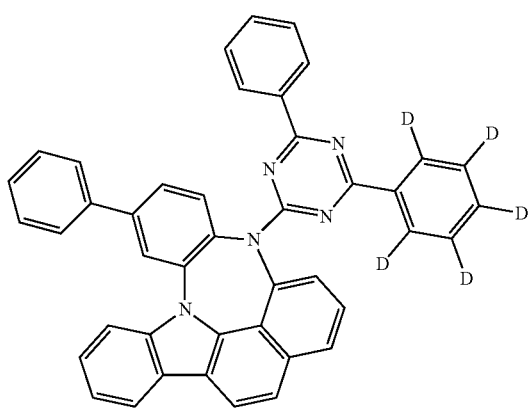
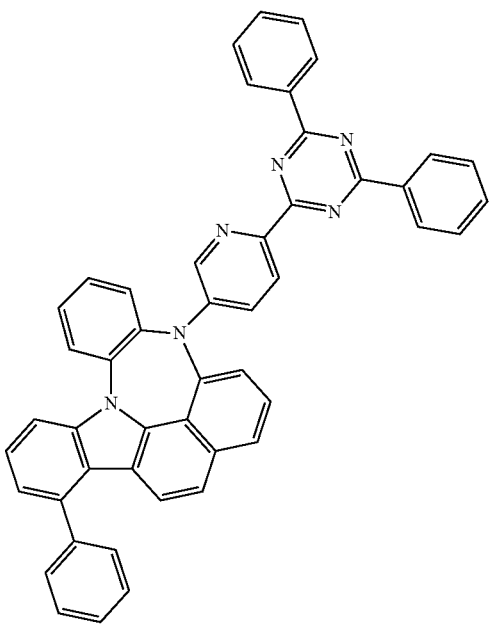

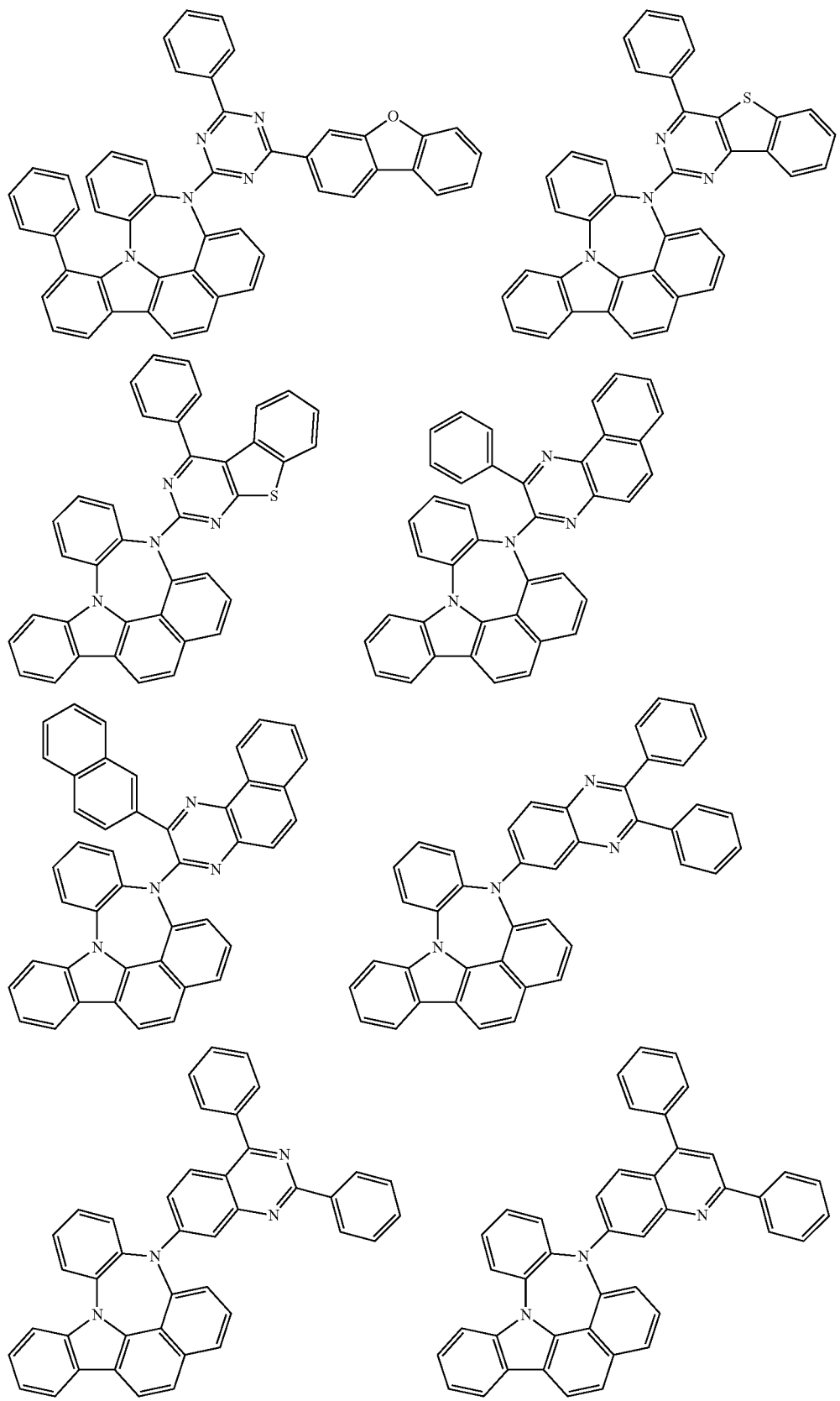

-continued
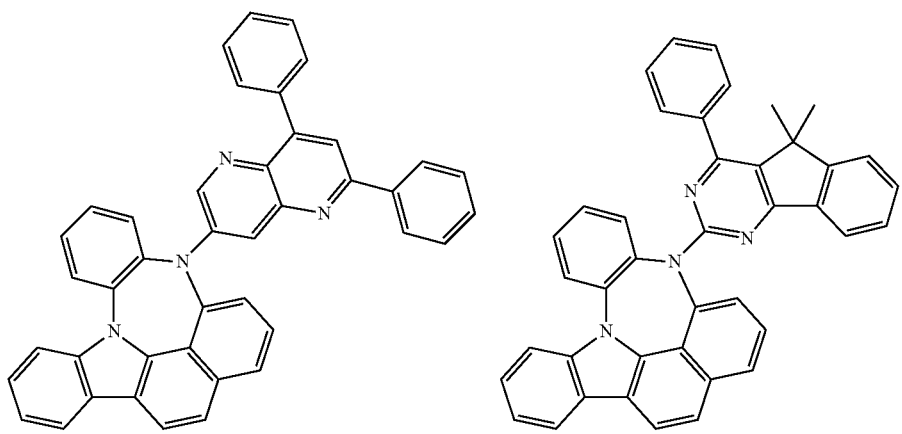
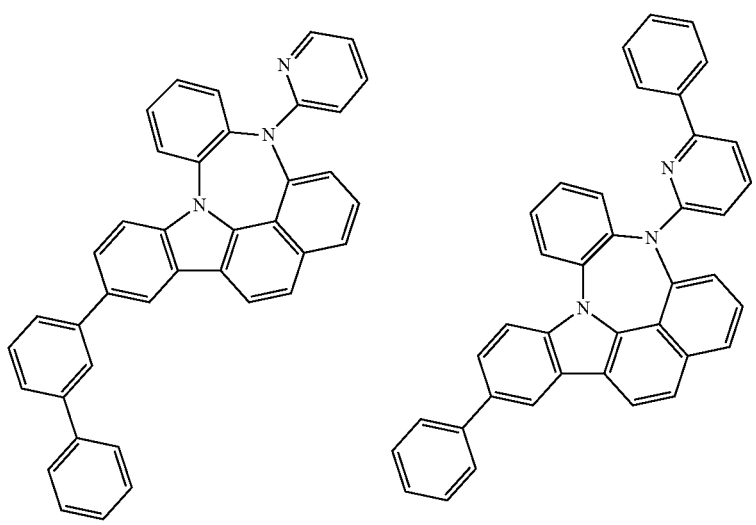
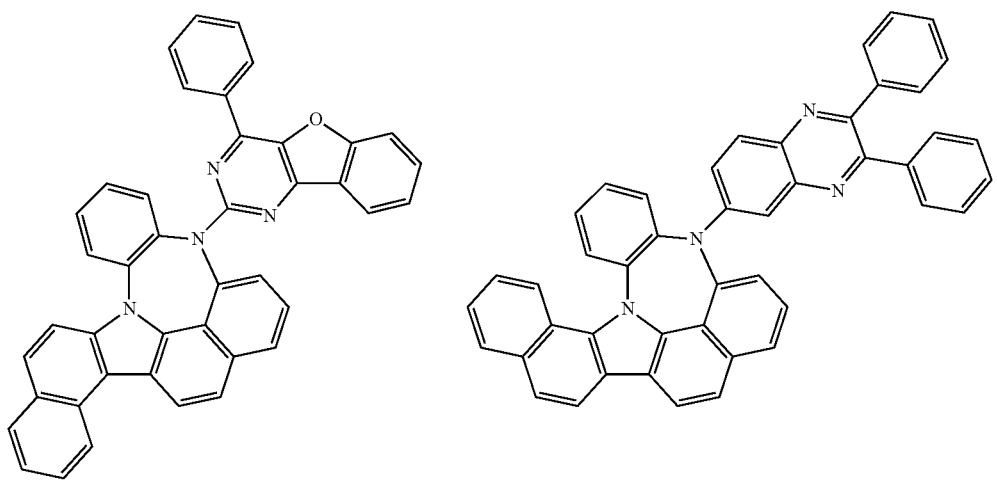

-continued
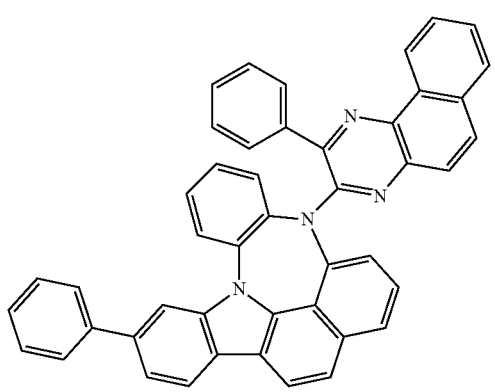
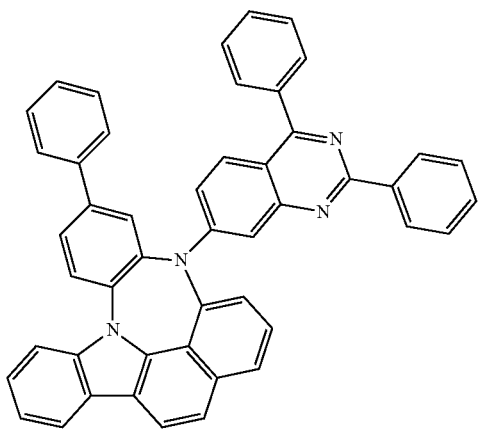
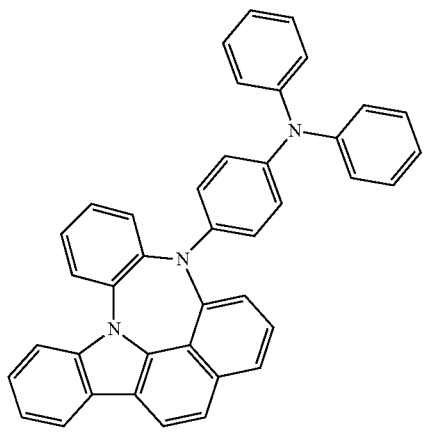
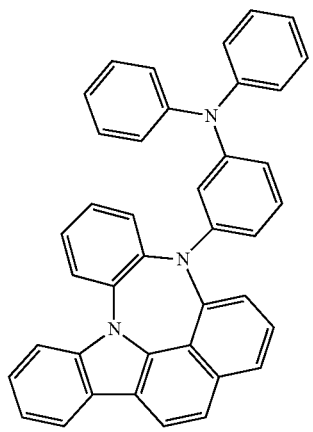
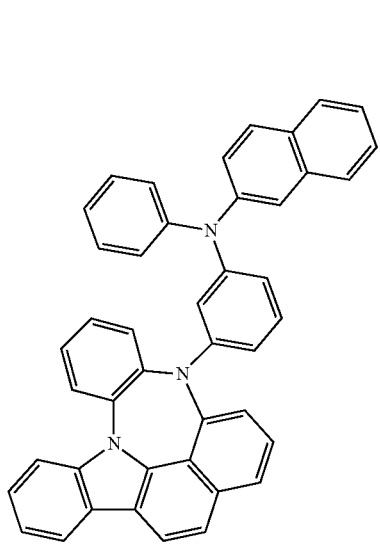
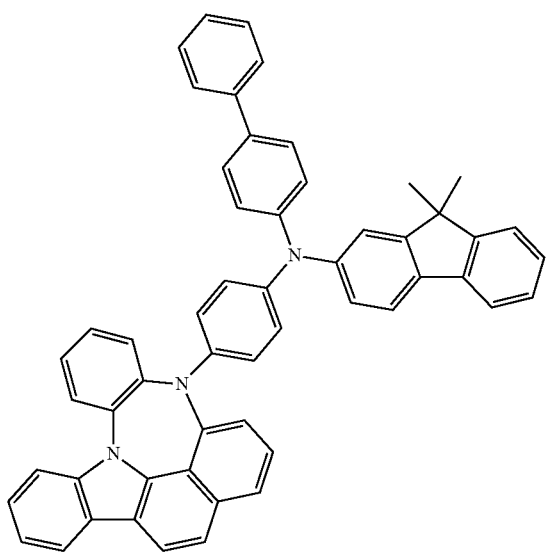

-continued
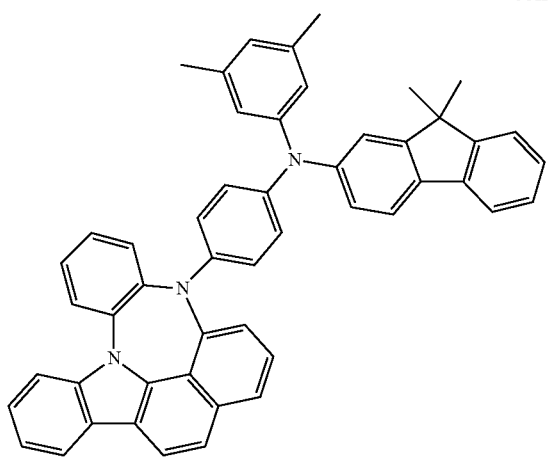
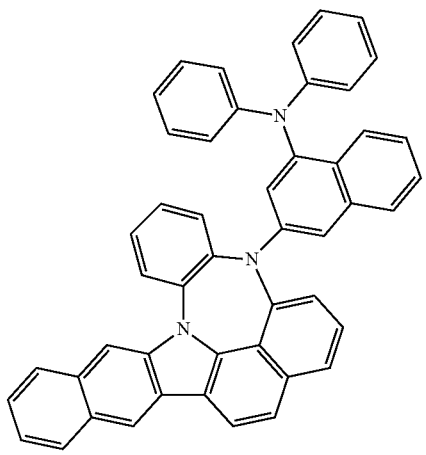
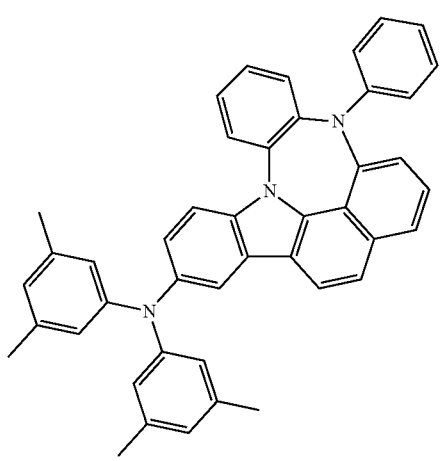
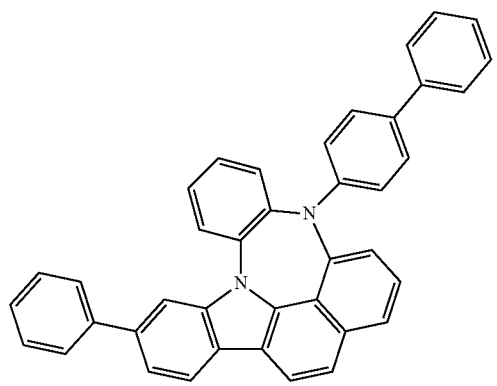
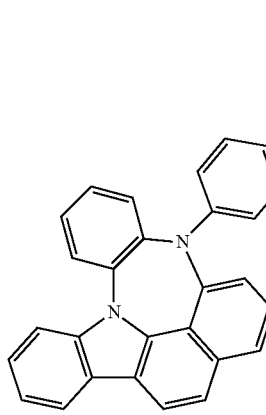
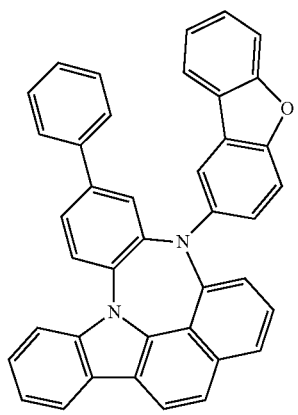

-continued
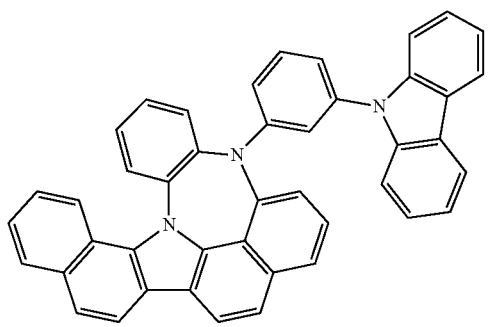
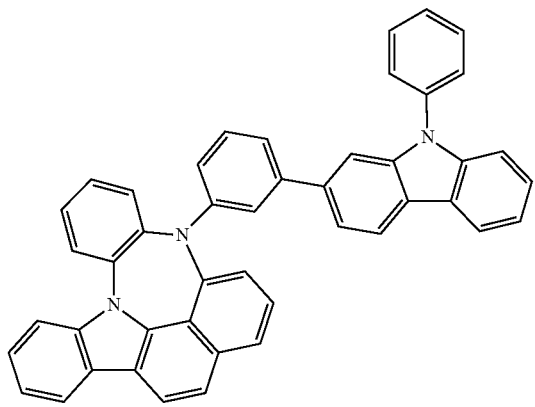
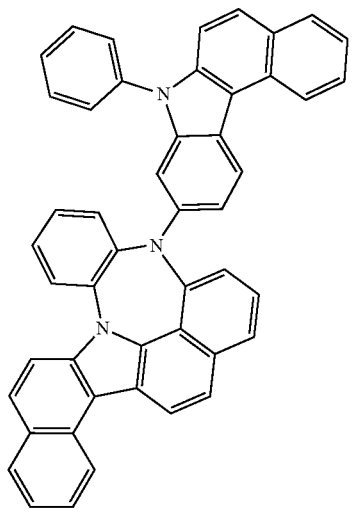
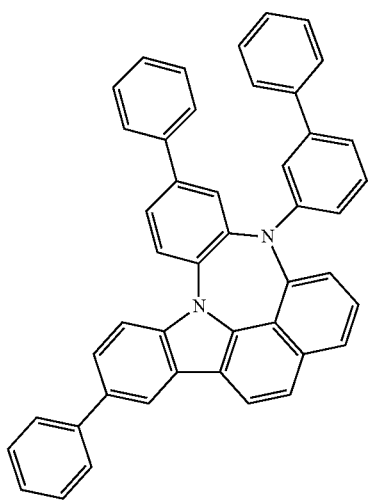
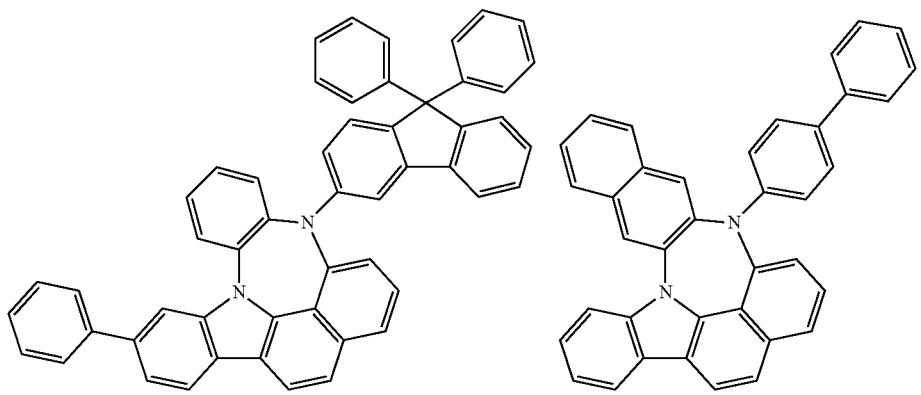

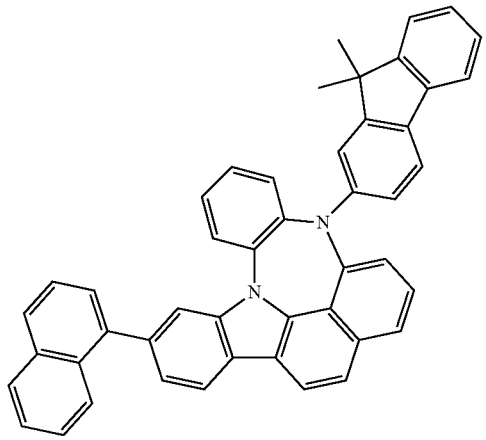
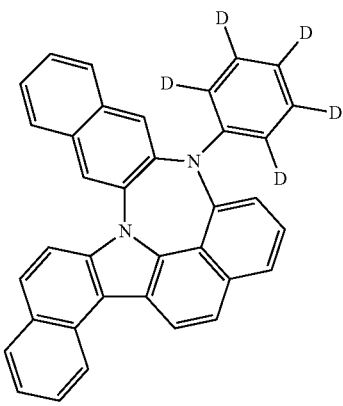
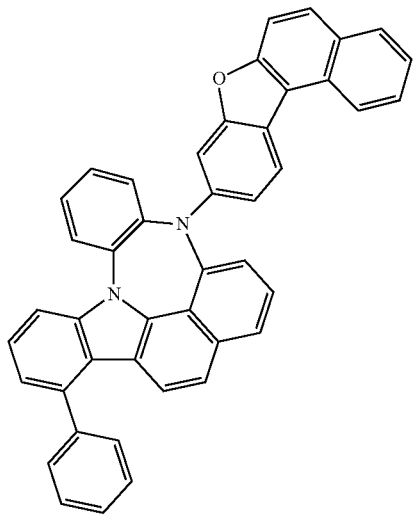
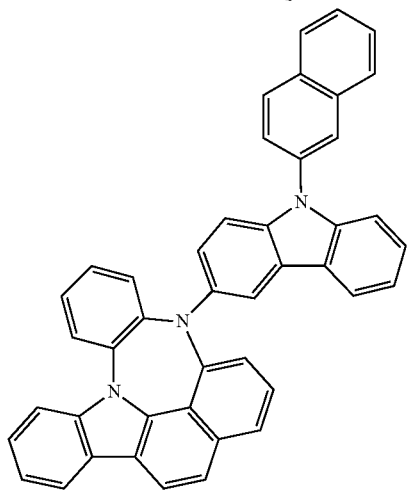
In some embodiments, in the organic compound of formula (I), at least one X is N atom.
In some embodiments, in the organic compound of formula (I), at least two Xs are N atoms.
In some embodiments, the organic compound as described herein is selected from one of the following formulas:
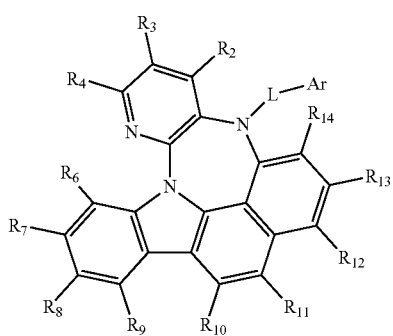
-continued
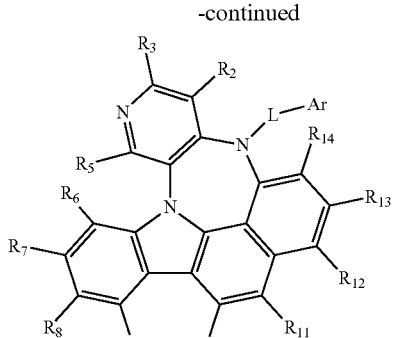
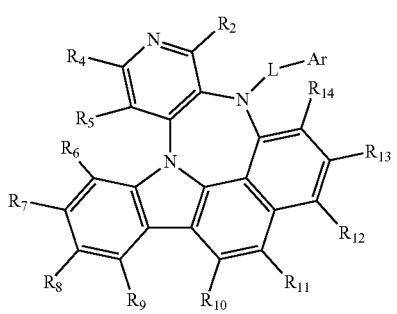

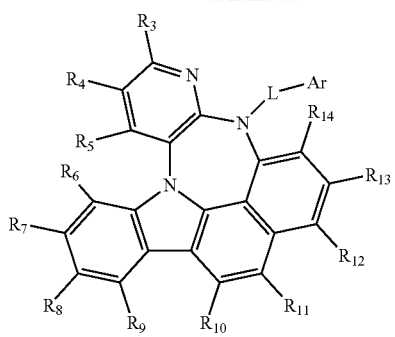
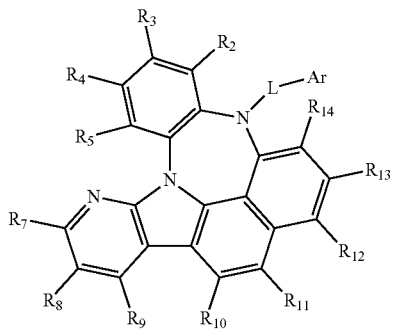
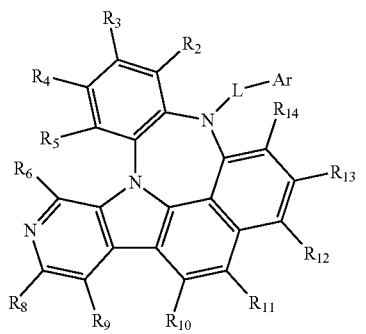
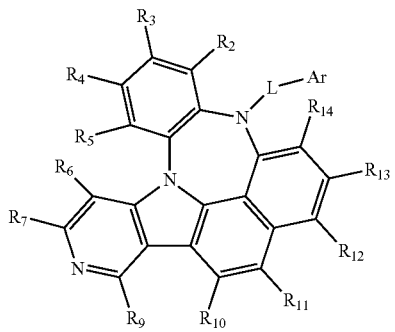
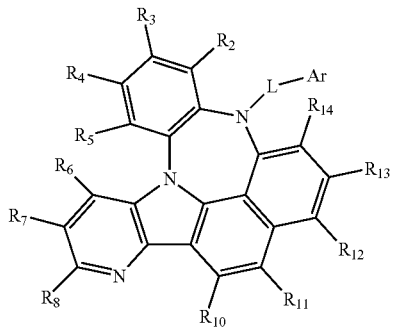
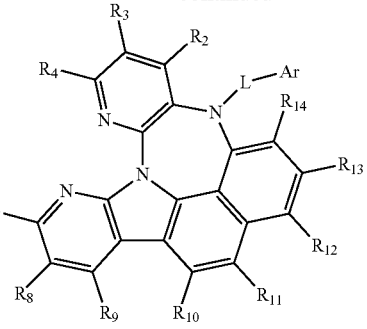
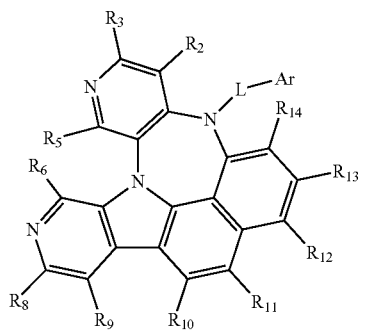
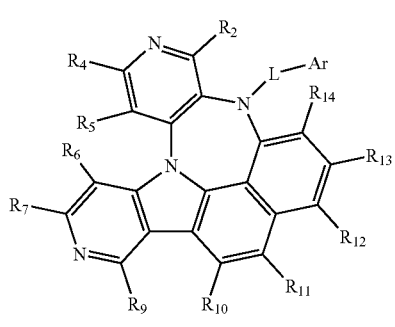
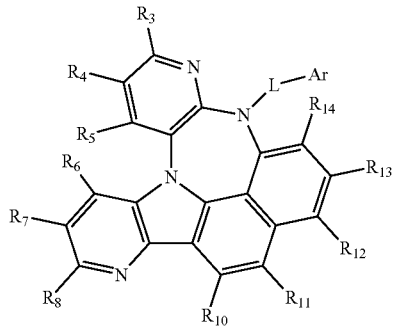
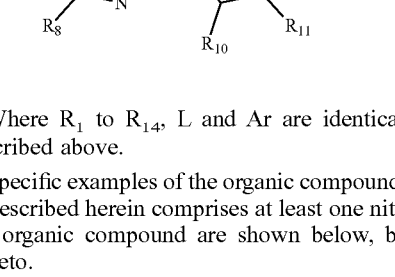
Where $R_1$ to $R_{14}$, L and Ar are identically defined as described above.
Specific examples of the organic compound of formula (I) as described herein comprises at least one nitrogen-containing organic compound are shown below, but not limited thereto.

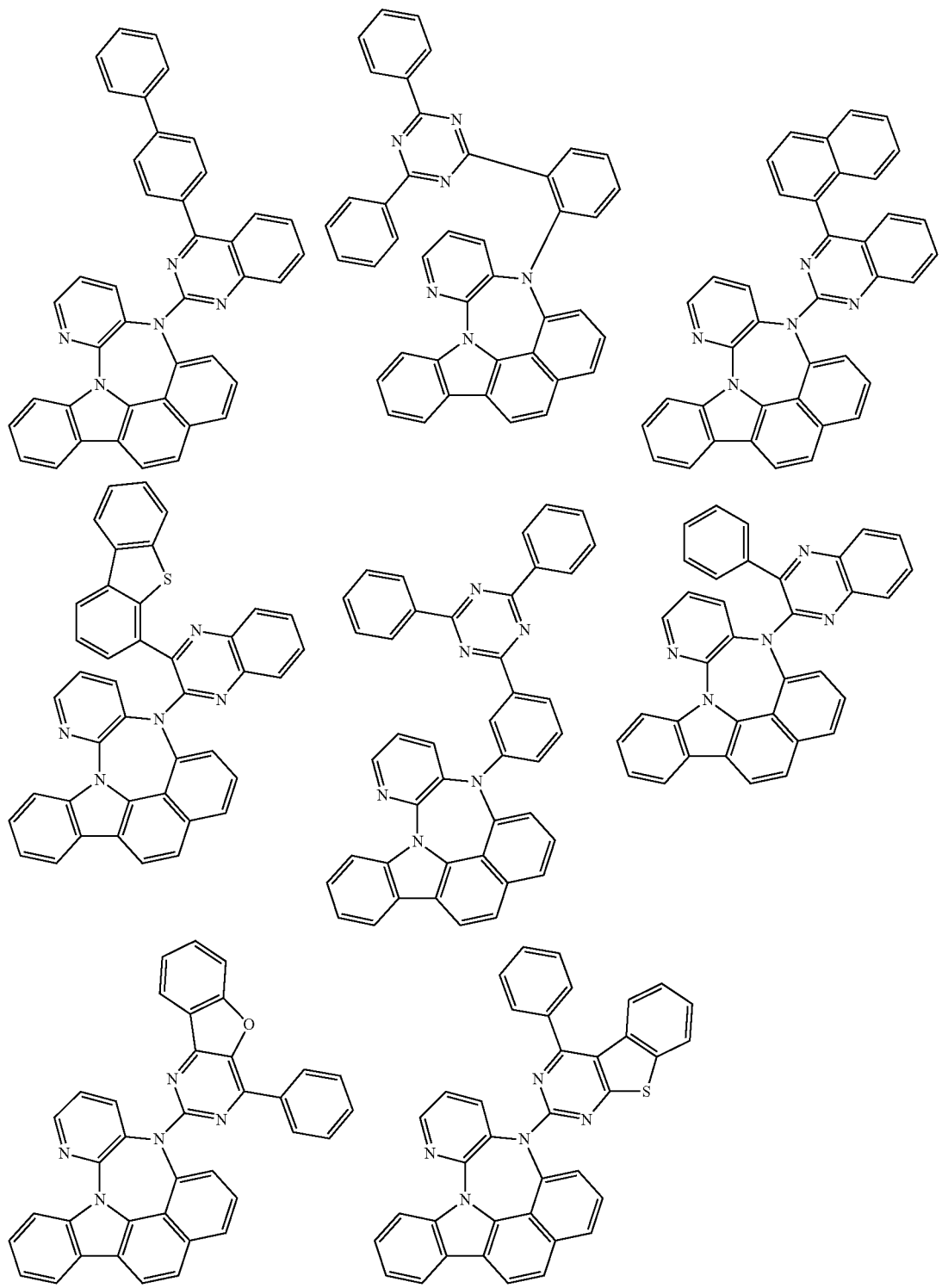

-continued
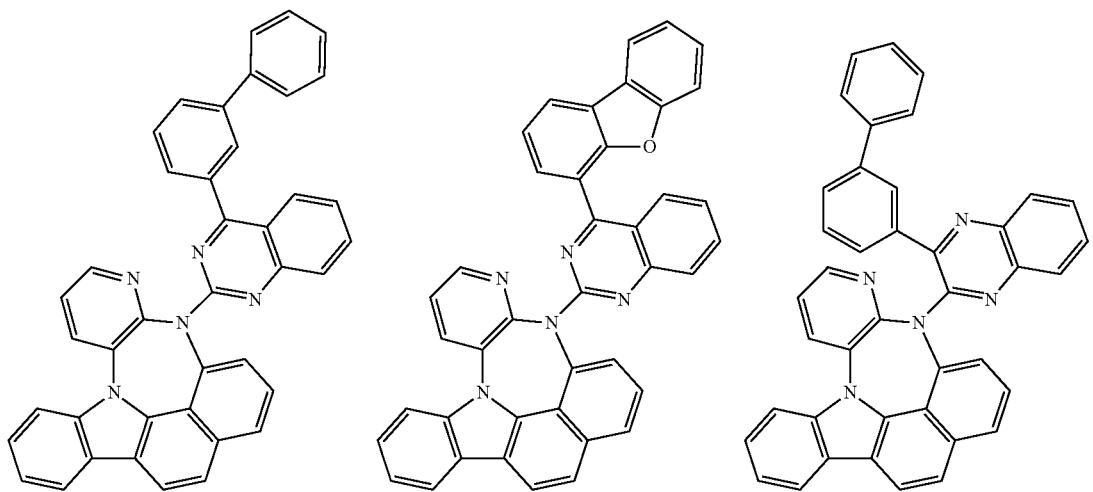
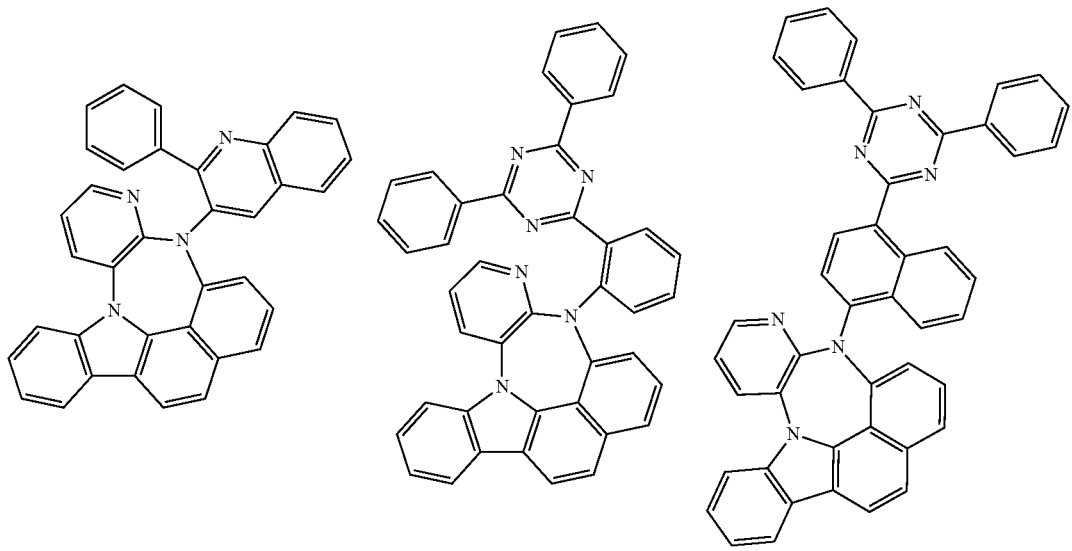
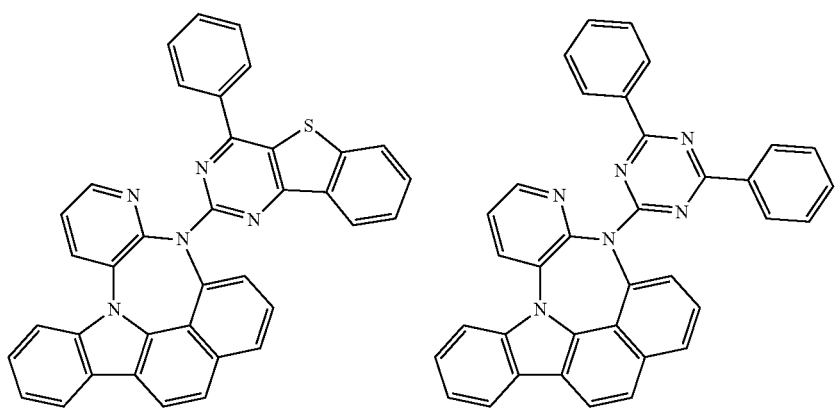

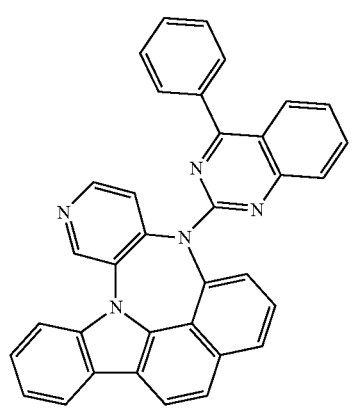
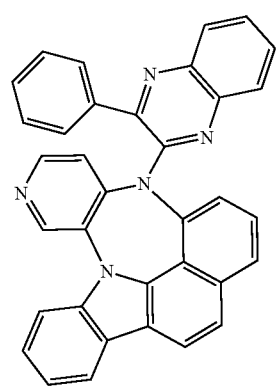
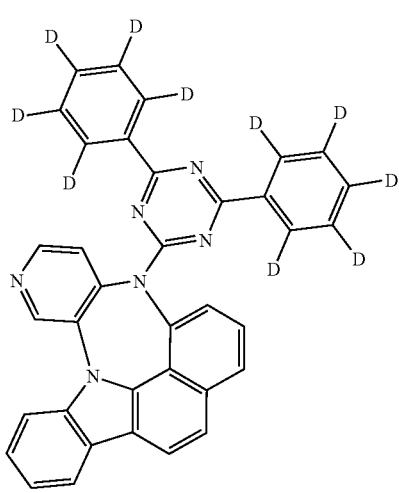
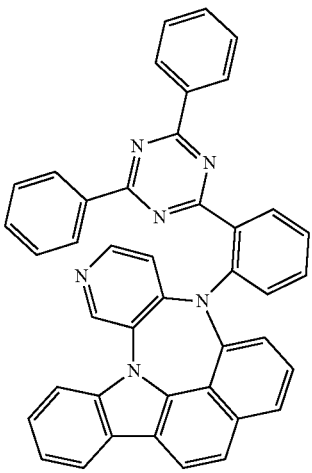
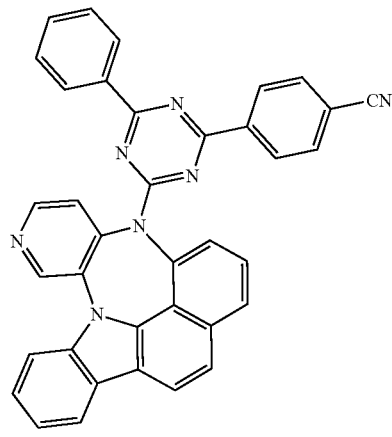
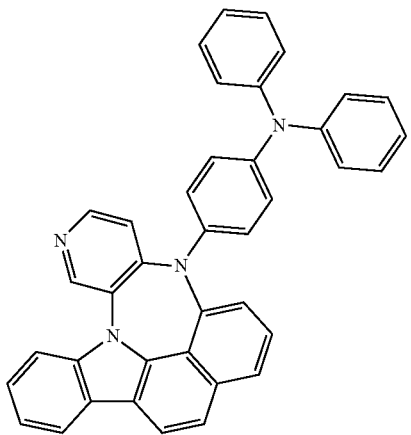

-continued
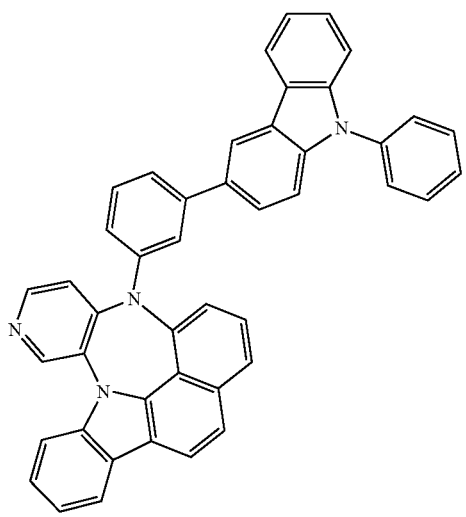
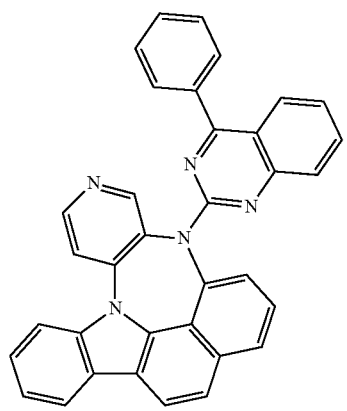
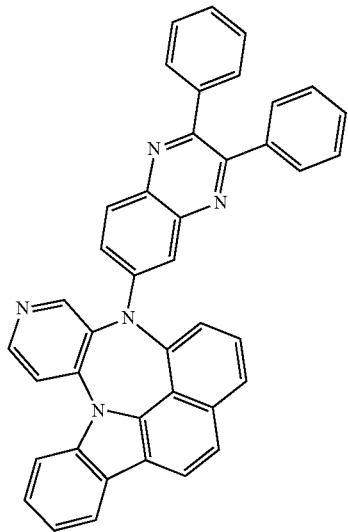
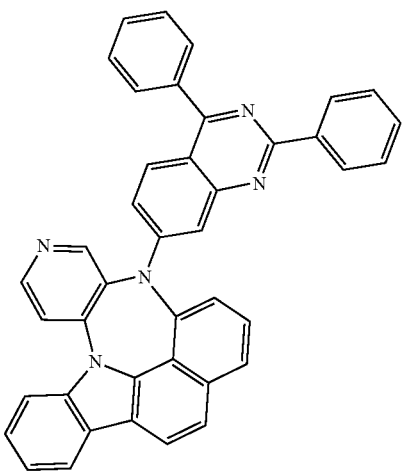
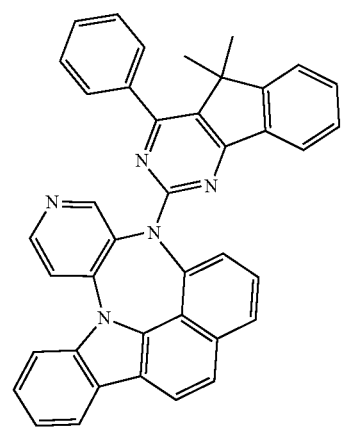
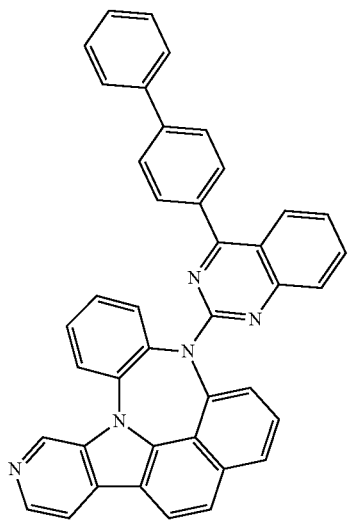
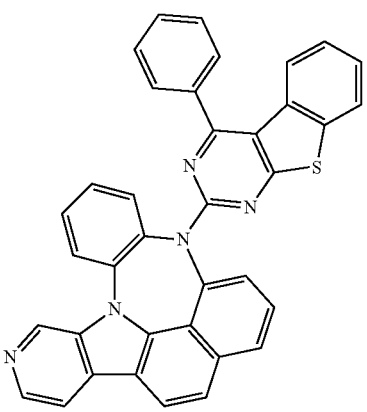

-continued
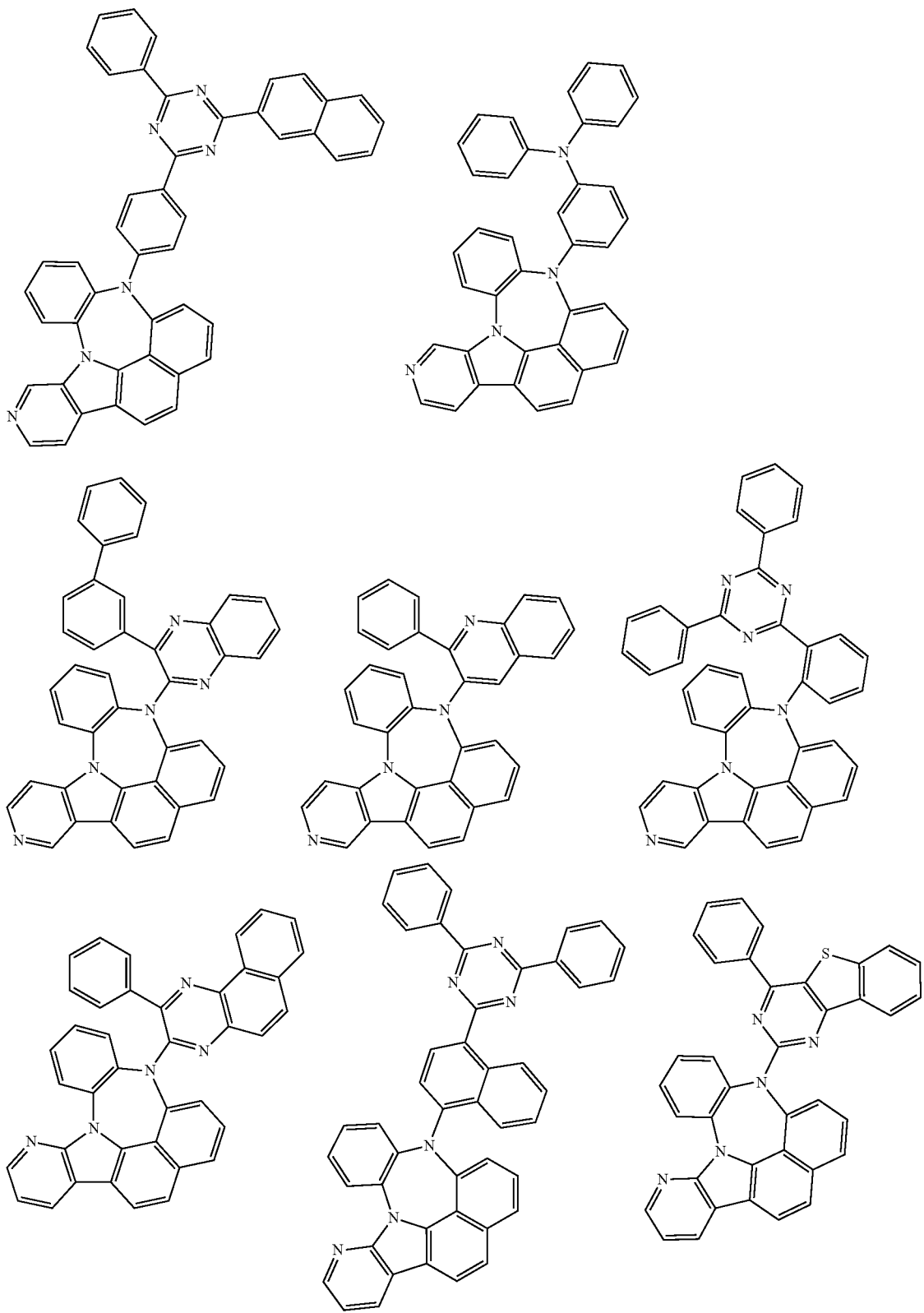

-continued

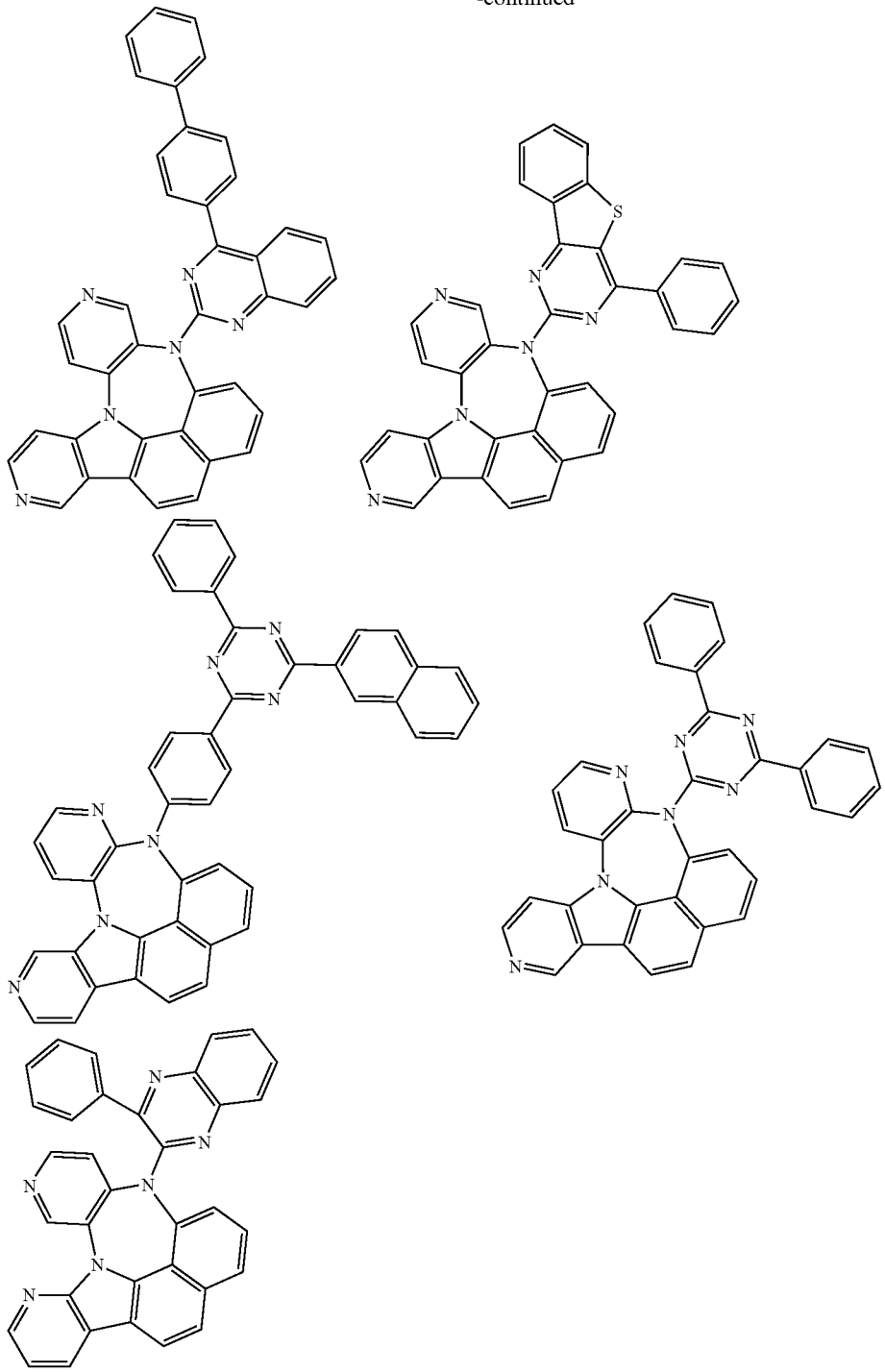

In some embodiments, the glass transition temperature (Tg) of the organic compound as described herein ≥100° C. In some embodiments, Tg≥120° C. In some embodiments, Tg≥140° C. In some embodiments, Tg≥160° C. In some embodiment, Tg≥180° C.

In some embodiments, the organic compound as described herein is partially deuterated; preferably 10% or more of total H, more preferably 20% or more of total H, further preferably 30% or more of total H, and most preferably 40% or more of total H, are deuterated.

In some embodiments, the organic compound as described herein is a small molecular material.

In some embodiments, the organic compound as described herein is used for evaporation-based OLEDs. For this purpose, the molecular weight of the organic compound as described herein ≤1000 g/mol, preferably ≤900 g/mol, more preferably ≤850 g/mol, further preferably ≤800 g/mol, and most preferably ≤700 g/mol.

In yet another aspect, the present disclosure also provides a synthetic method of the organic compound according to formula (I), where feedstocks containing active groups are used to carry out the reaction. These active feedstocks comprise at least one leaving group, such as, a bromine, an iodine, a boronic acid, or boronic ester. The appropriate reactions for forming C—C linkages are familiar to the person skilled in the art and are described in the literature, particularly appropriate and preferred coupling reactions are the SUZUKI STILLE, and HECK.

In another aspect, the present disclosure further provides a polymer comprising at least one repeating unit, where at least one of the repeating unit comprises a structure of formula (I). In some embodiments, the polymer is a non-conjugated polymer in which the structural unit of formula (I) is on a side chain. In some embodiments, the polymer is a conjugated polymer. The term "small molecule" herein refers to a molecule that is no one of following: a polymer, an oligomer, a dendrimer, or a blend. In particular, there are no repeating structures in the small molecule. The molecular weight of the small molecule $\leq 3000$ g/mol, preferably $\leq 2000$ g/mol, and most preferably $\leq 1500$ g/mol.

The term of polymer comprises homopolymer, copolymer, and block copolymer. Also in the present disclosure, the term of polymer comprises dendrimer. For the synthesis and application of the dendrimers, please refer to [Dendrimers and Dendrons, Wiley-VCH Verlag GmbH & Co. KGaA, 2002, Ed. George R. Newkome, Charles N. Moorefield, Fritz Vogtle.].

The term "conjugated polymer" refers to a polymer with backbone mainly comprising sp2 hybrid orbitals of C atoms, well-known examples are polyacetylene and poly(phenylene vinylene). The C atoms on the backbones can also be substituted with other non-C atoms. Moreover, the above-mentioned structure should still be considered as a conjugated polymer when the sp2 hybridization on the backbone is interrupted by natural defects. Also in the present disclosure, the backbone of the conjugated polymer comprises aryl amines, aryl phosphines and other heteroarmotics, organometallic complexes, etc.

In some embodiments, the synthetic method of the polymer is selected from the group consisting of SUZUKI-, YAMAMOTO-, STILLE-, NIGESHI-, KUMADA-, HECK-, SONOGASHIRA-, HIYAMA-, FUKUYAMA-, HARTWIG-, BUCHWALD-, and ULLMAN-.

In some embodiments, the glass transition temperature (Tg) of the polymer as described herein $\geq 100°$ C., preferably $\geq 120°$ C., more preferably $\geq 140°$ C., further preferably $\geq 160°$ C., and most preferably $\geq 180°$ C.

In some embodiments, in the polymer as described herein, the polydispersity index (PDI) is preferably from 1 to 5, more preferably 1 to 4; even more preferably 1 to 3, further preferably 1 to 2, and most preferably 1 to 1.5.

In some embodiments, in the polymer as described herein, the weight-average molecular weight ($M_w$) is preferably from 10 k to 1 million, more preferably 50 k to 500 k, even more preferably 100 k to 400 k, further preferably 150 k to 300 k, and most preferably 200 k to 250 k.

In yet another aspect, the present disclosure further provides a mixture comprising an organic compound H1 and an organic compound H2, the organic compound H1 is selected from an organic compound or a polymer as described herein, the organic compound H2 is another organic functional material, and is selected from one or more of the following: a hole-injection material (HIM), a hole-transport material (HTM), a p-dopant material, an electron-transport material (ETM), an electron-injection material (EIM), an electron-blocking material (EBM), a hole-blocking material (HBM), an emitting material (Emitter), a host material (Host), or an organic dye. These organic functional materials are described in detail, for example, in US2017092880A1, US2018006247A1, and EP3301097A2. The entire contents of these three documents are incorporated herein by reference in their entirety.

In some embodiments, the mixture comprises at least one organic compound or polymer as described above, and a hole-transport material (HTM).

In some embodiments, the mixture comprises at least one organic compound or polymer as described above, and an emitting material, the emitting material is selected from the group consisting of a singlet emitting material (fluorescent emitting material), a triplet emitting material (phosphorescent emitting material), and a TADF material.

In some embodiments, the mixture comprises at least one organic compound or polymer as described above, and a fluorescent emitter, where the weight percentage of the fluorescent emitter $\leq 10$ wt %, preferably $\leq 9$ wt %, more preferably $\leq 8$ wt %, further preferably $\leq 7$ wt %, and most preferably $\leq 5$ wt %.

In some embodiments, the mixture comprises at least one organic compound or polymer as described above, and a phosphorescent emitter, where the weight percentage of the phosphorescent emitter $\leq 20$ wt %, preferably $\leq 15$ wt %, more preferably $\leq 10$ wt %.

In some embodiments, the mixture comprises at least one organic compound or polymer as described above, and a TADF material; where the property of the TADF material is preferably: 1) forming a co-host material with the organic compound as described herein in a weight ratio from 1:6 to 6:1; 2) forming an Exciplex with the organic compound as described herein, or as an auxiliary light emitter, where the weight percentage of the TADF material $\leq 15$ wt %, preferably $\leq 10$ wt %, more preferably $\leq 8$ wt %.

In some embodiments, the mixture comprises at least one organic compound or polymer as described above, and an organic compound H2 (i. e. another organic functional material). Such a mixture can be used as a phosphorescent mixed host material, and can further comprise a phosphorescent emitter, where the weight percentage of the phosphorescent emitter $\leq 20$ wt %, preferably $\leq 15$ wt %, more preferably $\leq 10$ wt %.

A detailed description of the mixture containing an organic compound H1 and an organic compound H2 as a phosphorescent hybrid host is given below.

In some embodiments, the organic compound H2 has hole-transport property.

More preferably, the organic compound H2 has both hole-transport property and electron-transport property.

Generally, the molar ratio of the organic compound H1 to the organic compound H2 ranges from 1:9 to 9:1.

Preferably, the molar ratio of the organic compound H1 to the organic compound H2 ranges from 3:7 to 7:3.

More preferably, the molar ratio of the organic compound H1 to the organic compound H2 ranges from 4:6 to 6:4.

Most preferably, the molar ratio of the organic compound H1 to the organic compound H2 is 5:5.

In some embodiments, the organic compound H2 of the mixture comprises a structure of formula (III):

(III)

Where A is selected from a $C_1$-$C_{30}$ substituted/unsubstituted alkyl group, a $C_3$-$C_{30}$ substituted/unsubstituted cycloalkyl group, or a $C_5$-$C_{60}$ substituted/unsubstituted aromatic hydrocarbon or aromatic heterocyclic group; D is an electron-rich group; p is an integer from 1 to 6.

In some embodiments, the electron-rich (or electron donor) D group of formula (III) comprises any one of the following groups:

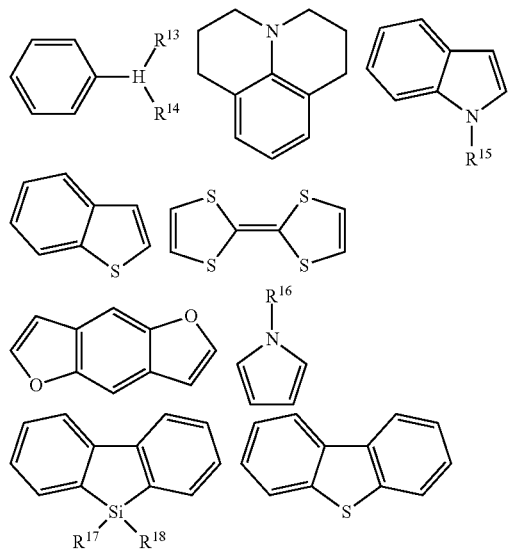

-continued

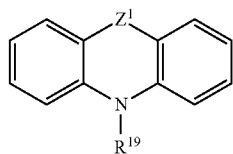

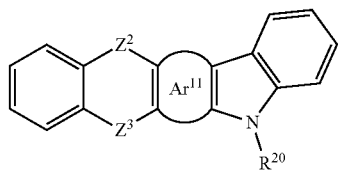

Where $Ar^{11}$ represents a $C_5$-$C_{40}$ aromatic or heteroaromatic group; $Z^1$, $Z^2$, $Z^3$ are independently selected from a single bond, $CR^{21}R^{22}$, $SiR^{23}R^{24}$, $NR^{25}$, O, C(=O), S, S=O, or $SO_2$, and $Z^2$ and $Z^3$ are not single bonds at the same time; $R^{13}$ to $R^{25}$ are identically defined as the above-mentioned $R_1$.

In some embodiments, the electron-rich (or electron donor) D group of formula (III) comprises any one of the following groups:

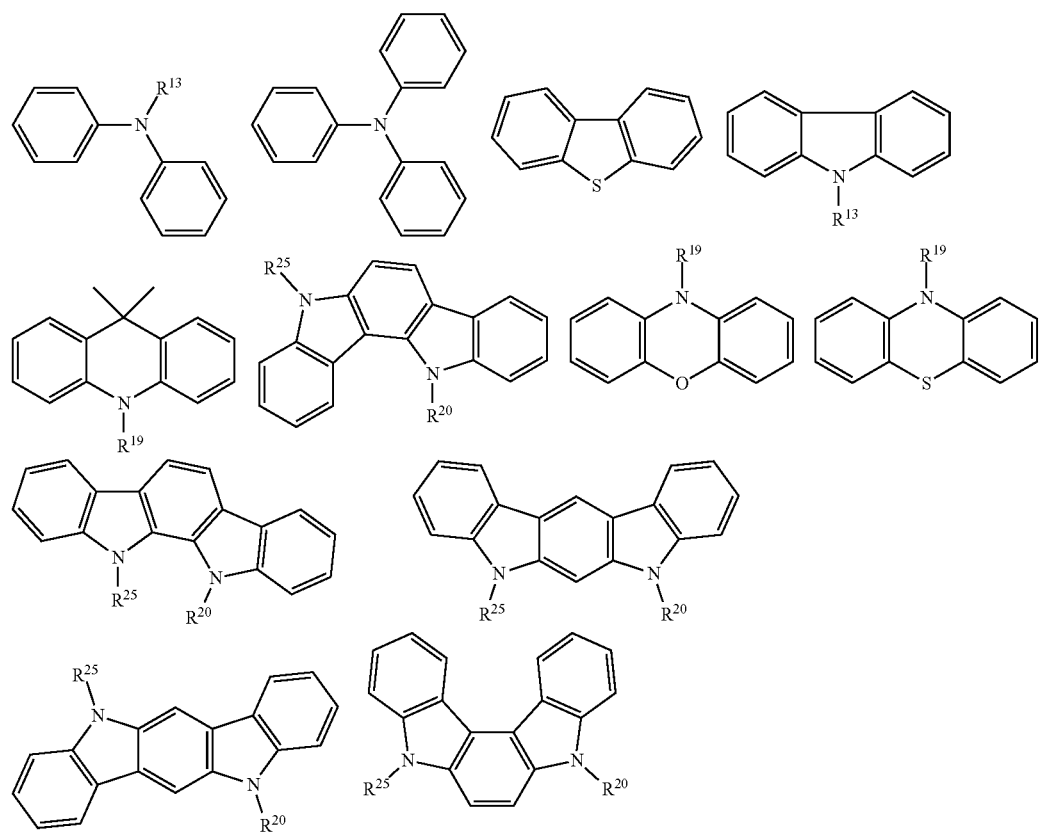

$R^{13}$, $R^{19}$, $R^{20}$, and $R^{25}$ are identically defined as described above.

In some embodiments, p is an integer from 1 to 4. In some embodiments, p is an integer from 1 to 3. In some embodiments, p is 1 or 2.

In some embodiments, the organic compound H2 of the mixture is selected from one of the following structural formulas:

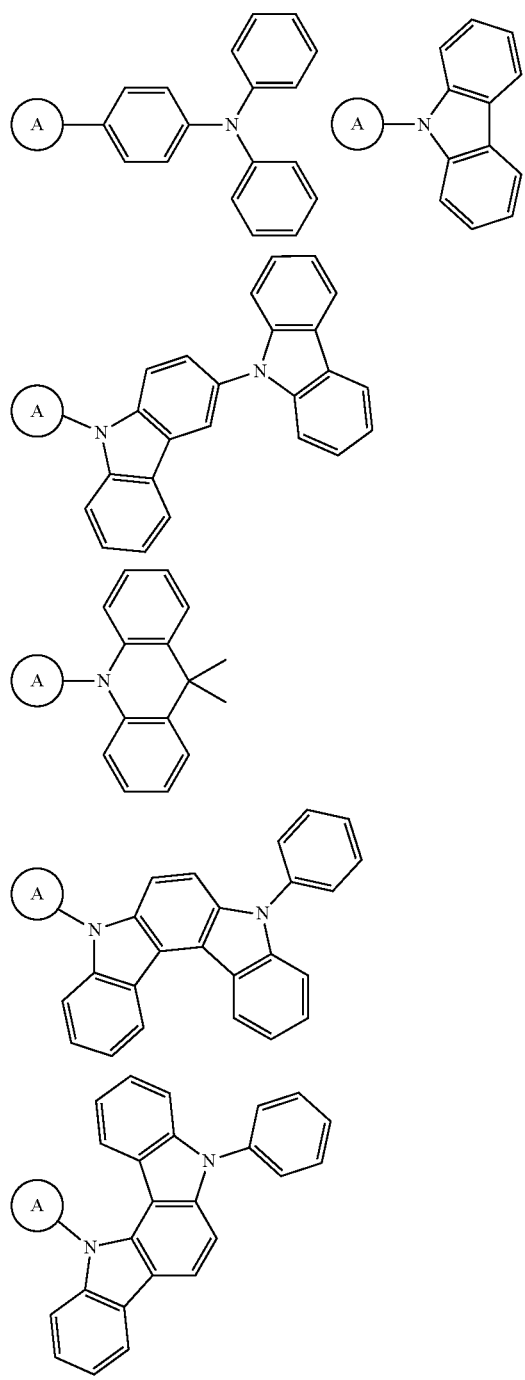
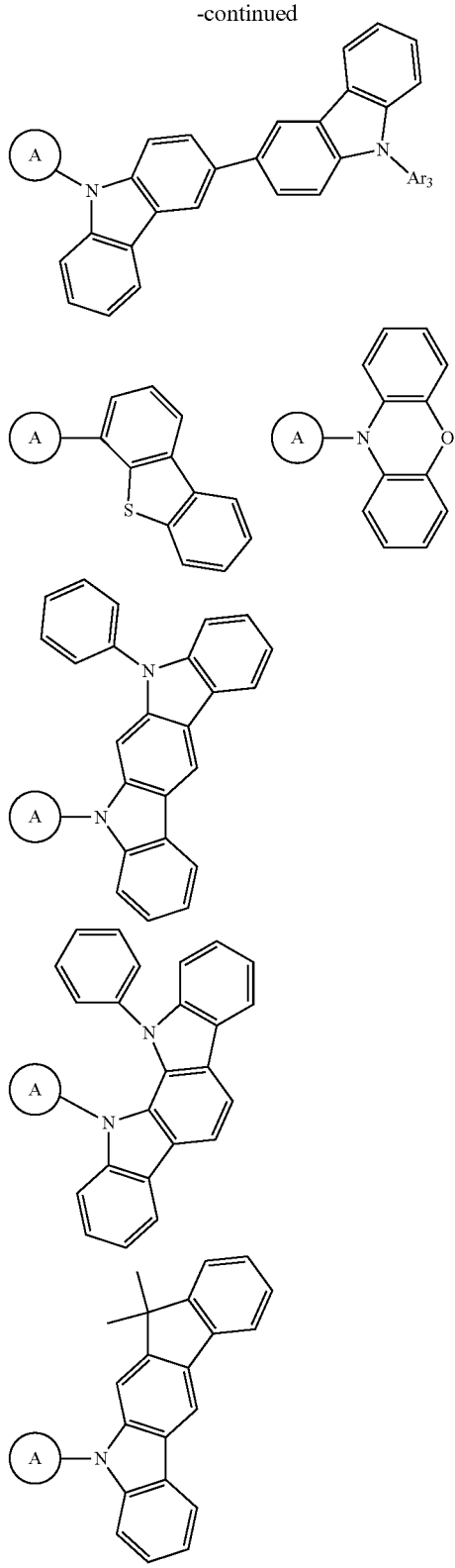

Where each A is defined as described above, and $Ar_3$ is defined as Ar.

In some embodiments, in the mixture as described herein, the organic compound H1 and/or the organic compound H2 have a high triplet energy level $E_{T1}$, preferably $E_{T1} \geq 2.0$ eV, more preferably $E_{T1} \geq 2.1$ eV, even more preferably $E_{T1} \geq 2.2$ eV, further preferably $E_{T1} \geq 2.4$ eV, and most preferably $E_{T1} \geq 2.6$ eV.

In some embodiments, the organic compound H1 and the organic compound H2 of the mixture form a type II heterojunction energy structure, i. e., the highest occupied orbital level (HOMO) of the organic compound H1 is lower than the HOMO of the organic compound H2, and the lowest unoccupied orbital level (LUMO) of the organic compound H1 is lower than the LUMO of the organic compound H2.

In some embodiments, in the mixture as described herein, min((LUMO(H1)−HOMO(H2), LUMO(H2)−HOMO(H1)) ≤min(ET(H1), ET(H2))+0.1 eV, where LUMO(H1), HOMO (H1), and ET(H1) are the lowest unoccupied orbital, the highest occupied orbital, and the triplet energy level of the organic compound H1, respectively. LUMO(H2), HOMO (H2) and ET(H2) are the lowest unoccupied orbital, the highest occupied orbital, and the triplet energy level of the organic compound H2, respectively.

In some embodiments, in the mixture as described herein, min(LUMO(H1)−HOMO(H2), LUMO(H2)−HOMO(H1)) ≤min(ET(H1), ET(H2)).

In some embodiments, in the mixture as described herein, min(LUMO(H1)−HOMO(H2), LUMO(H2)−HOMO(H1)) ≤min(ET(H1), ET(H2))−0.05 eV.

In some embodiments, in the mixture as described herein, min(LUMO(H1)−HOMO(H2), LUMO(H2)−HOMO(H1)) ≤min(ET(H1), ET(H2))−0.1 eV.

In some embodiments, in the mixture as described herein, min(LUMO(H1)−HOMO(H2), LUMO(H2)−HOMO(H1)) ≤min(ET(H1), ET(H2))−0.15 eV.

In some embodiments, in the mixture as described herein, min(LUMO(H1)−HOMO(H2), LUMO(H2)−HOMO(H1)) ≤min(ET(H1), ET(H2))−0.2 eV.

Specific examples of the organic compound H2 according to formula (III) are shown below, but not limited thereto:

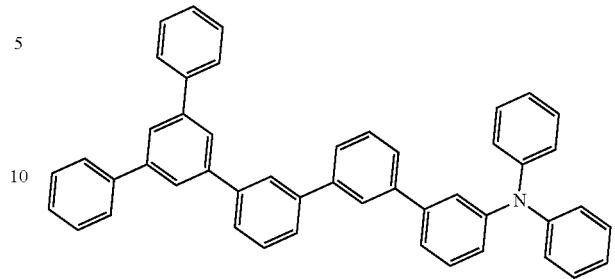

2-3

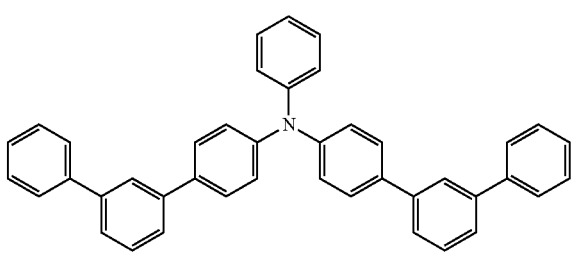

2-4

2-5

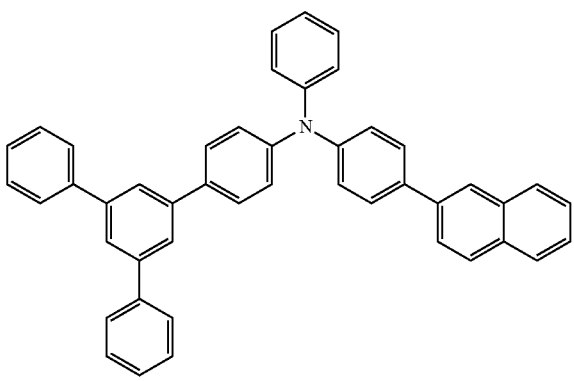

2-1

2-2

2-6

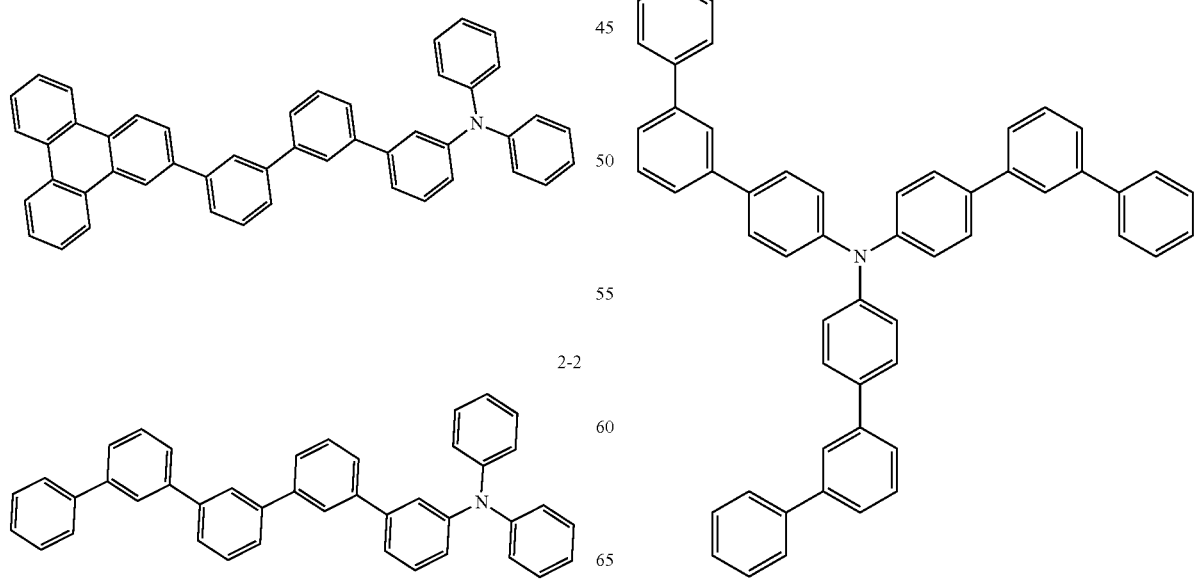

2-7
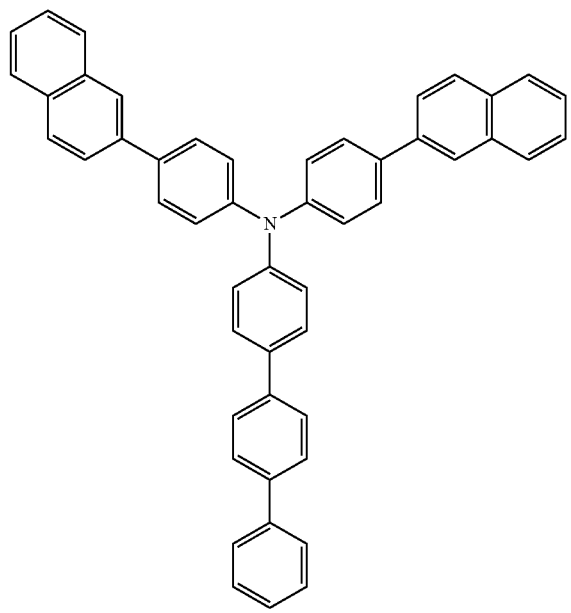
2-8
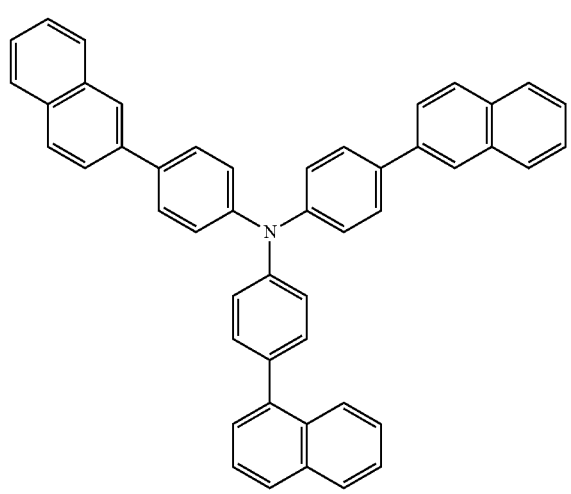
2-9
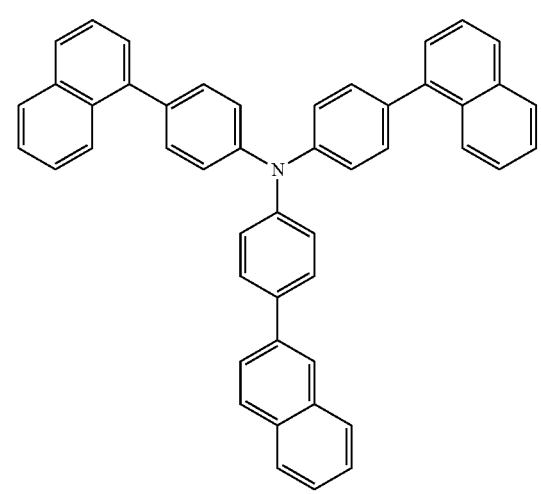
2-10
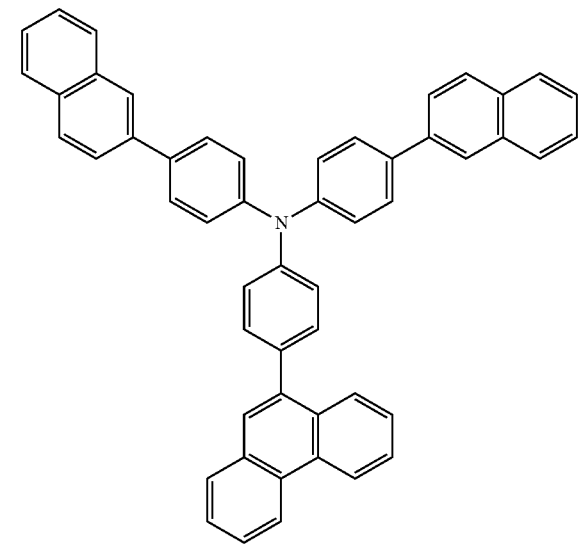
2-11
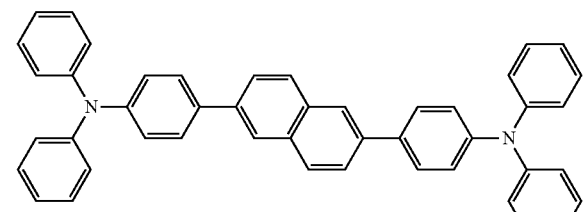
2-12
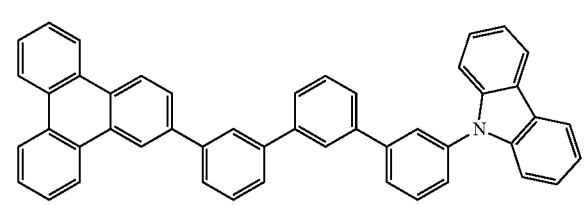
2-13
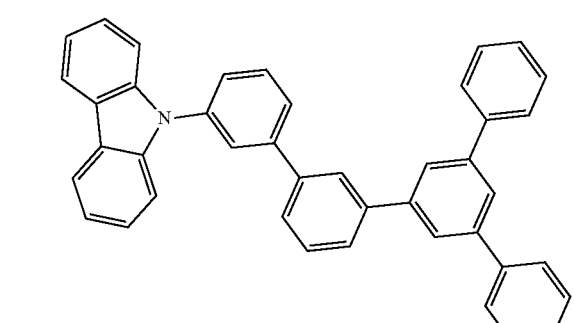
2-14
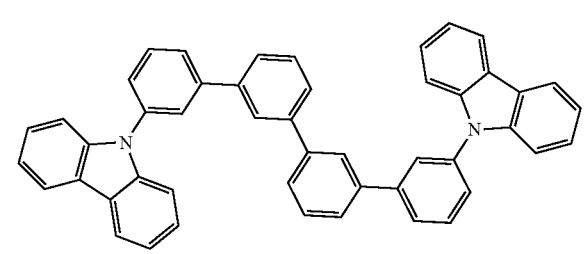

2-15
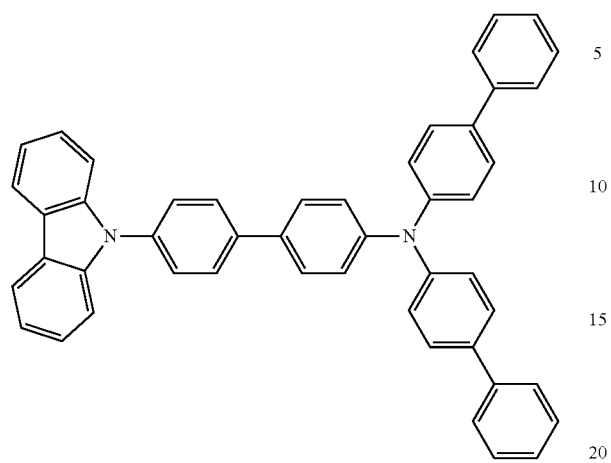
2-16
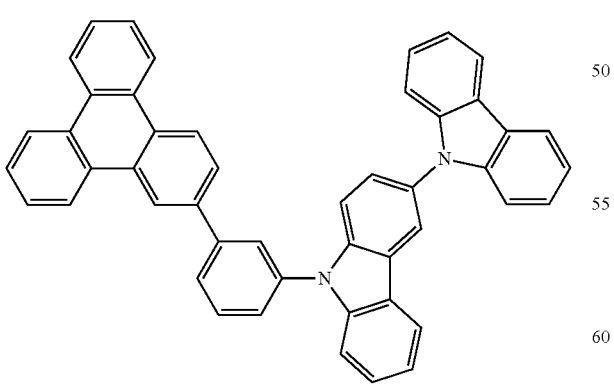
2-17
2-18
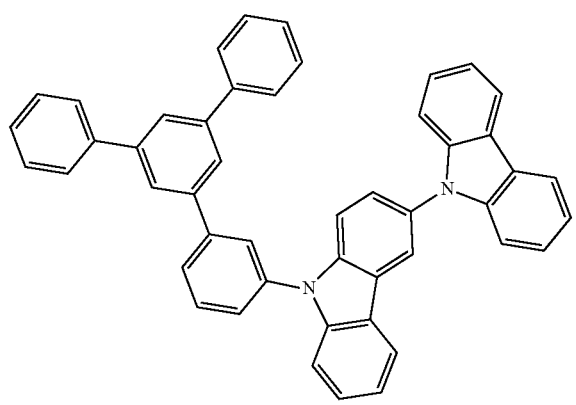
2-19
2-20
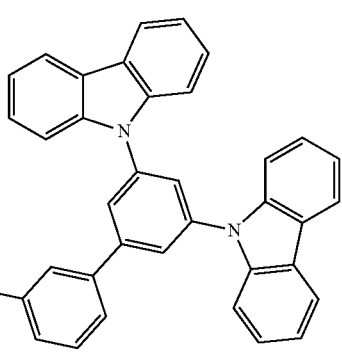
2-21
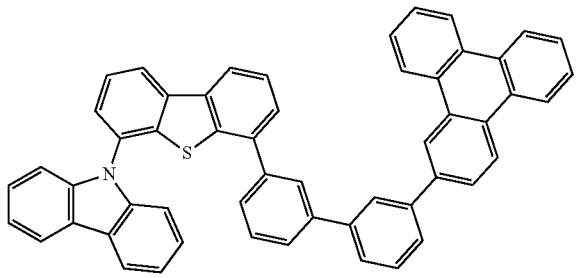

2-22
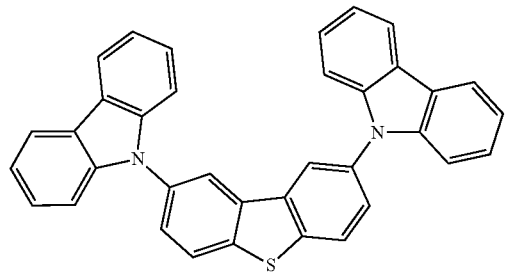
2-23
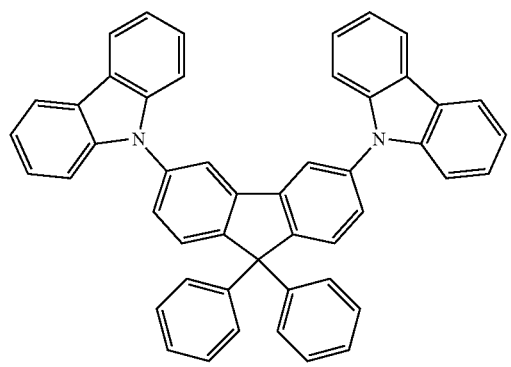
2-24
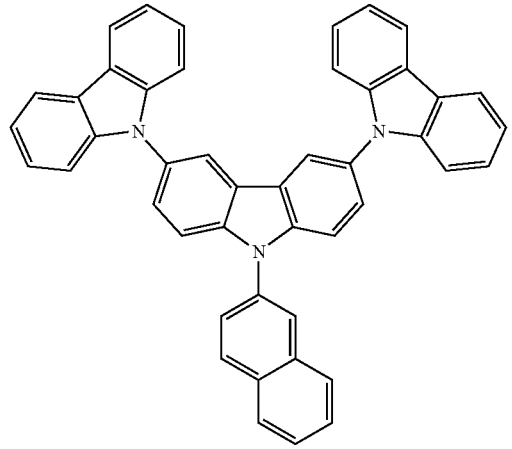
2-25
2-26
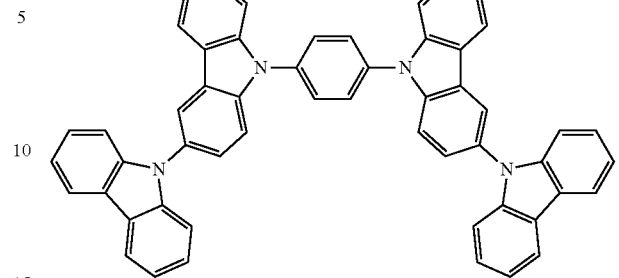
2-27
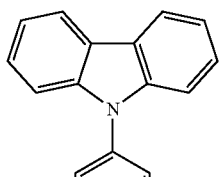
2-28
2-29
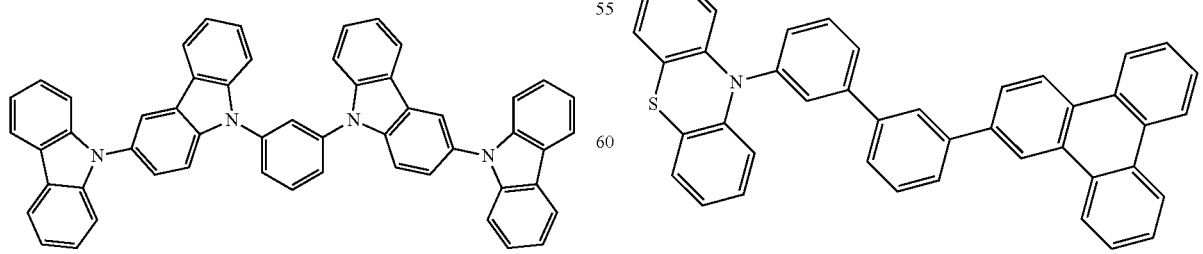

-continued
2-30
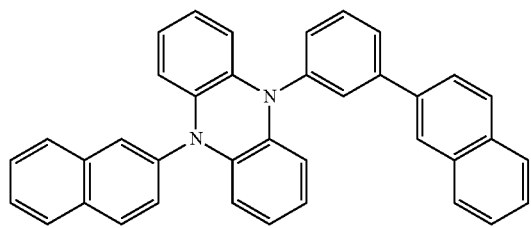
2-31
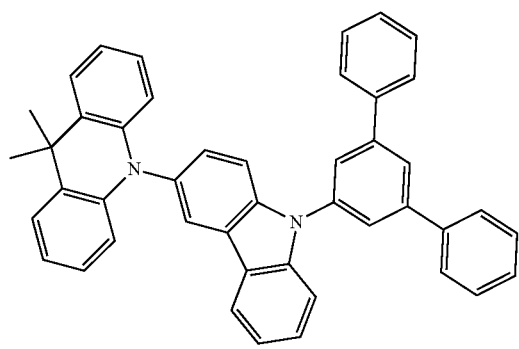
2-32
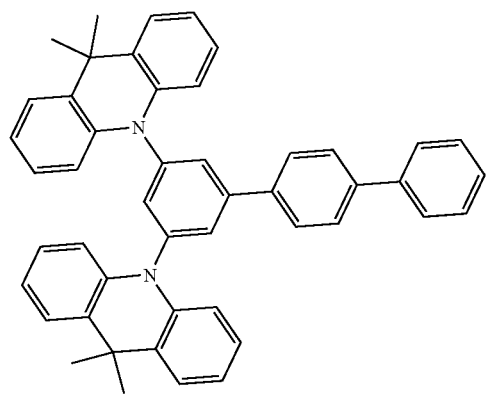
2-33
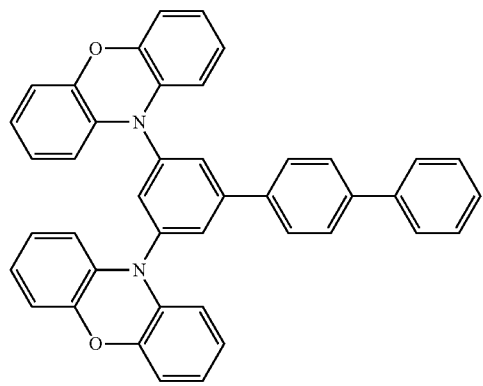
-continued
2-34
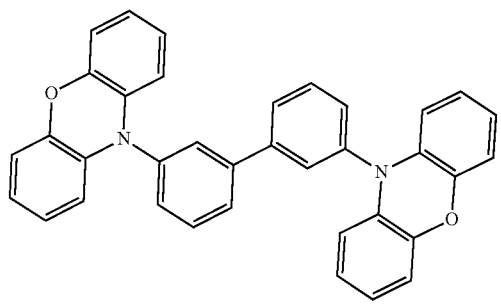
2-35
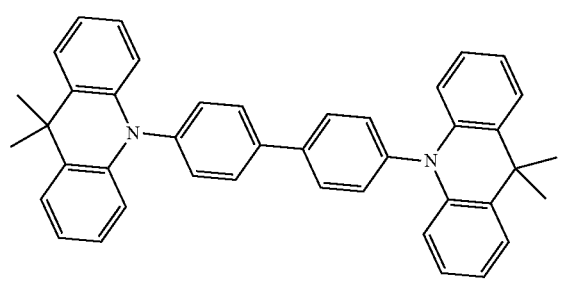
2-36
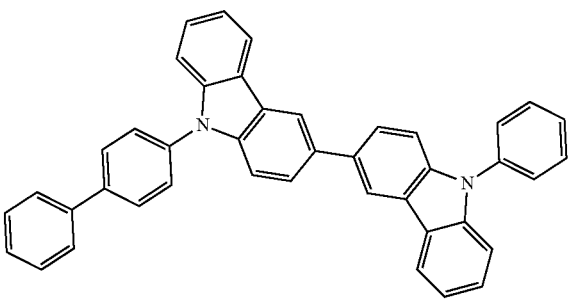
2-37
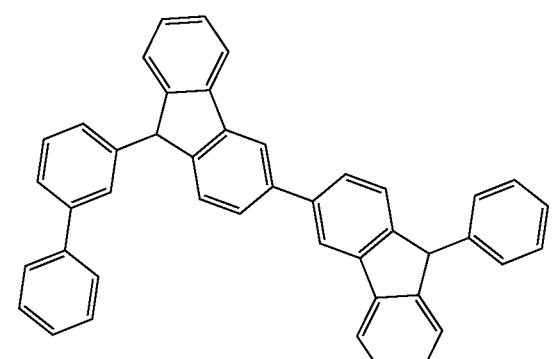

2-38
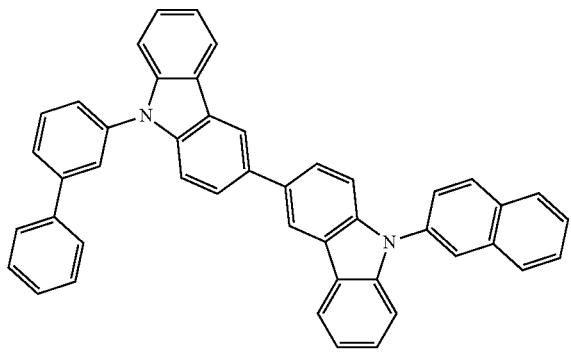
2-42
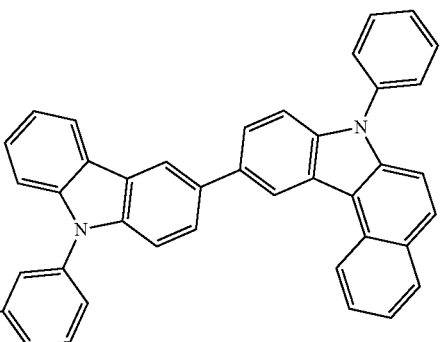
2-39
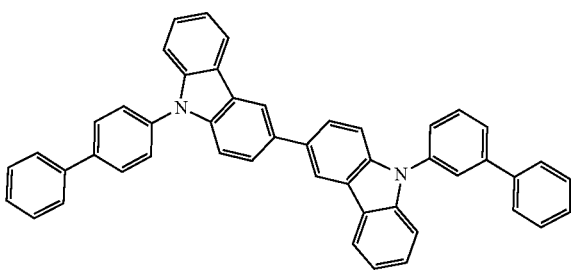
2-43
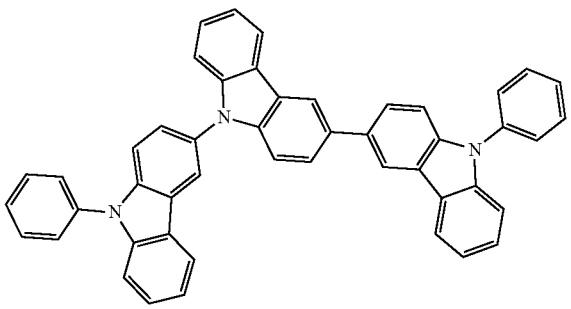
2-40
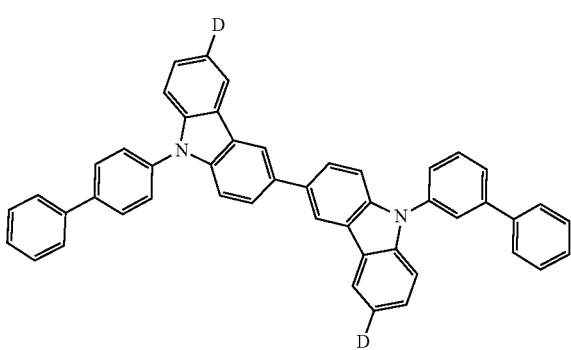
2-44
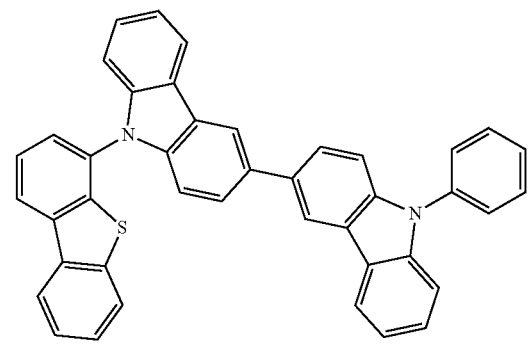
2-41
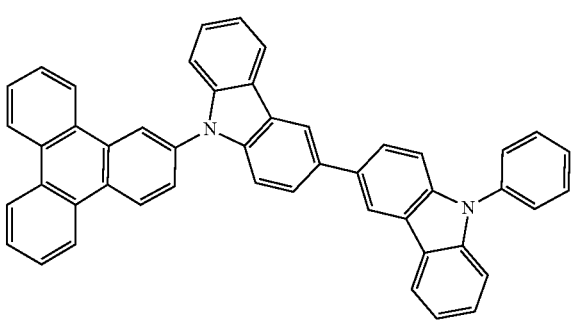
2-45
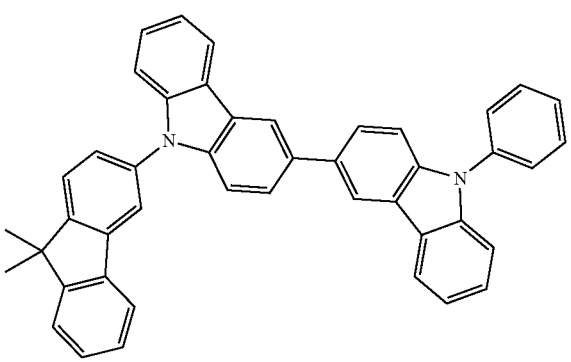

2-46
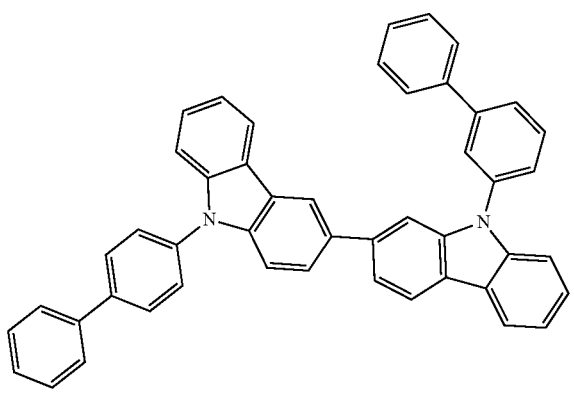
2-47
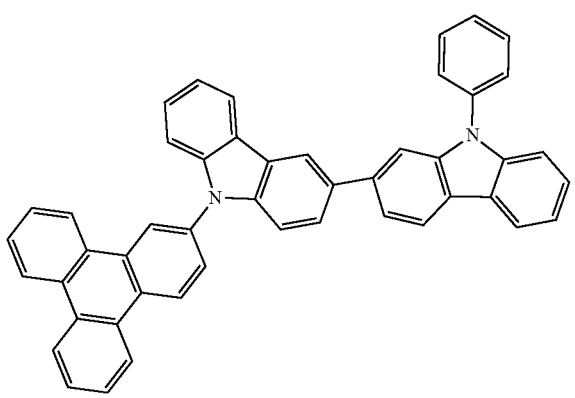
2-48
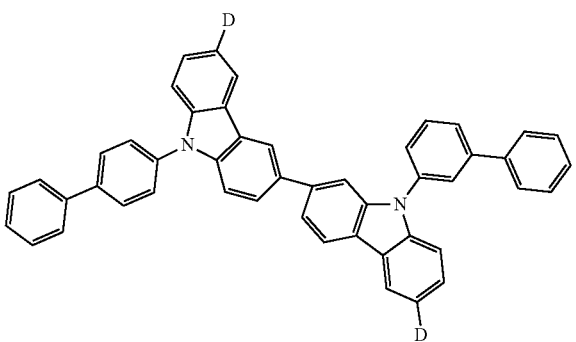
2-49
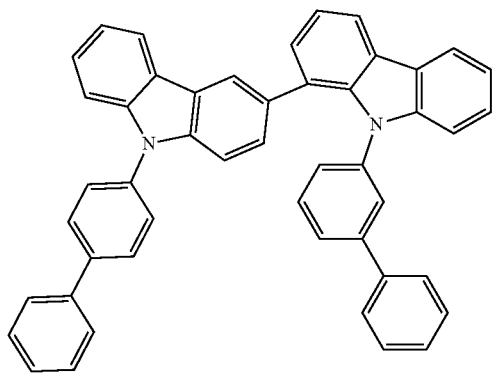
2-50
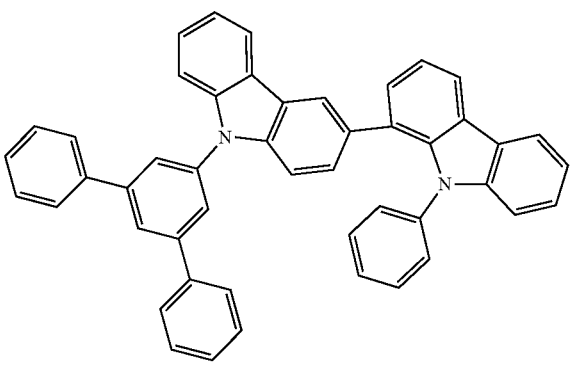
2-51
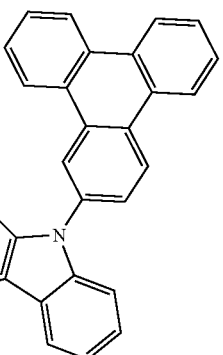
2-52
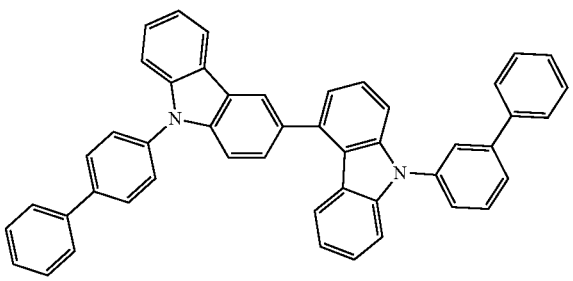
2-53
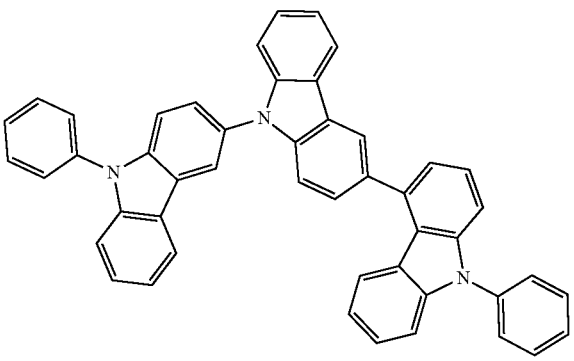

-continued
2-54
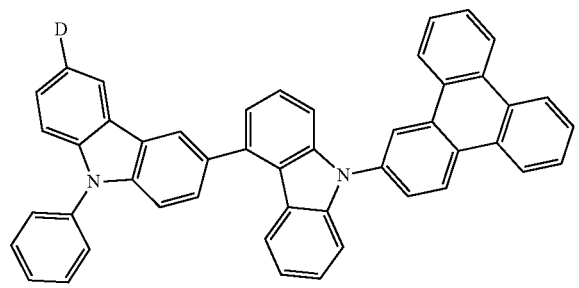
2-55
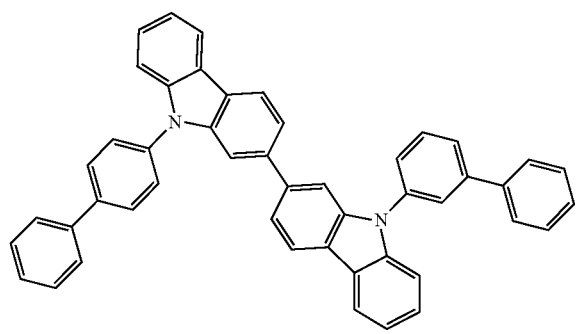
2-56
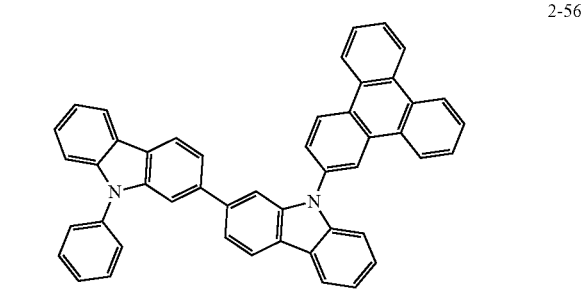
2-57
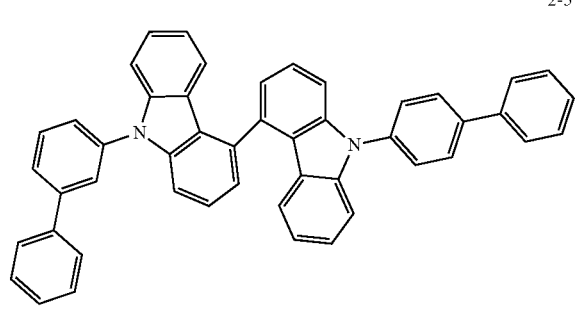
2-58
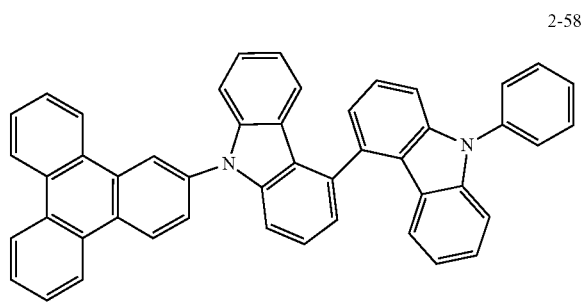
-continued
2-59
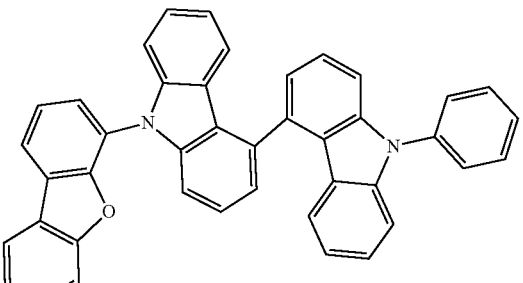
2-60
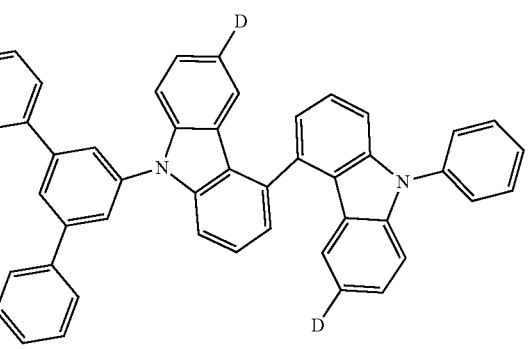
2-61
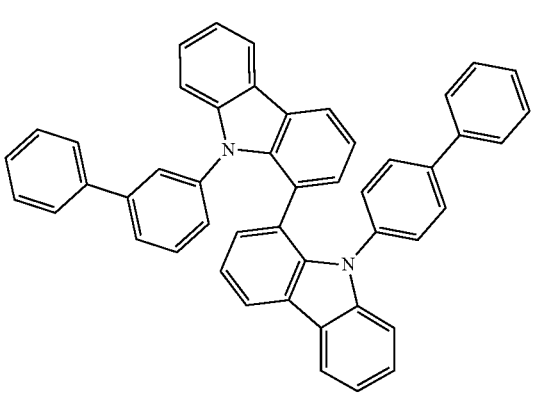
2-62
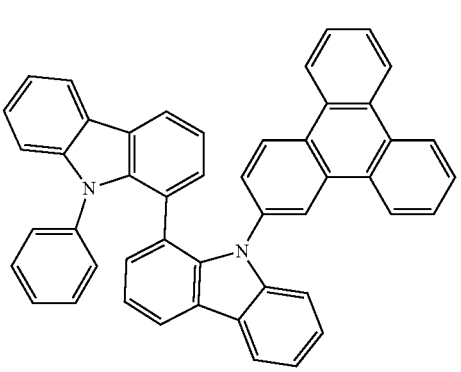

2-63
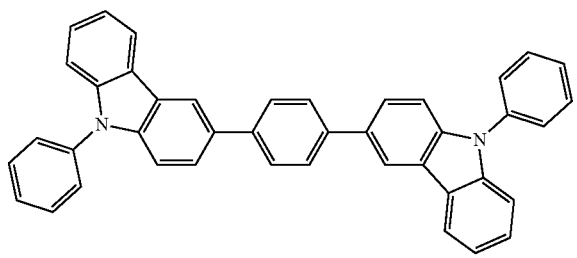
2-64
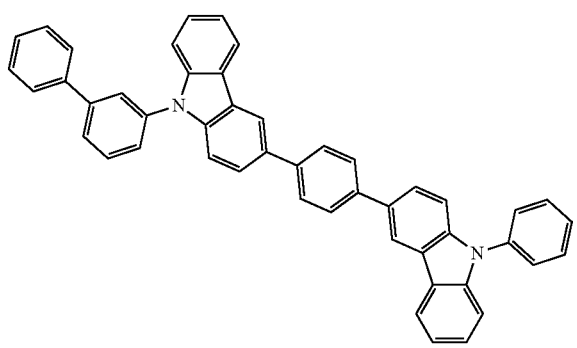
2-65
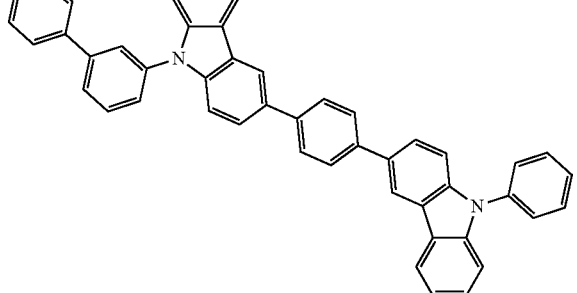
2-66
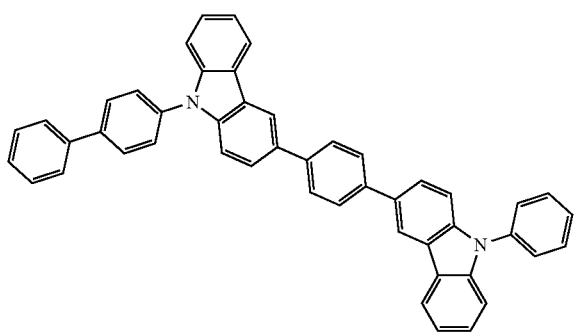
2-67
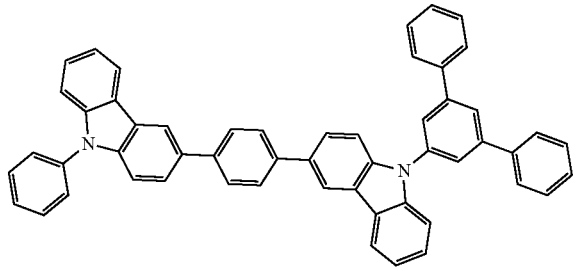
2-68
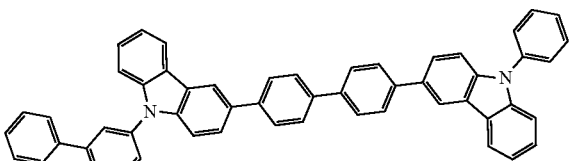
2-69
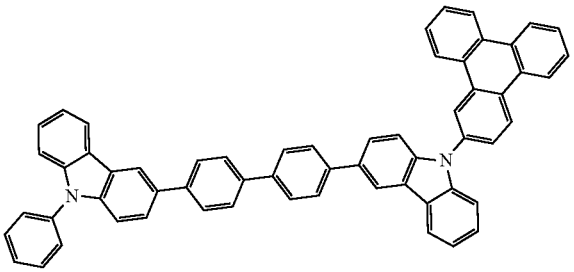
2-70
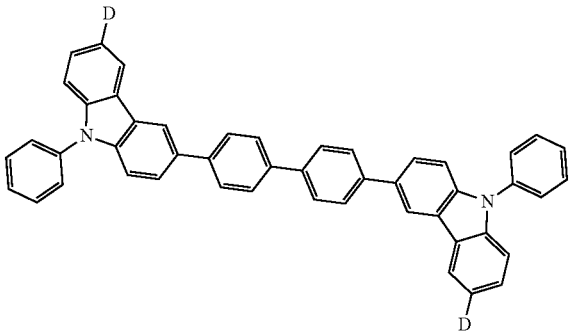
2-71
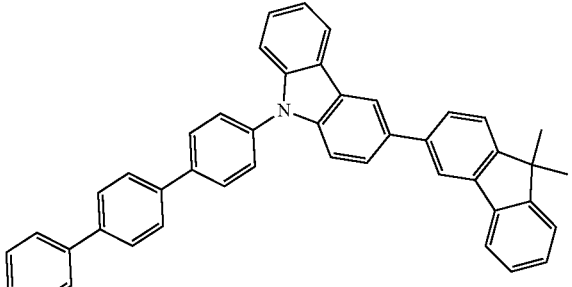
2-72
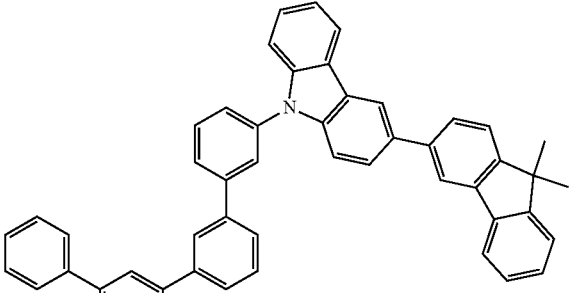

2-73
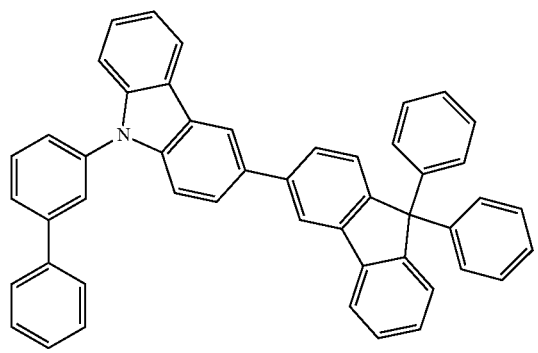
2-74
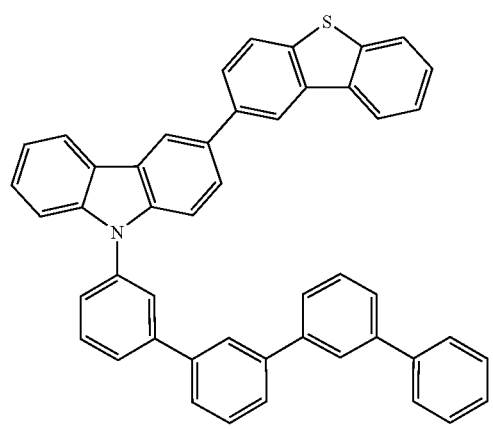
2-75
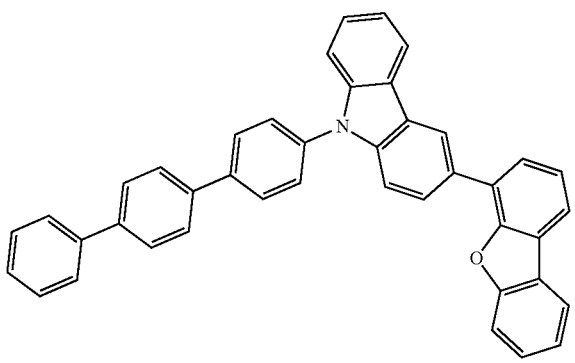
2-76
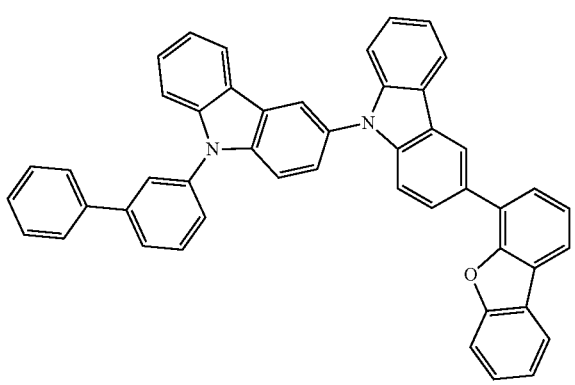
2-77
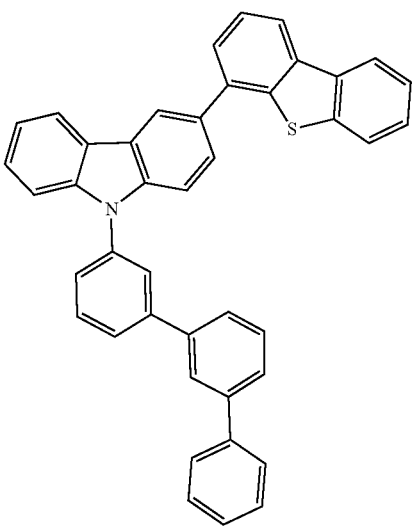
2-78
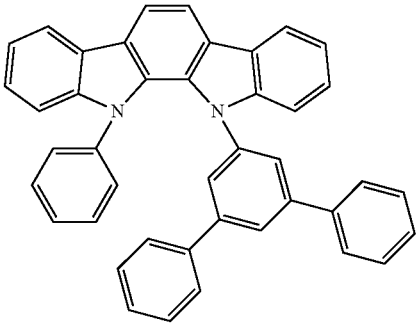
2-79
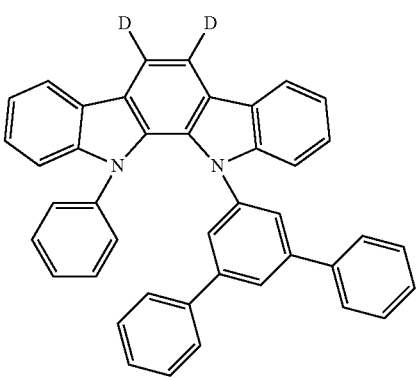
2-80
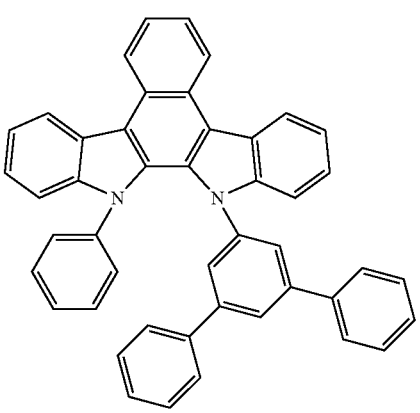

-continued
2-81
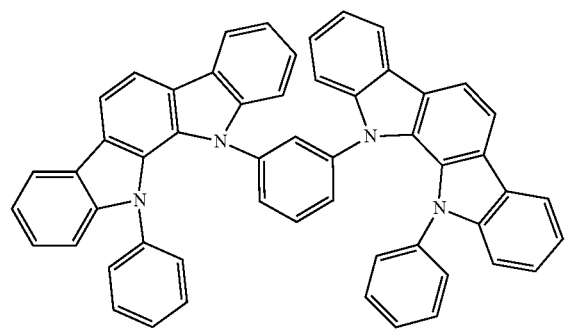
2-82
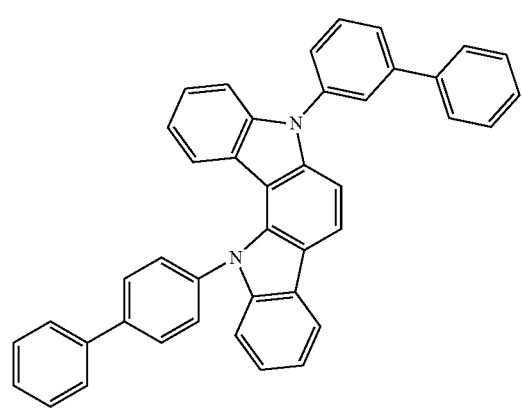
2-83
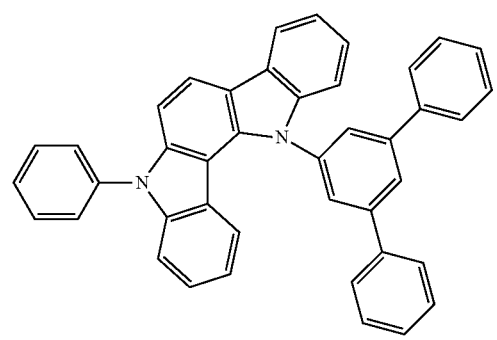
2-84
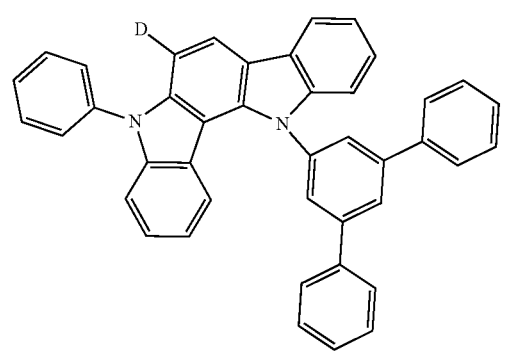
2-85
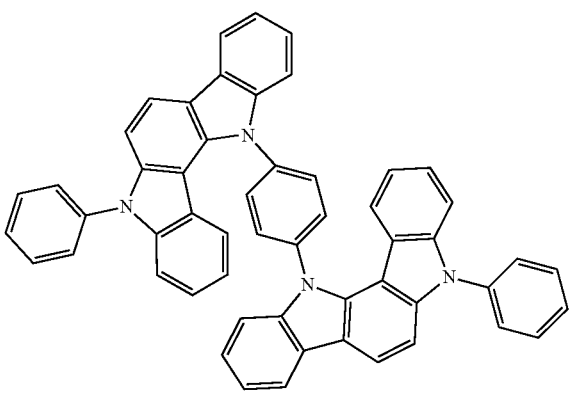
2-86
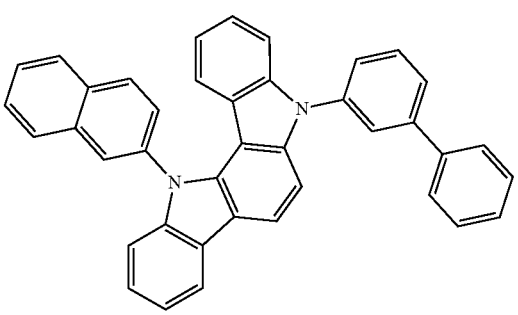
2-87
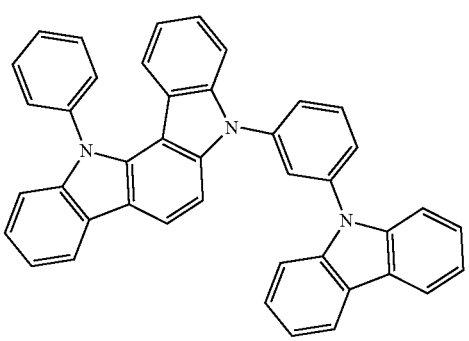
2-78
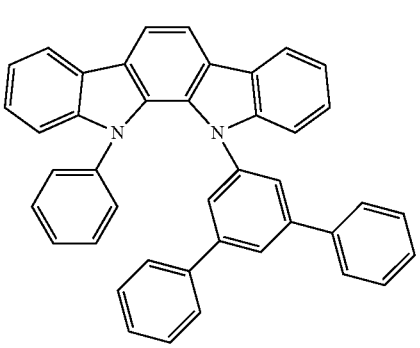

2-79
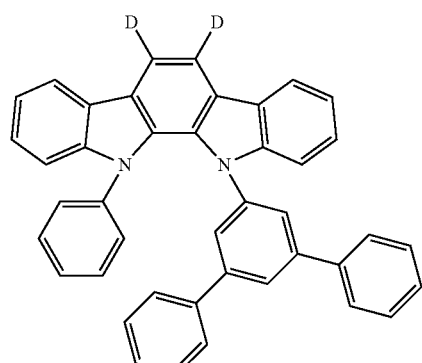
2-80
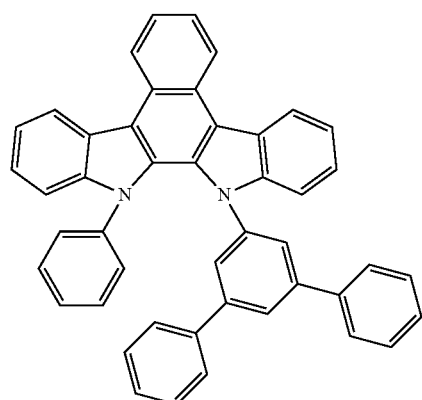
2-81
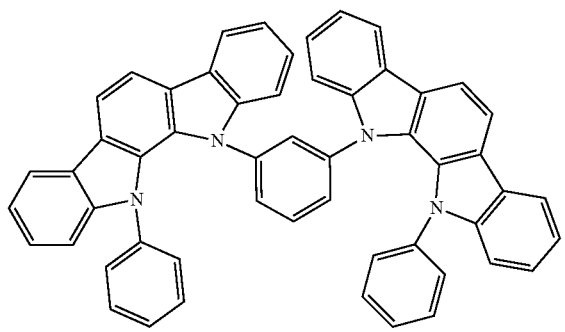
2-82
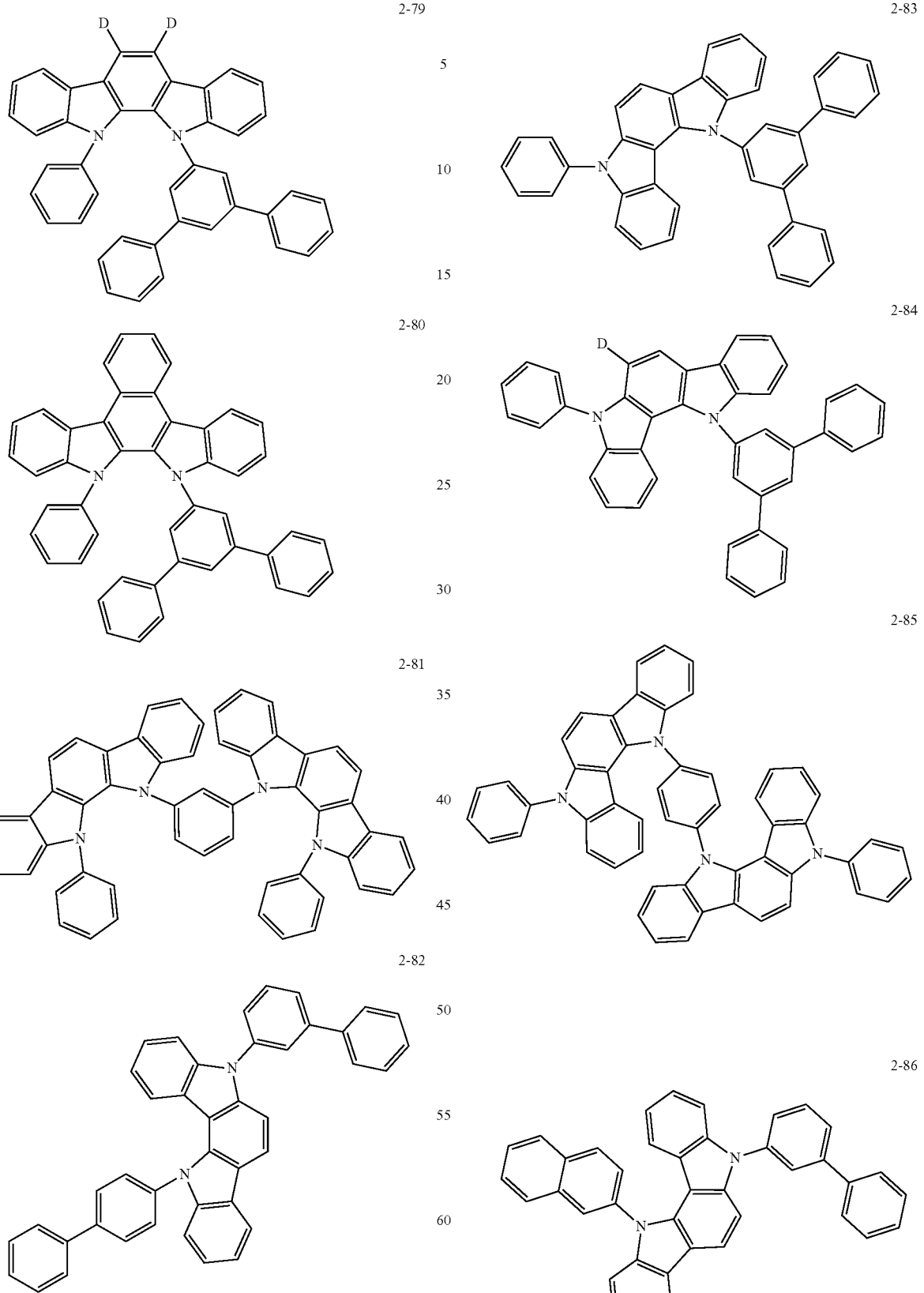
2-83
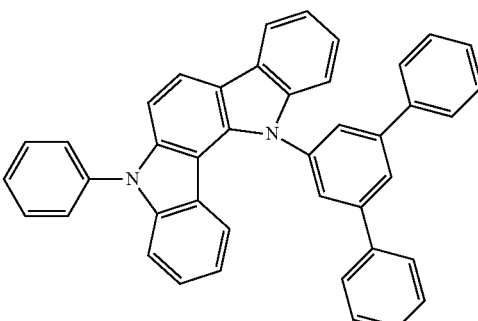
2-84
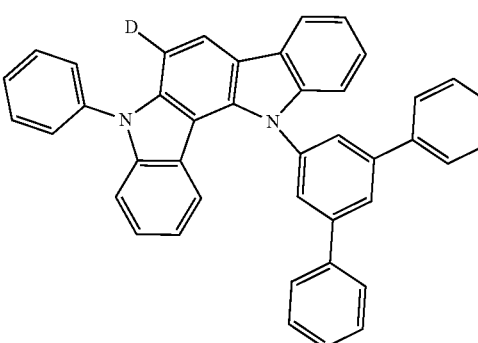
2-85
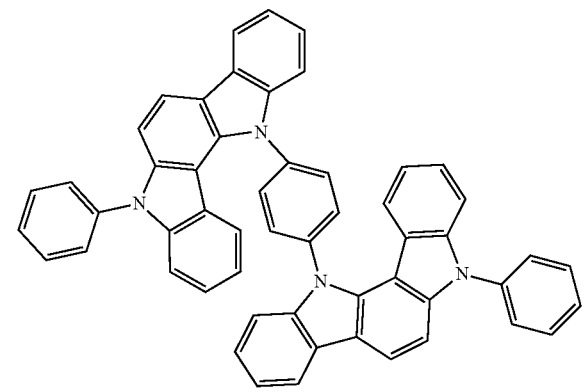
2-86
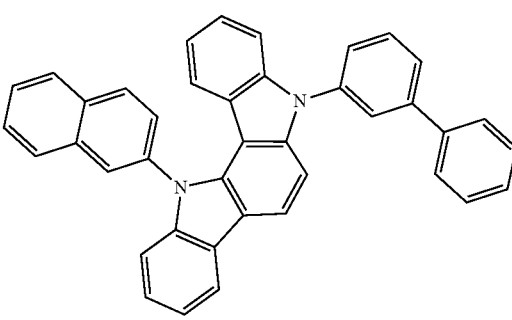

2-87
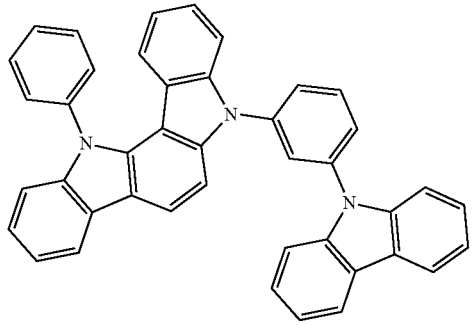
2-88
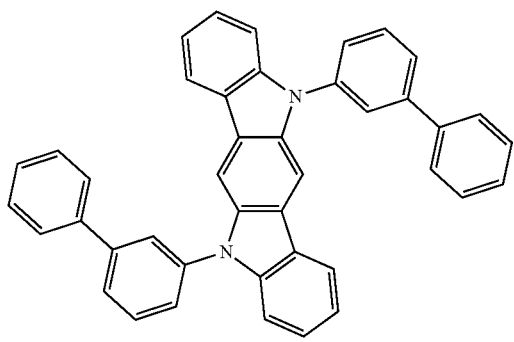
2-89
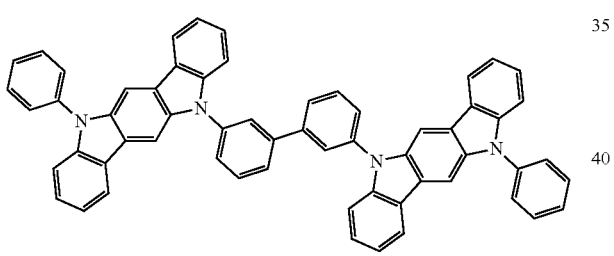
2-90
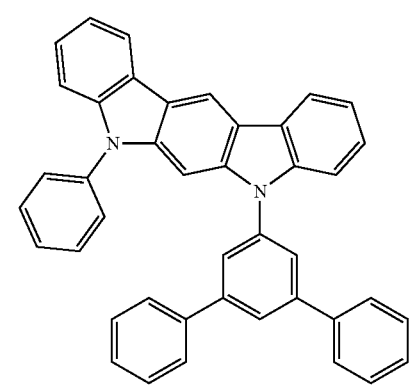
2-91
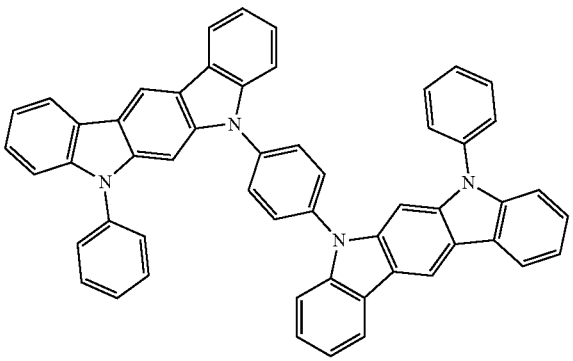
2-92
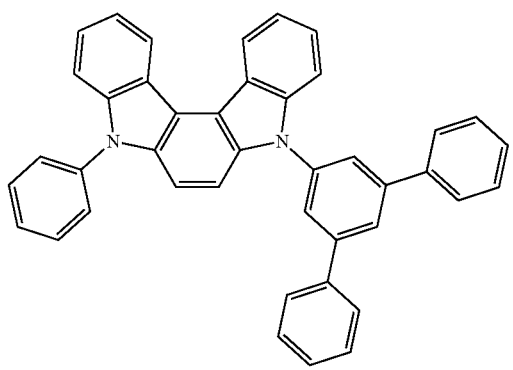
2-93
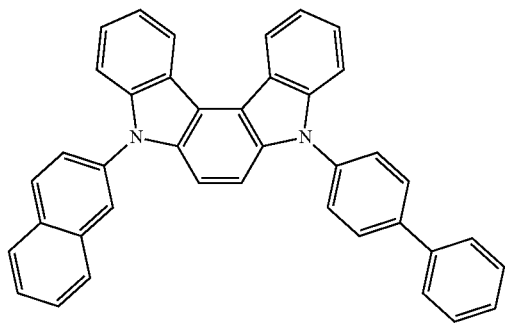
2-94
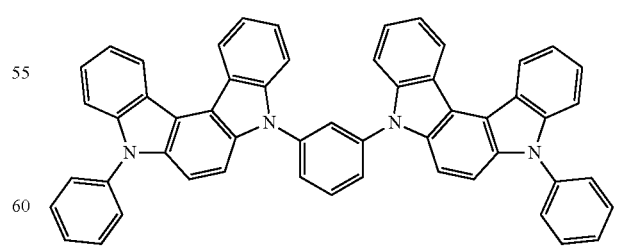

2-95
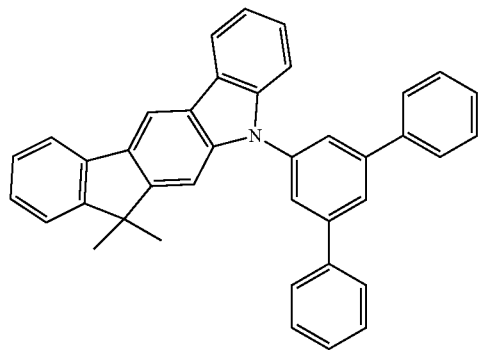
2-96
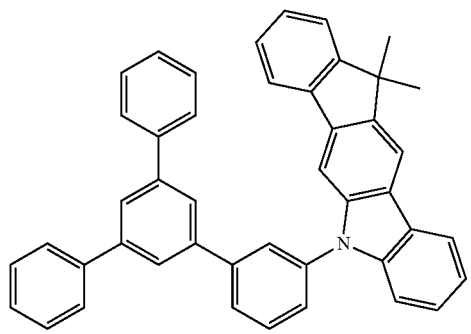
2-97
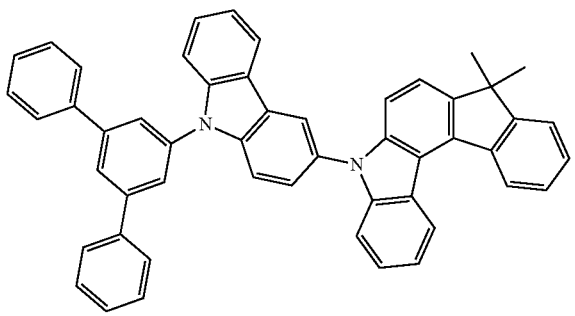
2-98
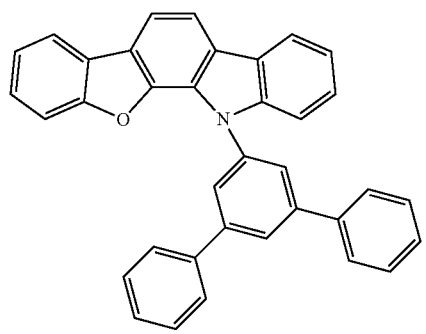
2-99
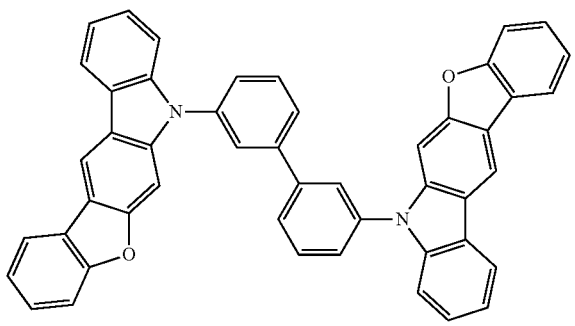
2-100
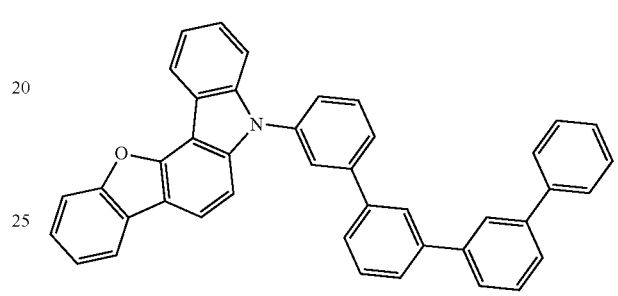
2-101
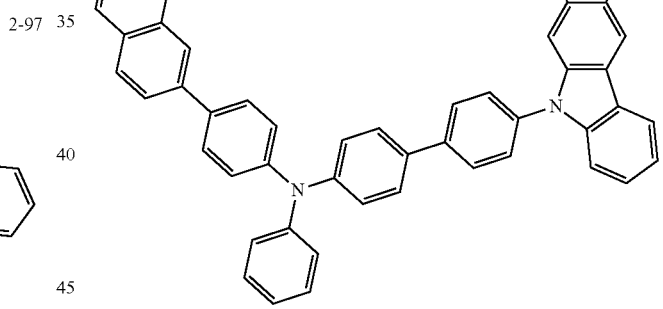
2-102
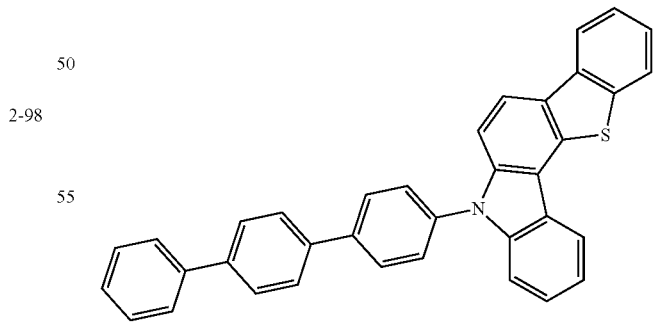

2-103
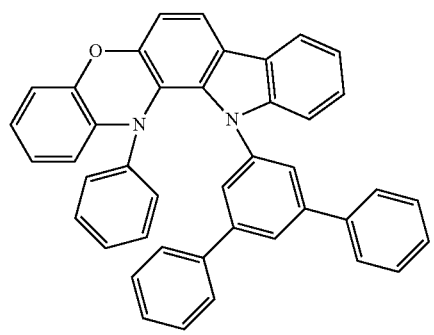
2-104
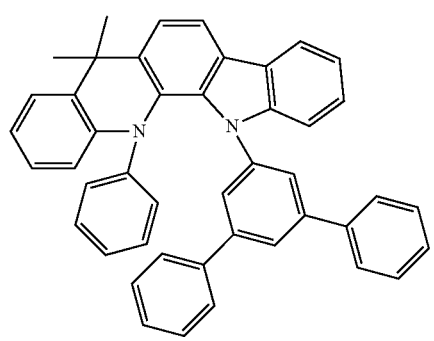
2-105
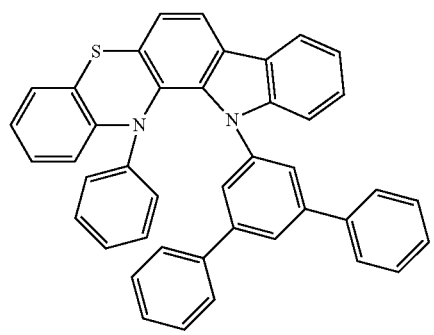
2-106
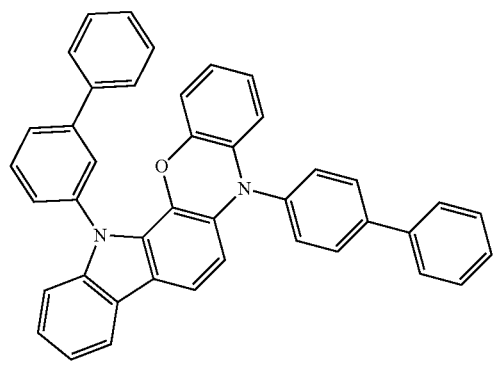
2-107
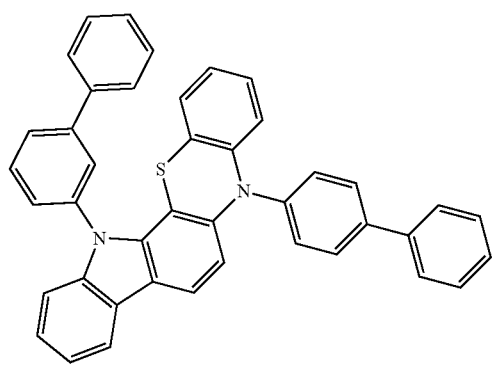
2-108
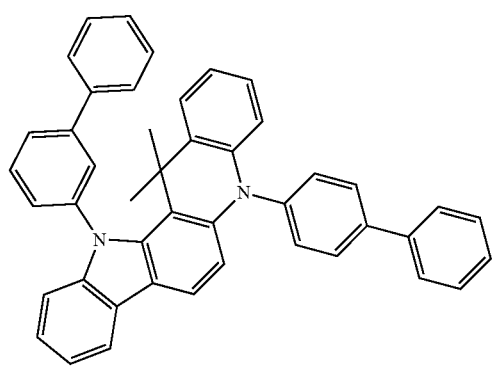
2-109
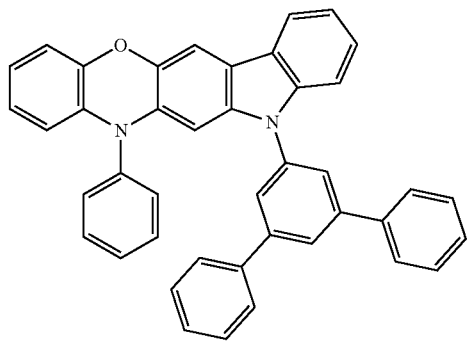
2-110
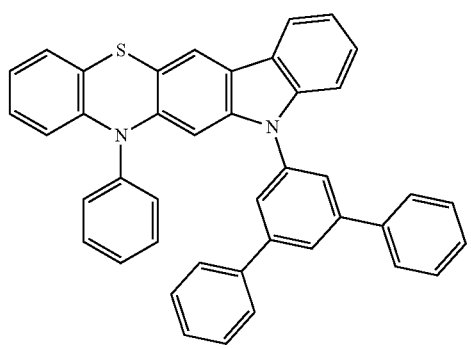

2-111

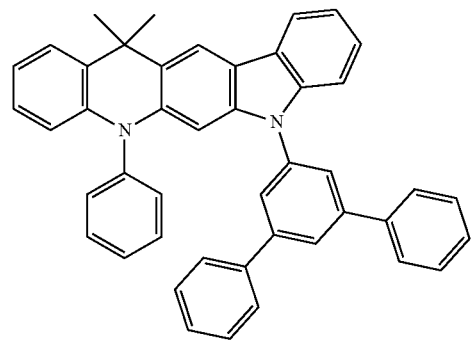

2-112

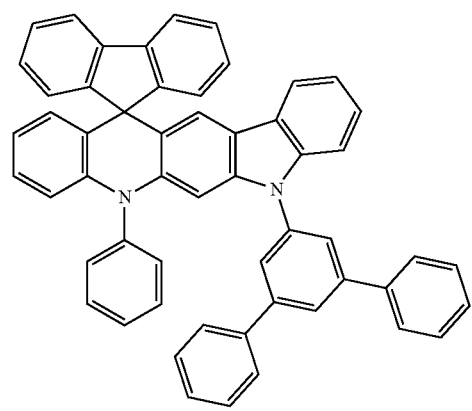

2-113

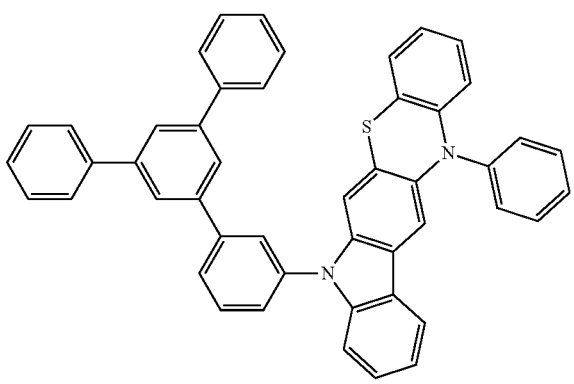

2-114

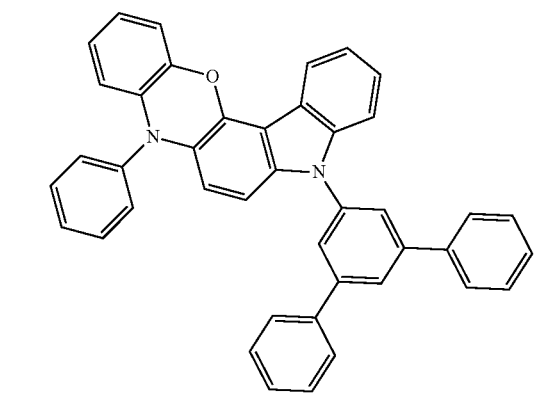

2-115

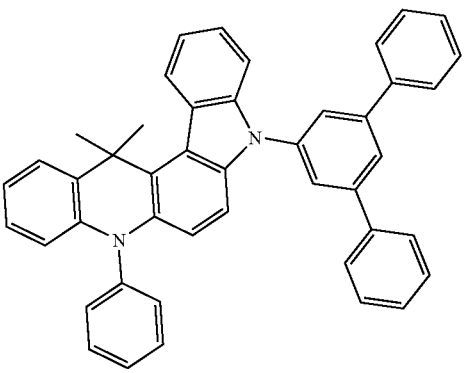

2-116

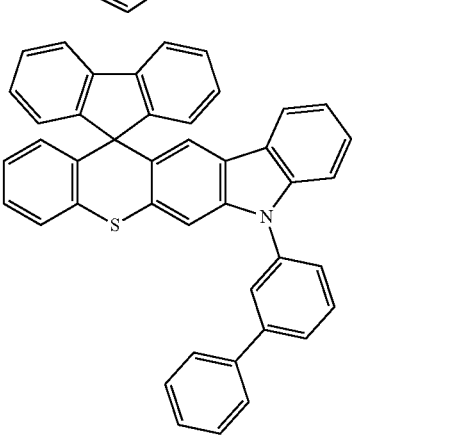

2-117

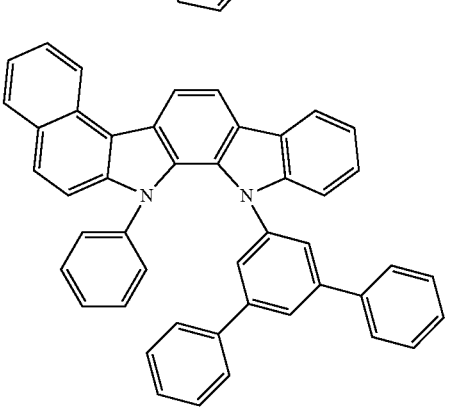

In some embodiments, in the mixture as described herein, at least one of the organic compound H1 or the organic compound H2, preferentially the organic compound H1 has ((LUMO+1)−LUMO)≥0.1 eV, more preferably ≥0.15 eV, even more preferably ≥0.20 eV, further preferably ≥0.25 eV, and most preferably ≥0.30 eV.

In some embodiments, in the mixture as described herein, at least one of the organic compound H1 or the organic compound H2, preferentially the organic compound H2 has (HOMO−(HOMO−1))≥0.2 eV, preferably ≥0.25 eV, more preferably ≥0.30 eV, further preferably ≥0.35 eV, and most preferably ≥0.40 eV.

In some embodiments, in the mixture as described herein, the organic compound H1 and the organic compound H2 form a type I heterojunction energy structure, i. e., the highest occupied molecular orbital (HOMO) of the organic compound H1 is higher than the HOMO of the organic compound H2, and the lowest unoccupied molecular orbital (LUMO) of the organic compound H1 is lower than the LUMO of the organic compound H2. Preferably, the organic compound H1 is an organic compound as described herein, and have $\Delta E_{st} \leq 0.3$ eV, preferably $\Delta E_{st} \leq 0.2$ eV, more preferably $\Delta E_{st} \leq 0.15$ eV, and most preferably $\Delta E_{st} \leq 0.10$ eV.

It is an object of the present disclosure to provide a material for the evaporation-based OLEDs.

In some embodiments, the mixture as described herein is used for evaporation-based OLEDs. For this purpose, the organic compound $H_1$ and the organic compound $H_2$ of the organic compound/mixture as described herein have a molecular weight $\leq 1000$ g/mol, preferably $\leq 900$ g/mol, more preferably $\leq 850$ g/mol, further preferably $\leq 800$ g/mol, and most preferably $\leq 700$ g/mol.

In some embodiments, in the mixture as described herein, the molecular weight difference between the organic compound $H_1$ and the organic compound $H_2 \leq 100$ Daltons, preferably $\leq 60$ Daltons, more preferably $\leq 30$ Daltons.

In some embodiments, in the mixture as described herein, the sublimation temperature difference between the organic compound $H_1$ and the organic compound $H_2 \leq 30$ K; preferably $\leq 20$ K; more preferably 10 K.

Another object of the present disclosure is to provide a material for the printed OLEDs.

For this purpose, at least one of, preferably both the organic compound $H_1$ and the organic compound $H_2$ of the organic compound/mixture as described herein have a molecular weight $\geq 700$ g/mol, preferably $\geq 800$ g/mol, more preferably $\geq 900$ g/mol, further preferably $\geq 1000$ g/mol, and most preferably $\geq 1100$ g/mol.

For the evaporation-based OLED, the co-host applied in the form of a Premix requires that the two host materials have similar chemical properties or physical properties, such as molecular weight and sublimation temperature. Meanwhile in solution-processed OLEDs, two host materials with different properties may improve film-forming performance, thereby improving the performance of the devices. The properties mentioned can be glass transition temperature, molecular volumes, etc., in addition to molecular weight, sublimation temperature. For printing OLEDs, further preferred embodiments of the organic mixture as described herein include:

1) The molecular weight difference between the organic compound $H_1$ and the organic compound $H_2 \geq 120$ g/mol, preferably $\geq 140$ g/mol, more preferably $\geq 160$ g/mol, and most preferably $\geq 180$ g/mol.
2) The sublimation temperature difference between the organic compound $H_1$ and the organic compound $H_2 \geq 60$ K, preferably $\geq 70$ K, more preferably $\geq 75$ K, and most preferably $\geq 80$ K.
3) The glass transition temperature difference between the organic compound $H_1$ and the organic compound $H_2 \geq 20$ K, preferably $\geq 30$ K, more preferably $\geq 40$ K, and most preferably $\geq 45$ K.
4) The molecular volume difference between the organic compound $H_1$ and the organic compound $H_2 \geq 20\%$, preferably $\geq 30\%$, more preferably $\geq 40\%$, and most preferably $\geq 45\%$.

In some embodiments, at least one of, preferably both the organic compound $H_1$ and the organic compound $H_2$ of the organic compound/mixture as described herein has a solubility of $\geq 2$ mg/mL in toluene at 25° C., preferably $\geq 3$ mg/mL, more preferably $\geq 4$ mg/mL, and most preferably $\geq 5$ mg/mL.

In some embodiments, at least one of, preferably, both the organic compound $H_1$ or the organic compound $H_2$ in the organic mixture as described herein has a solubility of $\geq 6$ mg/mL in toluene at 25° C., preferably $\geq 8$ mg/mL, more preferably $\geq 10$ mg/mL, and most preferably $\geq 15$ mg/mL.

In some embodiments, in the mixture as described herein, the molar ratio of the organic compound H1 and the organic compound H2 is from 2:8 to 8:2; the preferred molar ratio is from 3:7 to 7:3; the more preferred molar ratio is from 4:6 to 6:4.

The phosphorescent host material (triplet host), phosphorescent emitter (triplet emitter), TADF material, and HTM are described in detail below (but not limited thereto).

1. Triplet Host

Examples of triplet host material are not particularly limited and any metal complex or organic compound may be used as the host material as long as its triplet energy is greater than that of the light emitter, especially a triplet emitter or phosphorescent emitter. Examples of metal complexes that may be used as triplet hosts may include, but are not limited to, the general structure as follows:

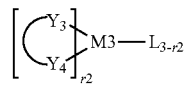

Where M3 is a metal; $(Y_3-Y_4)$ is a bidentate ligand, $Y_3$ and $Y_4$ are independently selected from C, N, O, P, or S; L is an auxiliary ligand; r2 is an integer with the value from 1 to the maximum coordination number of the metal.

In some embodiments, the metal complex which may be used as the triplet host have the following form:

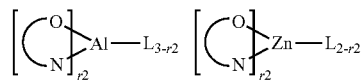

(O—N) is a bidentate ligand in which the metal is coordinated to O and N atoms, r2 is an integer with the value from 1 to the maximum coordination number of the metal.

In some embodiments, M3 may be selected from Ir and Pt.

Examples of organic compounds used as triplet hosts are selected from: compounds comprising cyclic aryl groups, such as benzene, biphenyl, triphenyl, benzofluorene; compounds comprising heterocyclic aryl groups, such as dibenzothiophene, dibenzofuran, dibenzoselenophene, furan, thiophene, benzofuran, benzothiophene, benzoselenophene, carbazole, dibenzocarbazole, indocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, oxazole, dibenzooxazole, benzisoxazole, benzothiazole, quinoline, isoquinoline, o-diazonaphthalene, quinazoline, quinoxaline, naphthalene, phthalein, pteridine, xanthene, acridine, phenazine, phenothiazine, phenoxazine, dibenzoselenophene, benzofuranopyridine, furazopyridine, benzothienopyridine, thienodipyridine, benzoselenophenopyridine, and selenophenodipyridine; and groups comprising 2 to 10 ring structures which may be the same or different types of cyclic aryl or aromatic heterocyclic group and are bonded to each other directly or through at least one of the following groups: oxygen atom, nitrogen atom, sulfur atom, silicon atom, phosphorus atom, boron atom, chain structural unit, and aliphatic cyclic group; and where each Ar may be further optionally substituted, and the substituents may optionally be hydrogen, deuterium, cyano, halogen, alkyl, alkoxy, amino, alkene, alkyne, aralkyl, heteroalkyl, aryl and heteroaryl.
In some embodiments, the triplet host material may be selected from the compounds comprising at least one of the following groups:
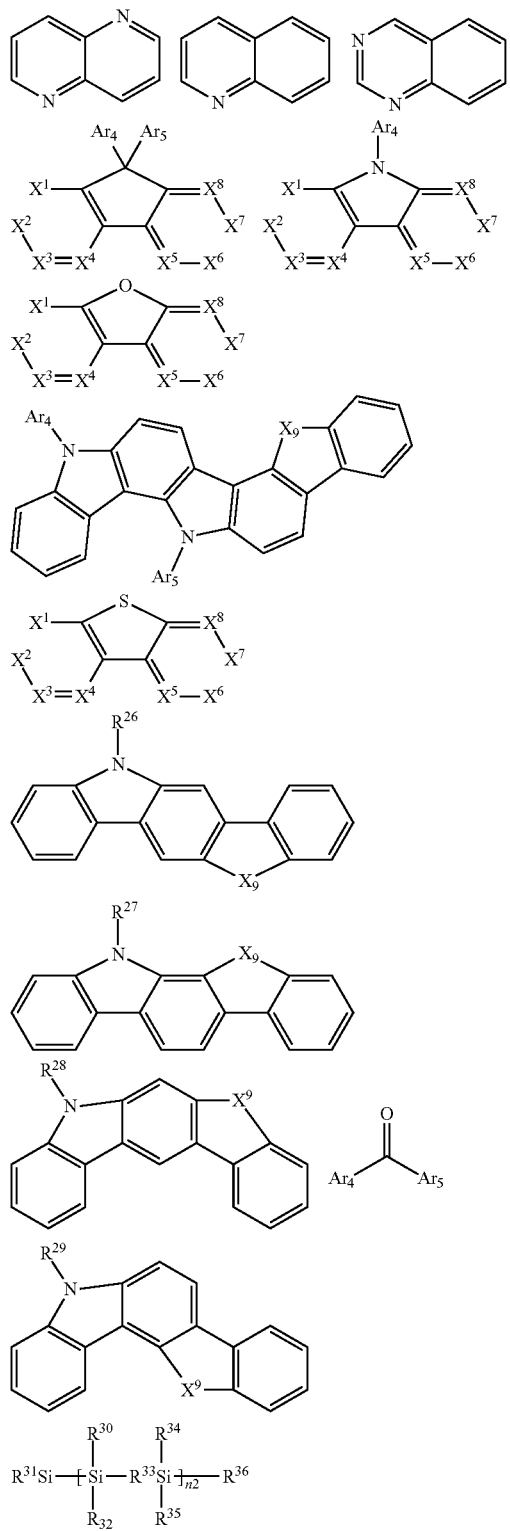
-continued
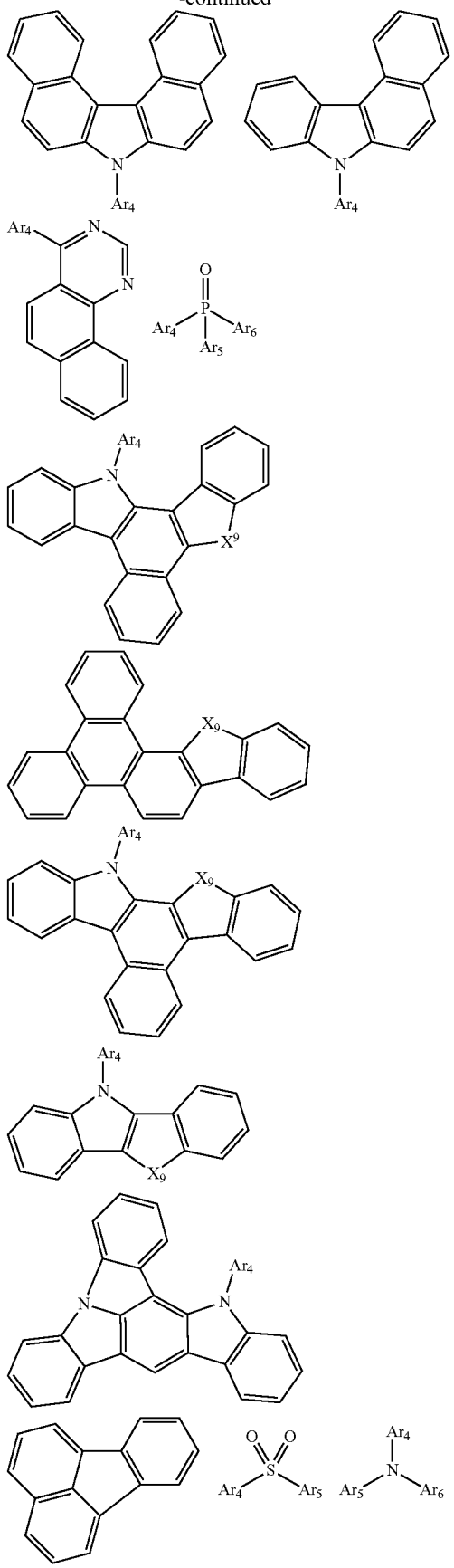

-continued
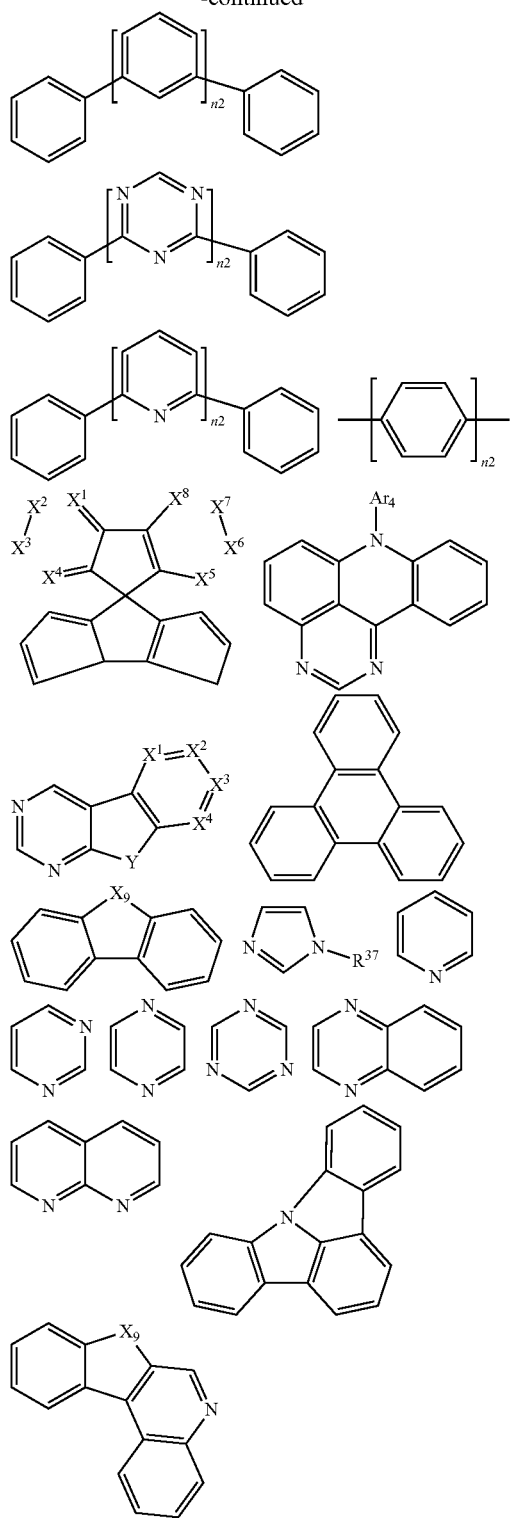
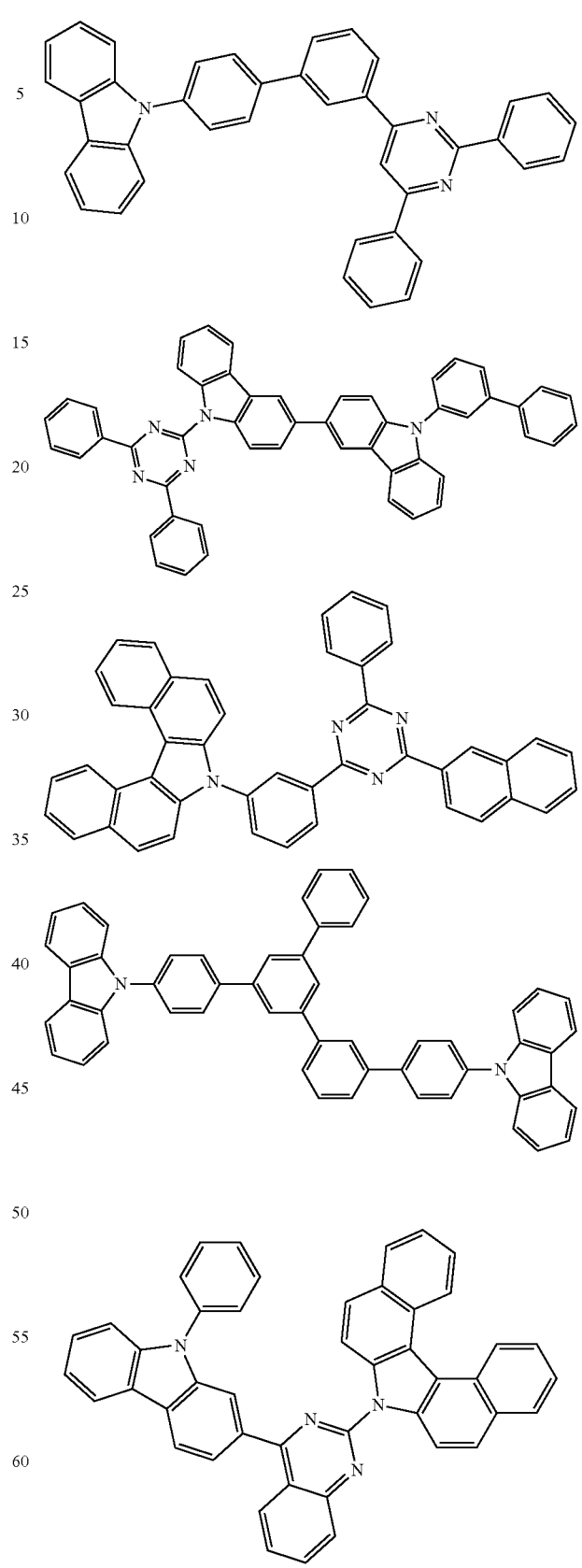
$X_9$ is $CR^{38}R^{39}$ or $NR^{40}$; Y is $CR^{41}R^{42}$, $NR^{43}$, O, or S; $R^{26}$ to $R^{43}$ are identically defined as the above-mentioned $R_1$; n2 is an integer from 1 to 3; $X_1$ to $X_8$ are identically defined as described above; $Ar_4$ to $Ar_6$ are identically defined as the above-mentioned $Ar_1$.
Examples of suitable triplet host materials are listed below, but not limited to:

97
-continued
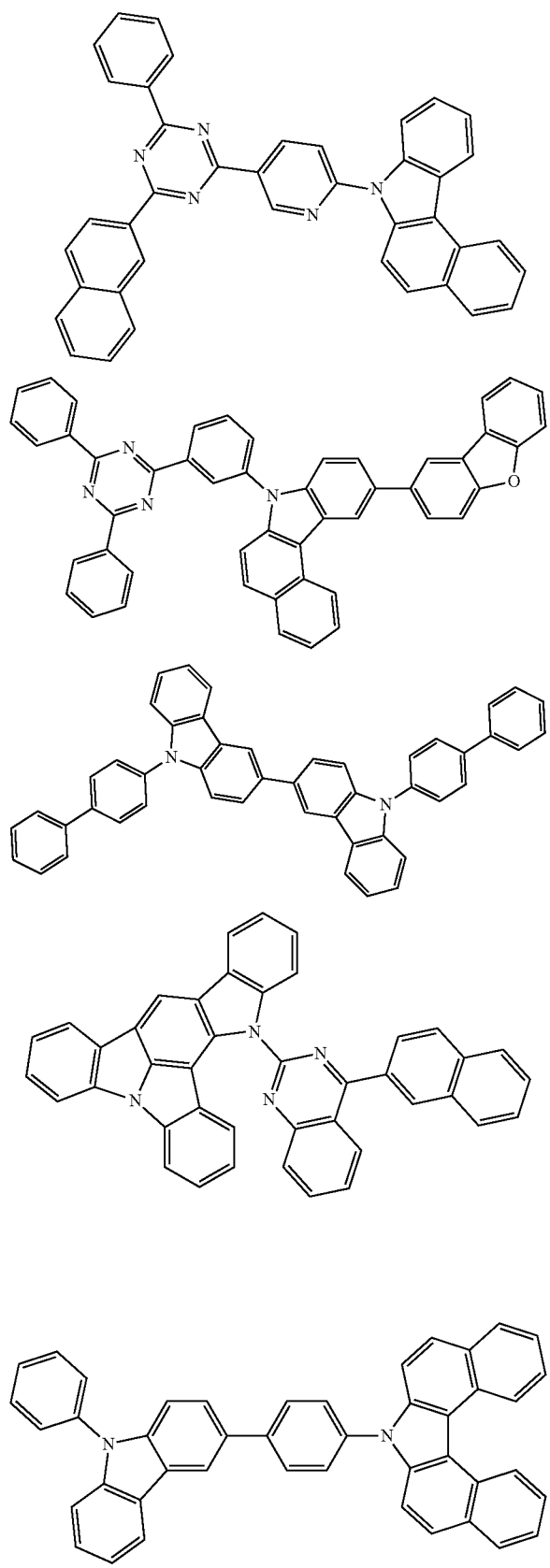
98
-continued
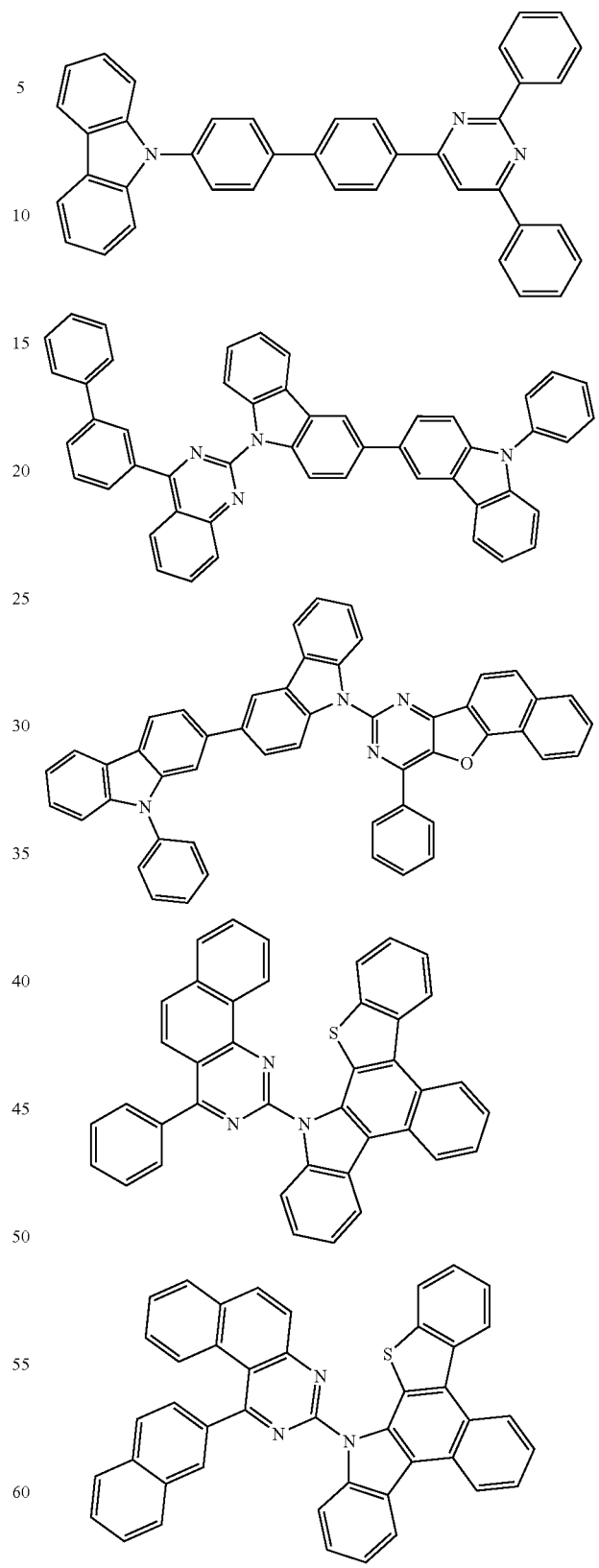

99
-continued
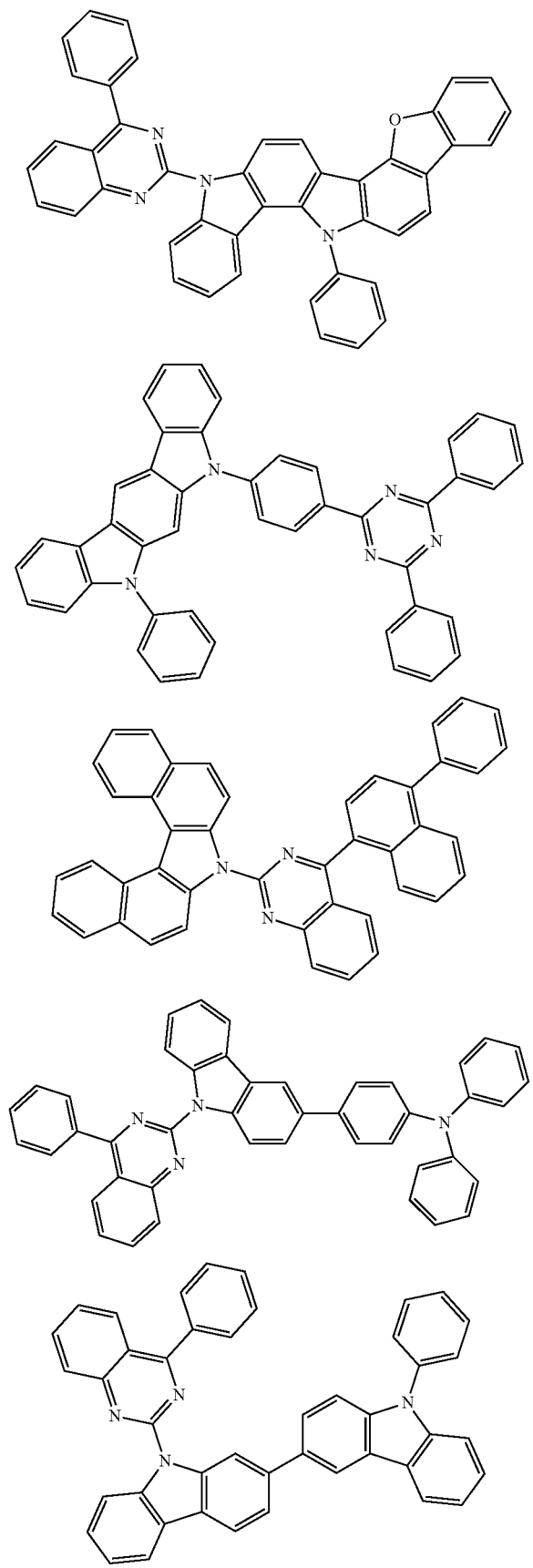
100
-continued
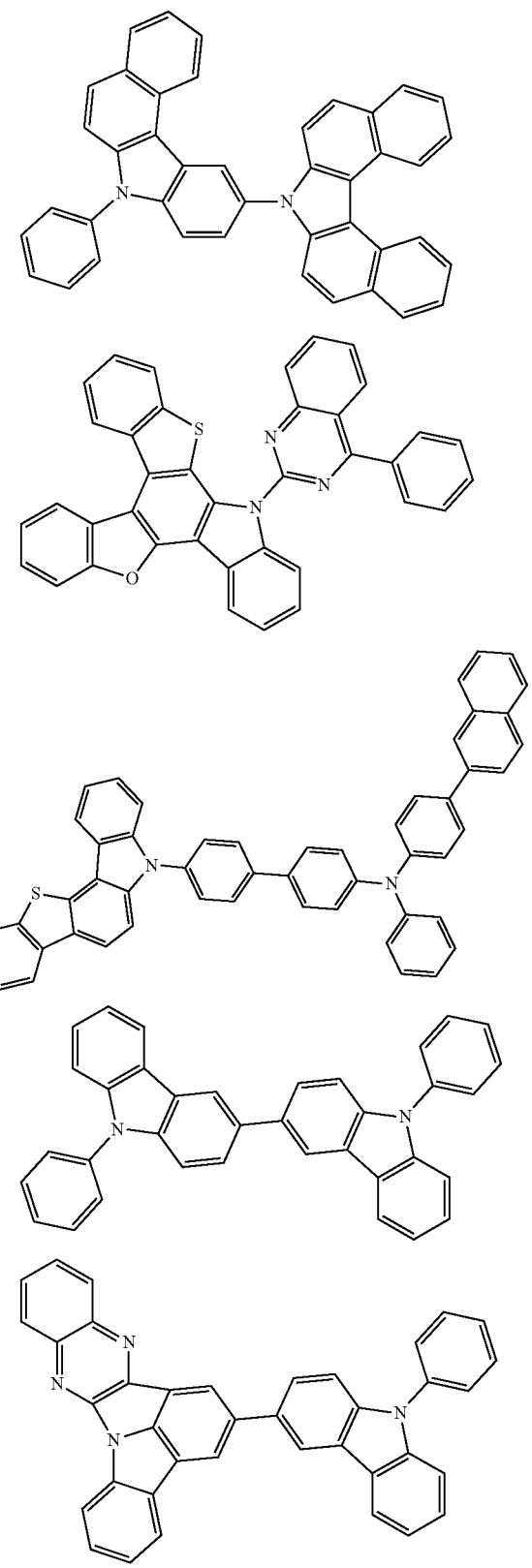

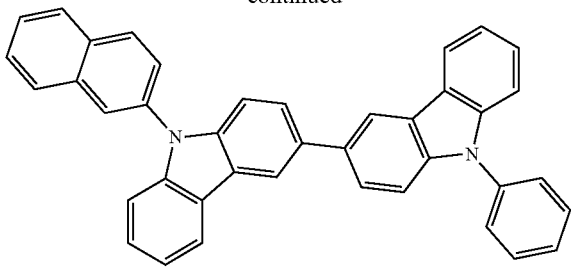

2. Triplet Emitter

The triplet emitter is also called a phosphorescent emitter. In some embodiments, the triplet emitter is a metal complex of formula $M(L)_n$, where M may be a metal atom; L may be a same or different organic ligand each time it is present, and may be bonded or coordinated to the metal atom M at one or more positions; n is an integer greater than 1, preferably is 1, 2, 3, 4, 5, or 6. Alternatively, these metal complexes may be attached to a polymer by one or more positions, most preferably through an organic ligand.

In some embodiments, the metal atom M may be selected from the group consisting of transition metal elements or lanthanides or actinides, preferably Ir, Pt, Pd, Au, Rh, Ru, Os, Sm, Eu, Gd, Tb, Dy, Re, Cu, or Ag, and particularly preferably Os, Ir, Ru, Rh, Re, Pd, Au, or Pt.

Preferably, the triplet emitter comprises a chelating ligand (i.e., a ligand) coordinating to the metal by at least two bonding sites, and it is particularly preferred that the triplet emitter comprises two or three identical or different bidentate or multidentate ligand. Chelating ligands help to improve stability of metal complexes.

Examples of organic ligands may be selected from the group consisting of phenylpyridine derivatives, 7,8-benzoquinoline derivatives, 2 (2-thienyl) pyridine derivatives, 2 (1-naphthyl) pyridine derivatives, or 2 phenylquinoline derivatives. All of these organic ligands may be substituted, for example, substituted with fluoromethyl or trifluoromethyl. The auxiliary ligand may be preferably selected from acetylacetonate or picric acid.

In some embodiments, the metal complex which may be used as the triplet emitter may have the following form:

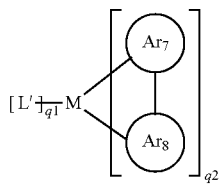

Where M is a metal selected from the group consisting of transition metal elements or lanthanides or actinides, and particularly preferably Ir, Pt, Au.

$Ar_7$ may be the same or different cyclic group each time it is present, which comprises a donor atom, that is an atom with a lone pair of electrons, such as nitrogen atom or phosphorus atom, which is coordinated to the metal through its ring group; $Ar_8$ may be the same or different cyclic group comprising a C atom and is coordinated to the metal through its ring group; $Ar_7$ and $Ar_8$ are covalently bonded together, where each of them may carry one or more substituents which may also be joined together by substituents; L' may be the same or different at each occurrence and is a bidentate chelating ligand, and most preferably a monoanionic bidentate chelating ligand; q1 is 1, 2 or 3, preferably 2 or 3; q2 is 0, 1, 2, or 3, and preferably 0 or 1.

Examples of triplet emitter materials that are extremely useful may be found in the following patent documents and references: WO200070655, WO200141512, WO200202714, WO200215645, EP1191613, EP1191612, EP1191614, WO2005033244, WO2005019373, US20050258742, WO2009146770, WO2010015307, WO2010031485, WO2010054731, WO2010054728, WO2010086089, WO2010099852, WO2010102709, US20070087219A1, US20090061681A1, US20010053462A1, Baldo, Thompson et al. Nature 403, (2000), 750-753, Adachi et al. Appl. Phys. Lett. 78 (2001), 1622-1624, J. Kido et al. Appl. Phys. Lett. 65 (1994), 2124, Kido et al. Chem. Lett. 657, 1990, US20070252517A1, Johnson et al., JACS 105, 1983, 1795, Wrighton, JACS 96, 1974, 998, Ma et al., Synth. Metals 94, 1998, 245, US6824895, US7029766, US6835469, US6830828, US20010053462A1, WO2007095118A1, US2012004407A1, WO2012007088A1, WO2012007087A1, WO2012007086A1, US2008027220A1, WO2011157339A1, CN102282150A, WO2009118087A1, WO2013107487A1, WO2013094620A1, WO2013174471A1, WO2014031977A1, WO2014112450A1, WO2014007565A1, WO2014038456A1, WO2014024131A1, WO2014008982A1, WO201402337A1. The patent documents listed above are specially incorporated herein by reference in their entirety.

Examples of some suitable triplet emitters are listed below:

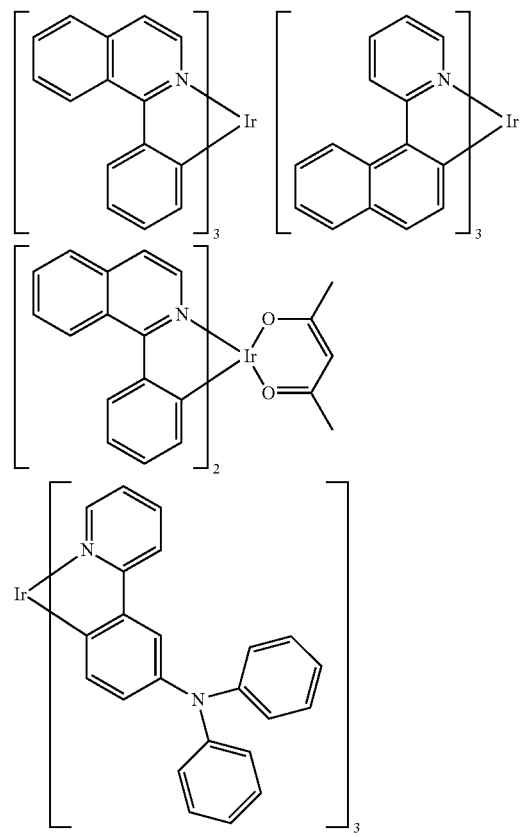

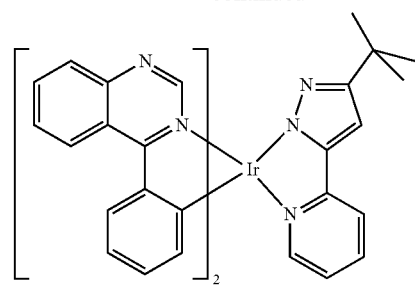
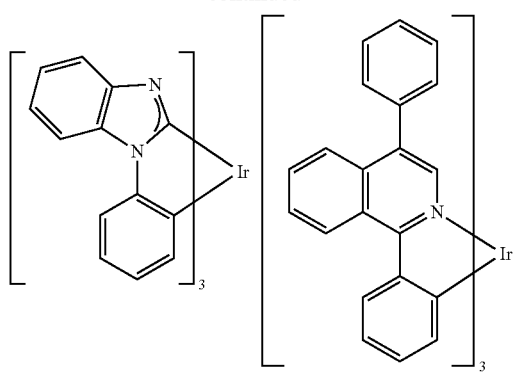
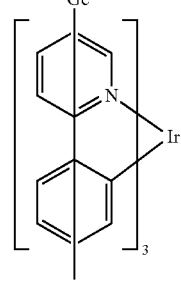
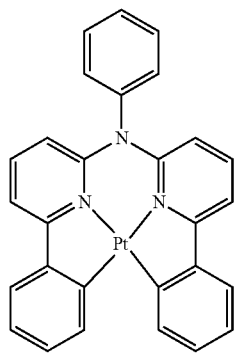
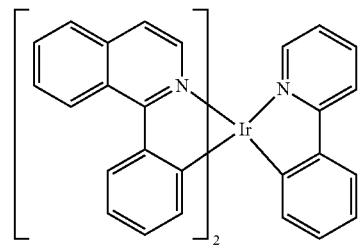
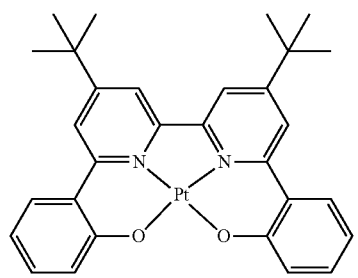
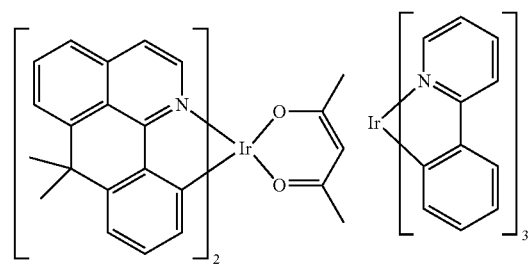
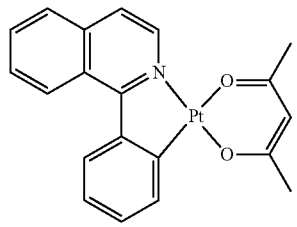
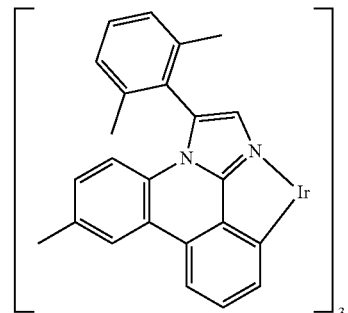
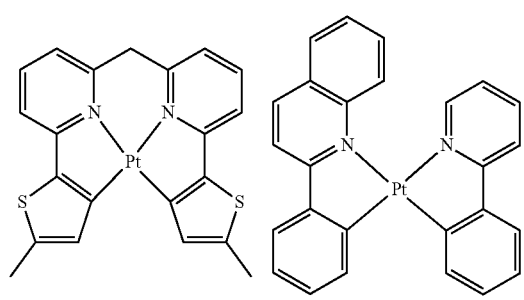
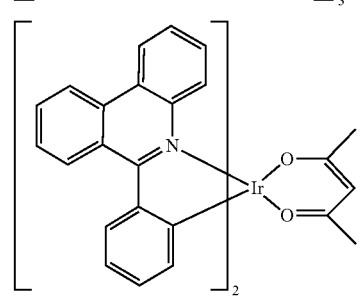

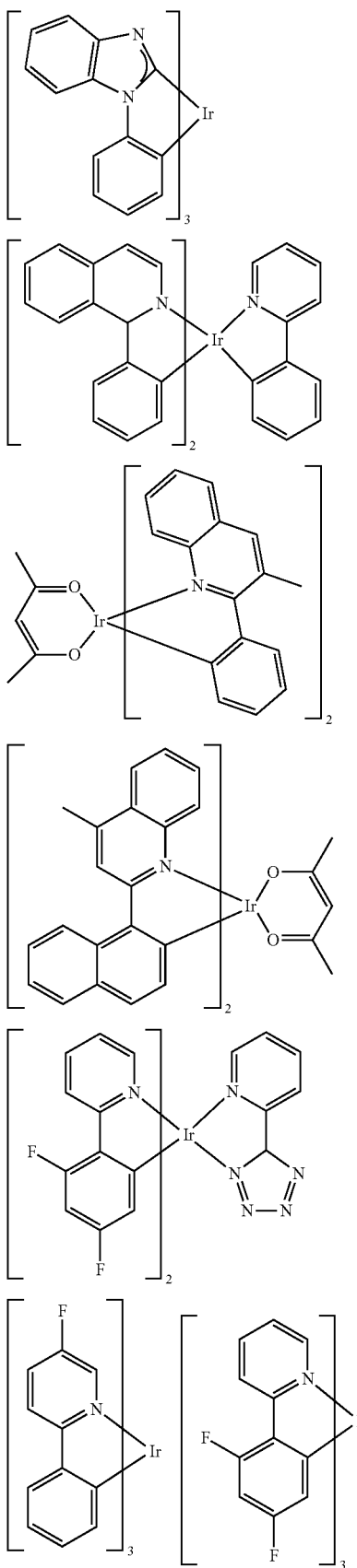
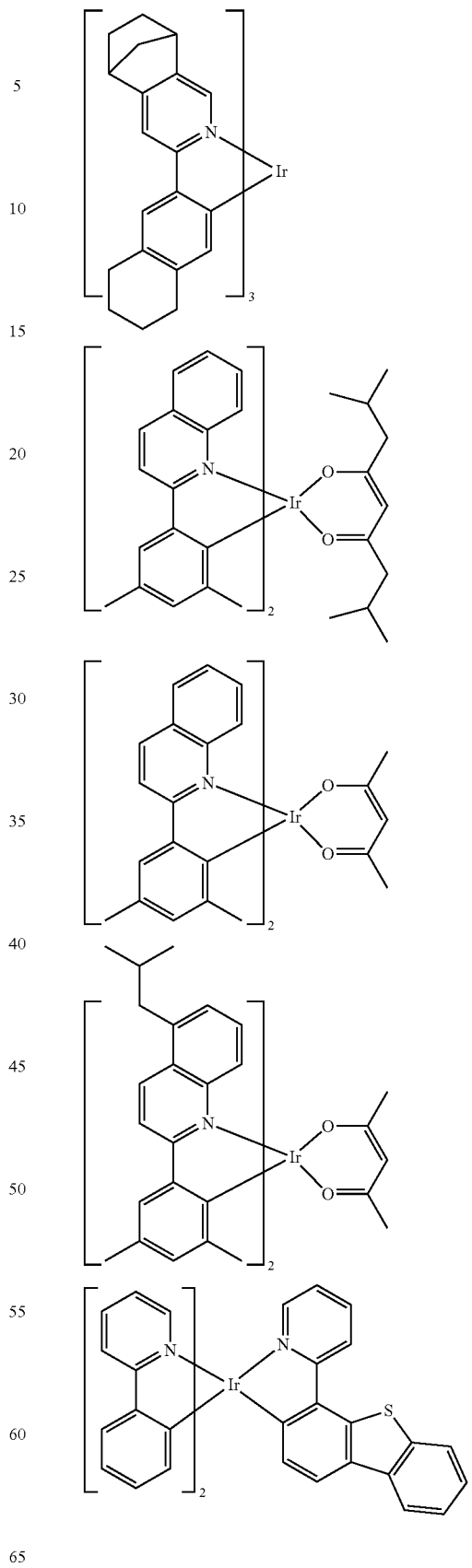

107
-continued
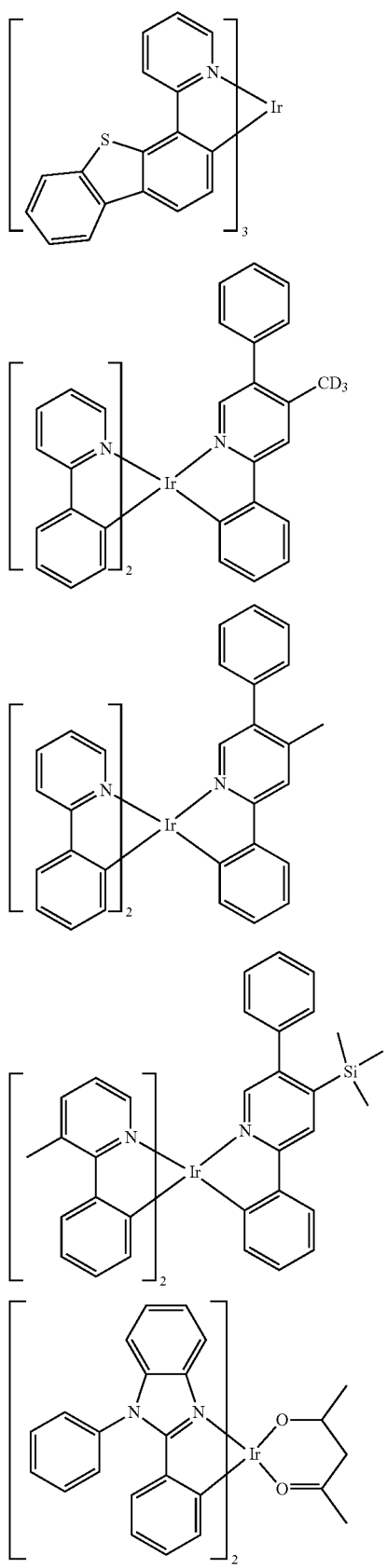
108
-continued
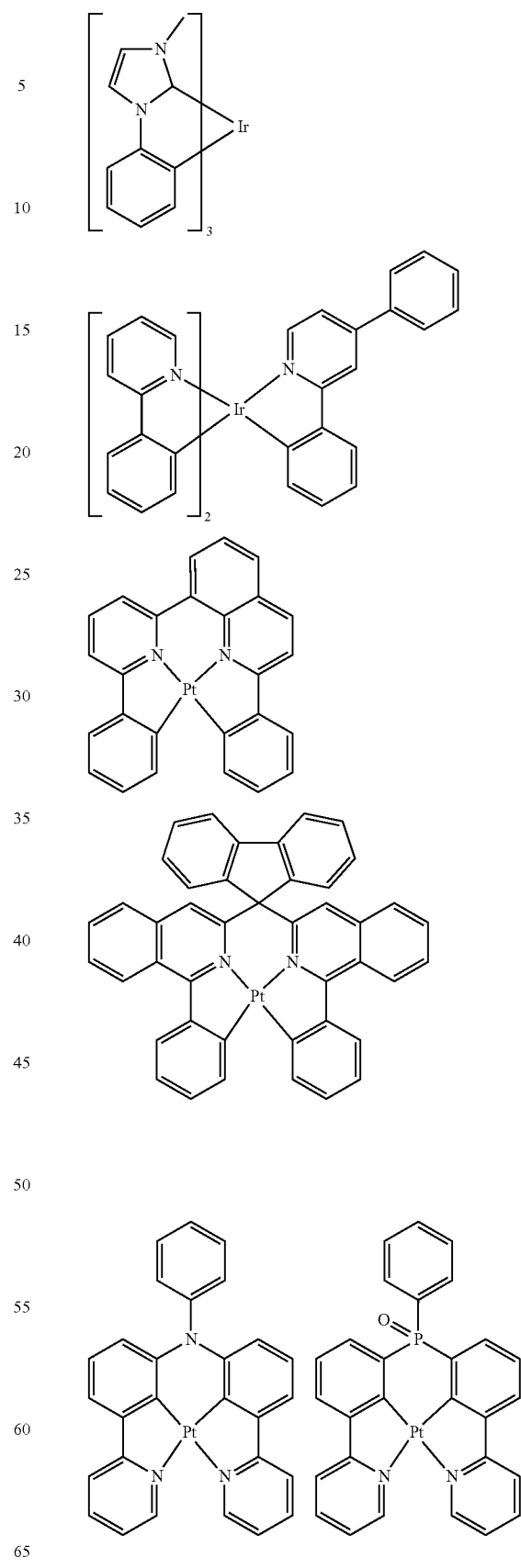

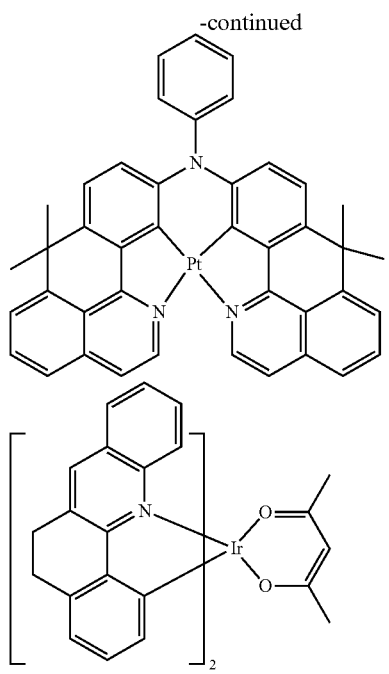

3. TADF Material

Conventional organic fluorescent materials can only emit light using 25% singlet excitonic luminescence formed by electrical excitation, and the devices have relatively low internal quantum efficiency (up to 25%). The phosphorescent material enhances the intersystem crossing due to the strong spin-orbit coupling of the heavy atom center, the singlet exciton and the triplet exciton luminescence formed by the electric excitation can be effectively utilized, so that the internal quantum efficiency of the device can reach 100%. However, the phosphorescent materials are expensive, the material stability is poor, and the device efficiency roll-off is a serious problem, which limit its application in OLED. Thermally-activated delayed fluorescent (TADF) materials are the third generation of organic emitting materials developed after organic fluorescent materials and organic phosphorescent materials. This type of material generally has a small singlet-triplet energy level difference (ΔEst), and triplet excitons can be converted to singlet excitons by intersystem crossing. This can make full use of the singlet excitons and triplet excitons formed under electric excitation. The device can achieve 100% internal quantum efficiency. Meanwhile, due to the controllable structure, stable property, low cost, TADF materials without precious metals have a wide application prospect in the OLED field.

The TADF material needs to have a small singlet-triplet energy level difference, preferably ΔEst<0.3 eV, more preferably ΔEst<0.2 eV, and most preferably ΔEst<0.1 eV. In some embodiments, the TADF material has a relatively small ΔEst. In some embodiments, the TADF has a high fluorescence quantum efficiency. Some TADF materials can be found in the following patent documents: CN103483332A, TW201309696A, TW201309778A, TW201343874A, TW201350558A, US20120217869A1, WO2013133359A1, WO2013154064A1, Adachi, et. al. Adv. Mater., 21, 2009, 4802, Adachi, et. al. Appl. Phys. Lett., 98, 2011, 083302, Adachi, et. al. Appl. Phys. Lett., 101, 2012, 093306, Adachi, et. al. Chem. Commun., 48, 2012, 11392, Adachi, et. al. Nature Photonics, 6, 2012, 253, Adachi, et. al. Nature, 492, 2012, 234, Adachi, et. al. J. Am. Chem. Soc, 134, 2012, 14706, Adachi, et. al. Angew. Chem. Int. Ed, 51, 2012, 11311, Adachi, et. al. Chem. Commun., 48, 2012, 9580, Adachi, et. al. Chem. Commun., 48, 2013, 10385, Adachi, et. al. Adv. Mater., 25, 2013, 3319, Adachi, et. al. Adv. Mater., 25, 2013, 3707, Adachi, et. al. Chem. Mater., 25, 2013, 3038, Adachi, et. al. Chem. Mater., 25, 2013, 3766, Adachi, et. al. J. Mater. Chem. C., 1, 2013, 4599, Adachi, et. al. J. Phys. Chem. A., 117, 2013, 5607. The entire contents of the above listed patents or literature documents are hereby incorporated by reference.

Examples of some suitable TADF materials are listed below:

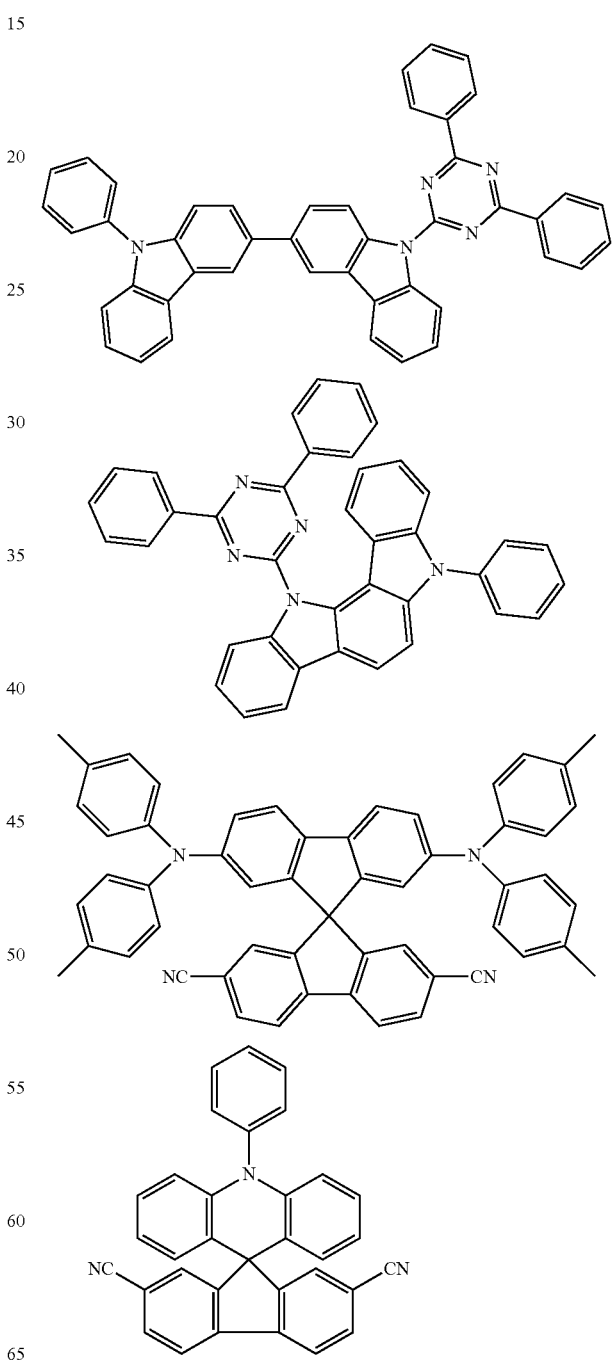

111
-continued
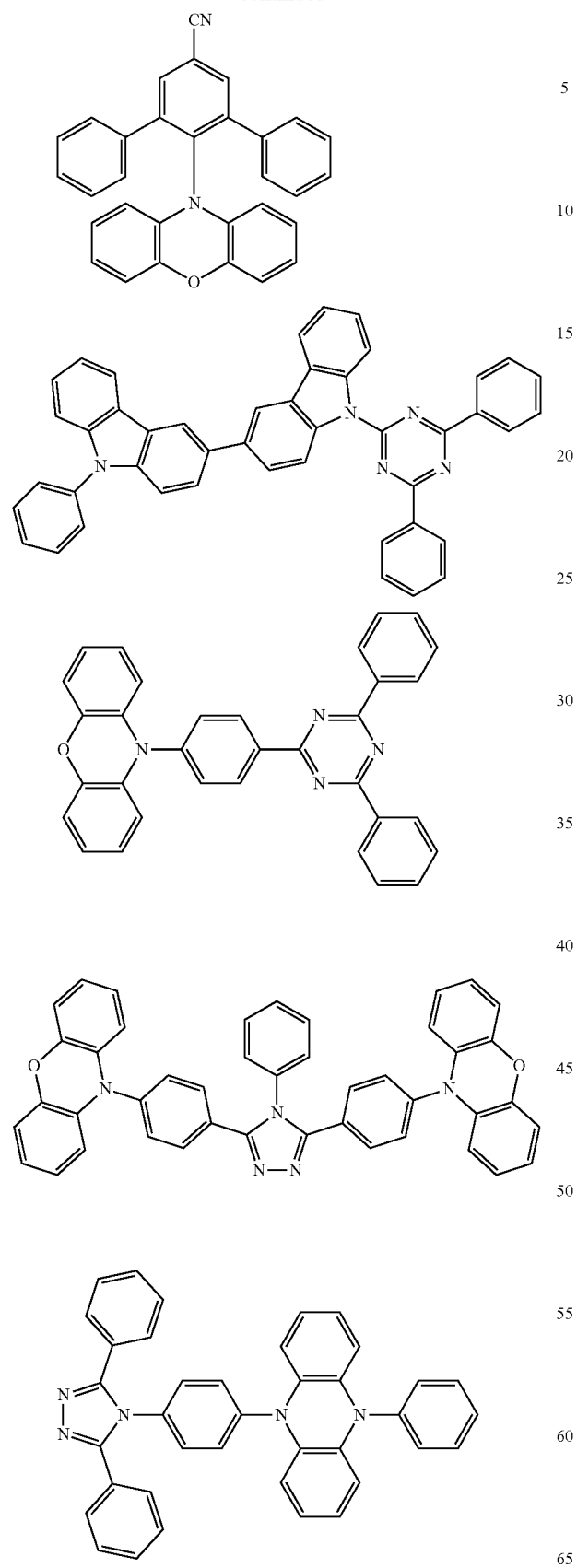
112
-continued
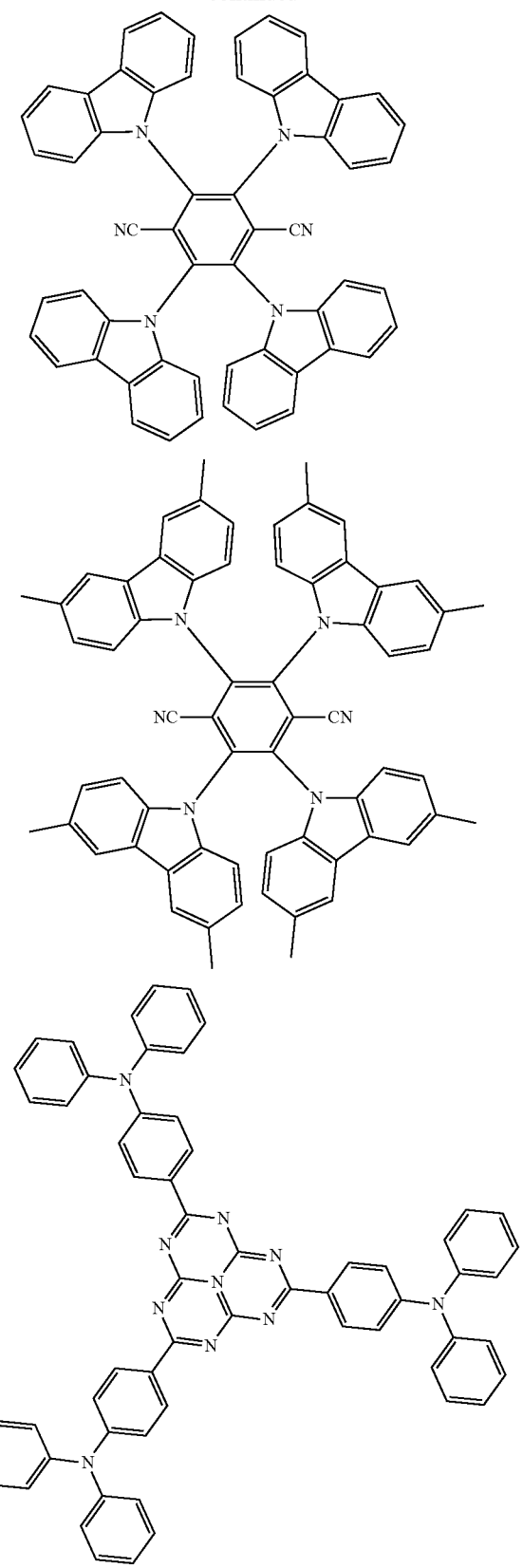

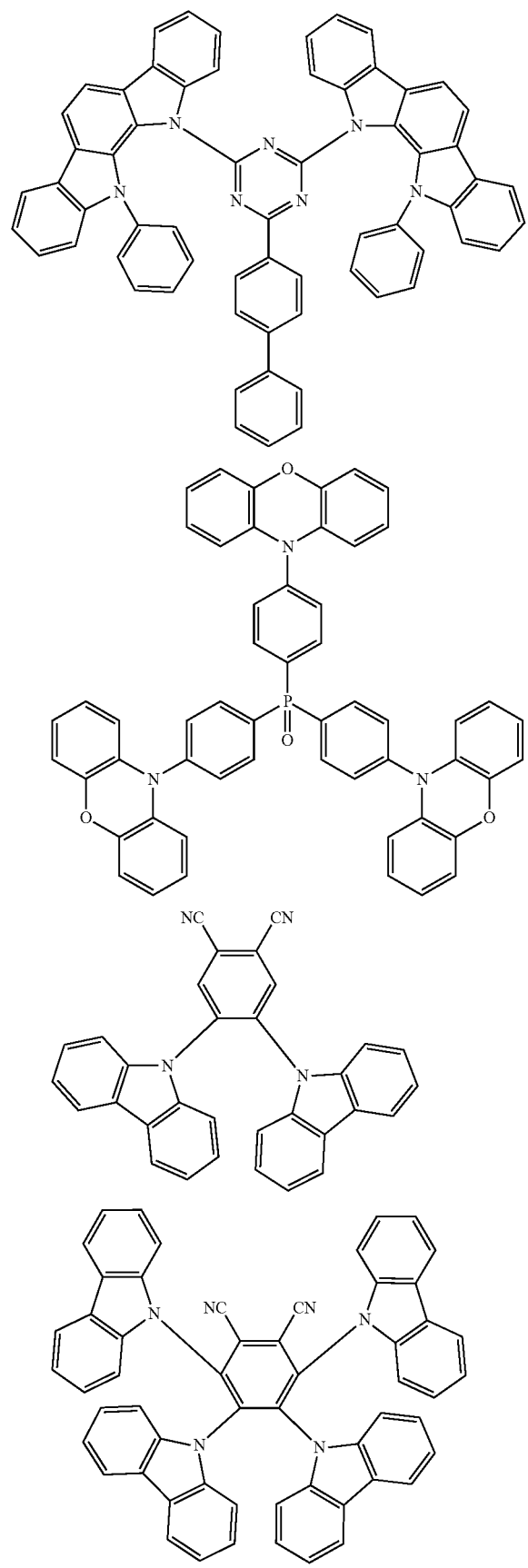
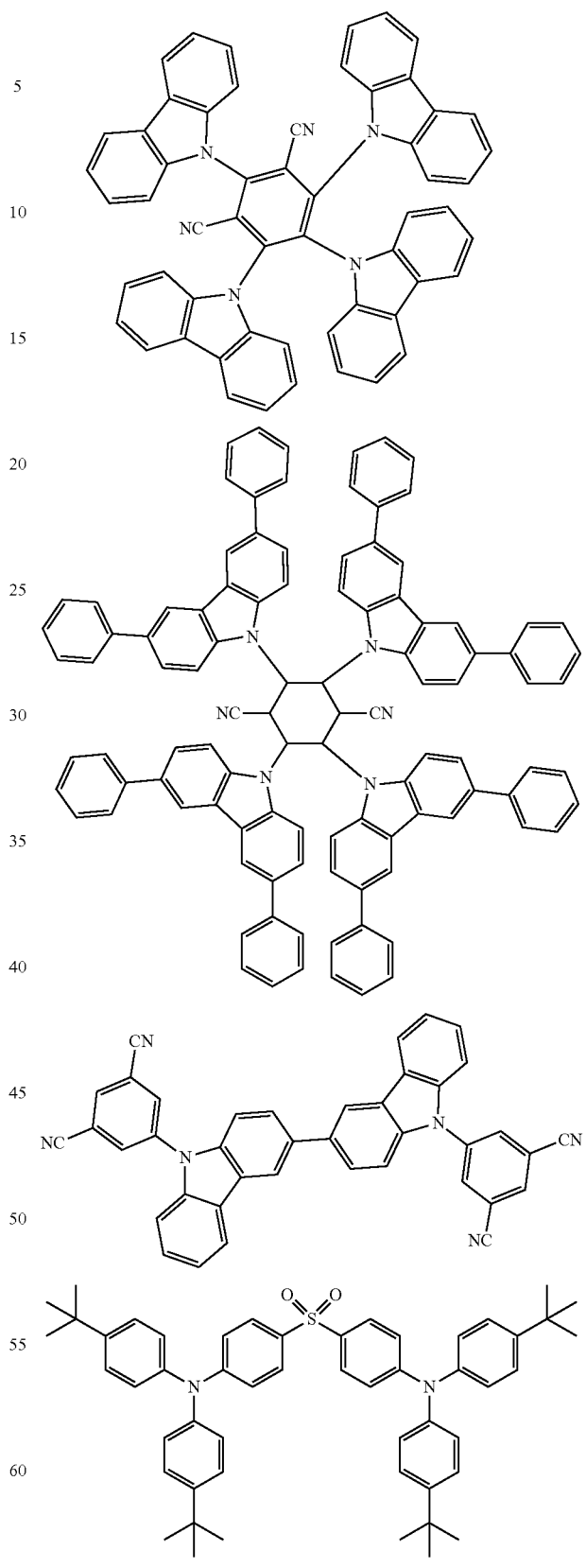

115
-continued
116
-continued
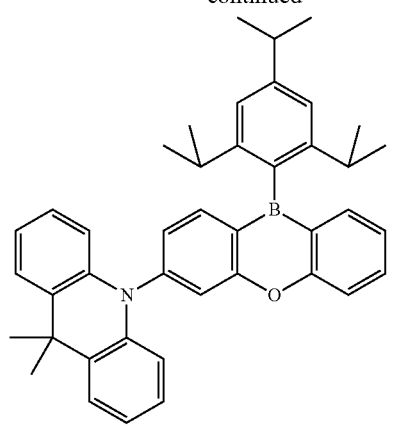
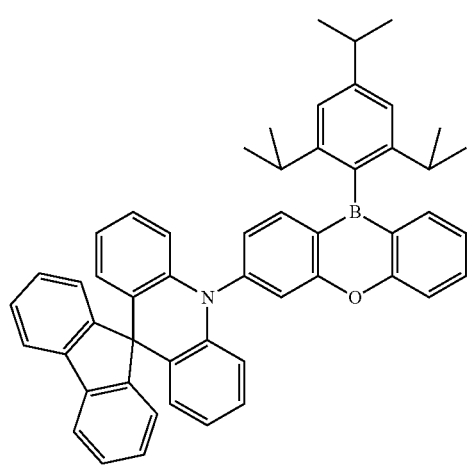
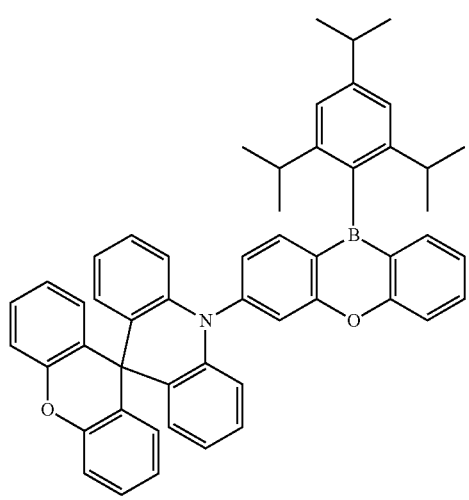
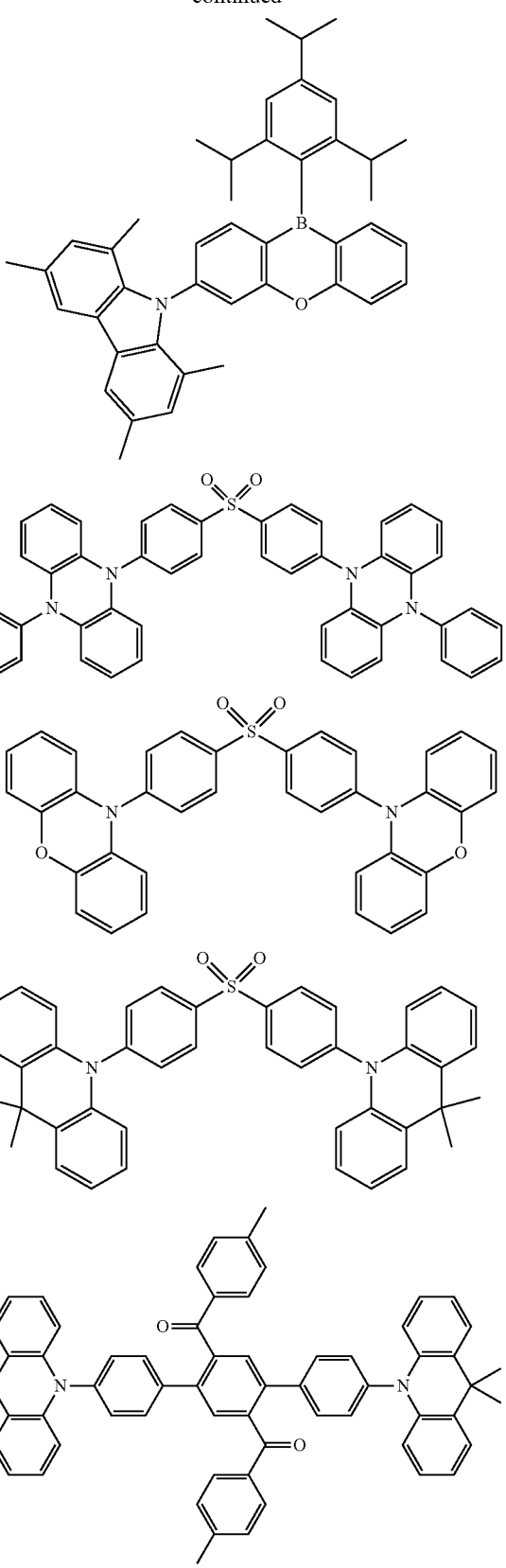

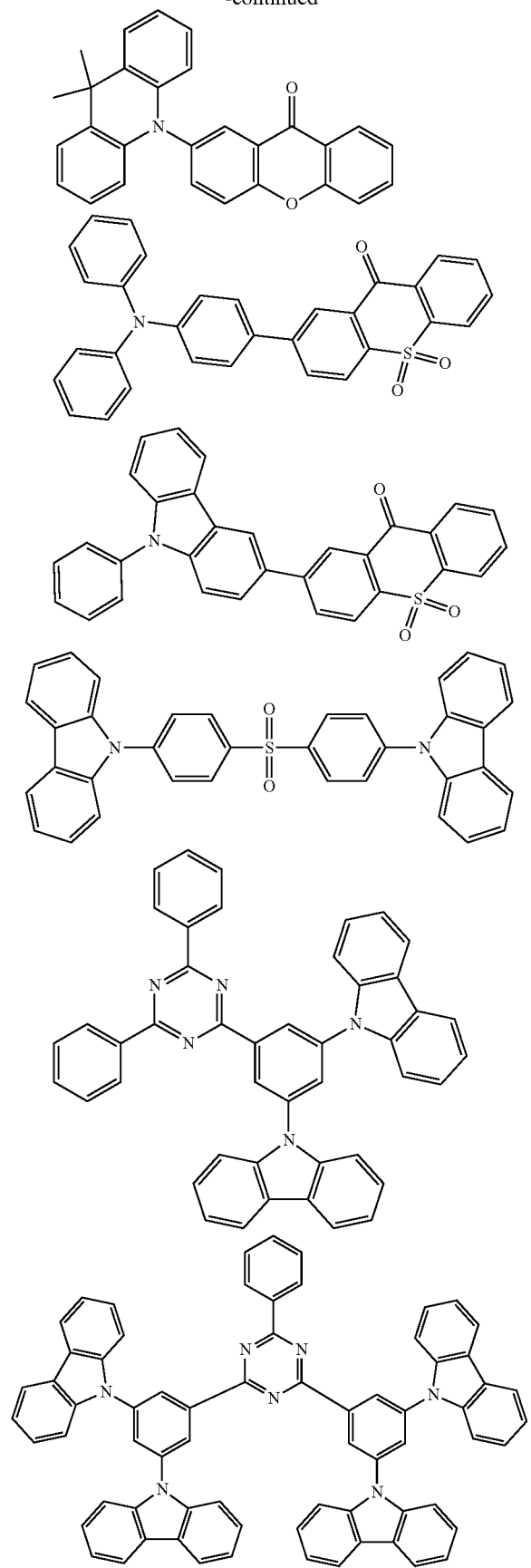
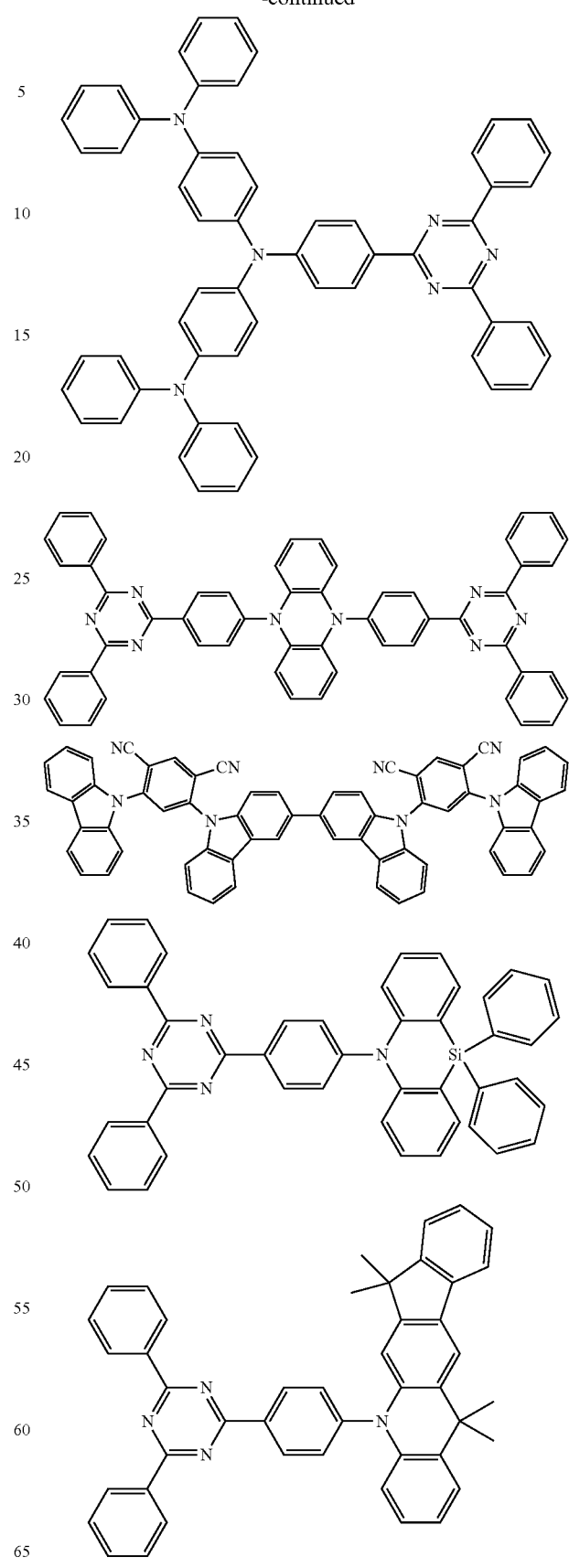

119
-continued
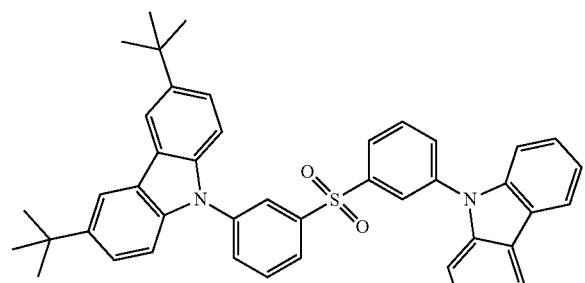
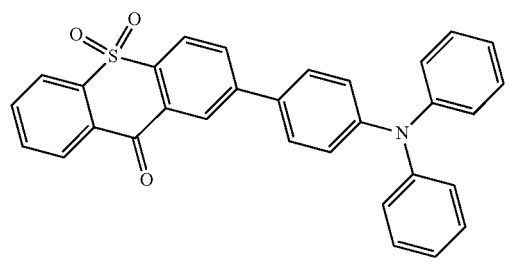
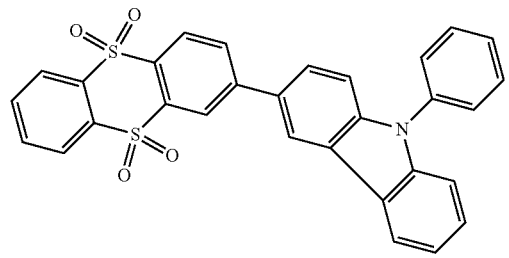
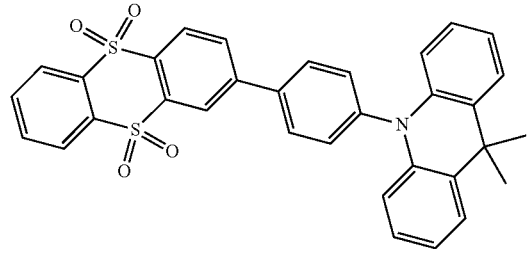
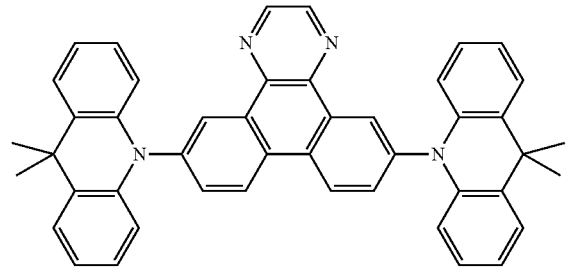
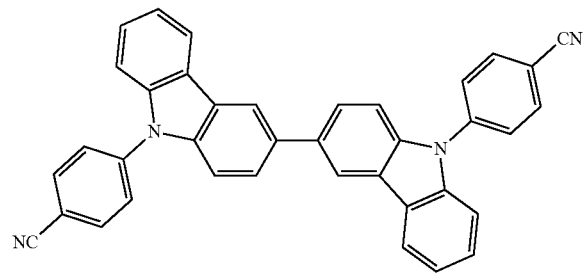
120
-continued
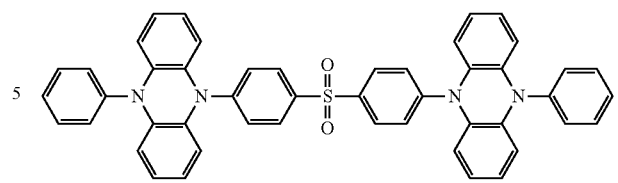
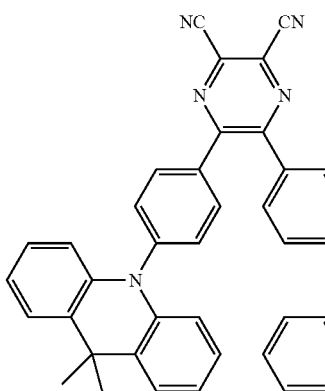
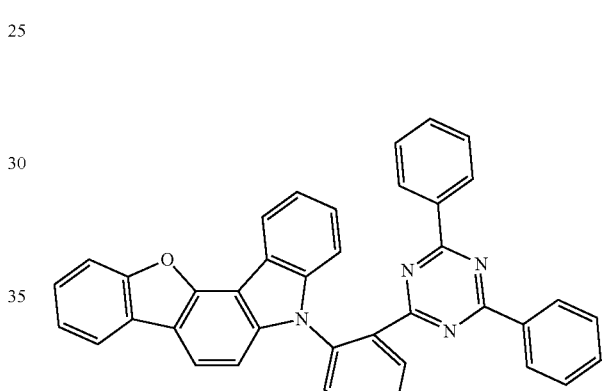
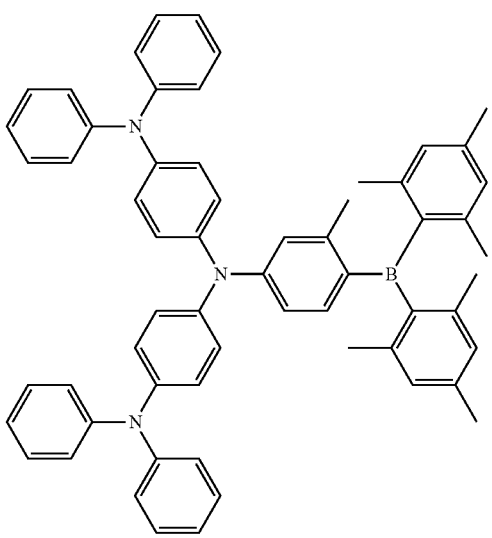

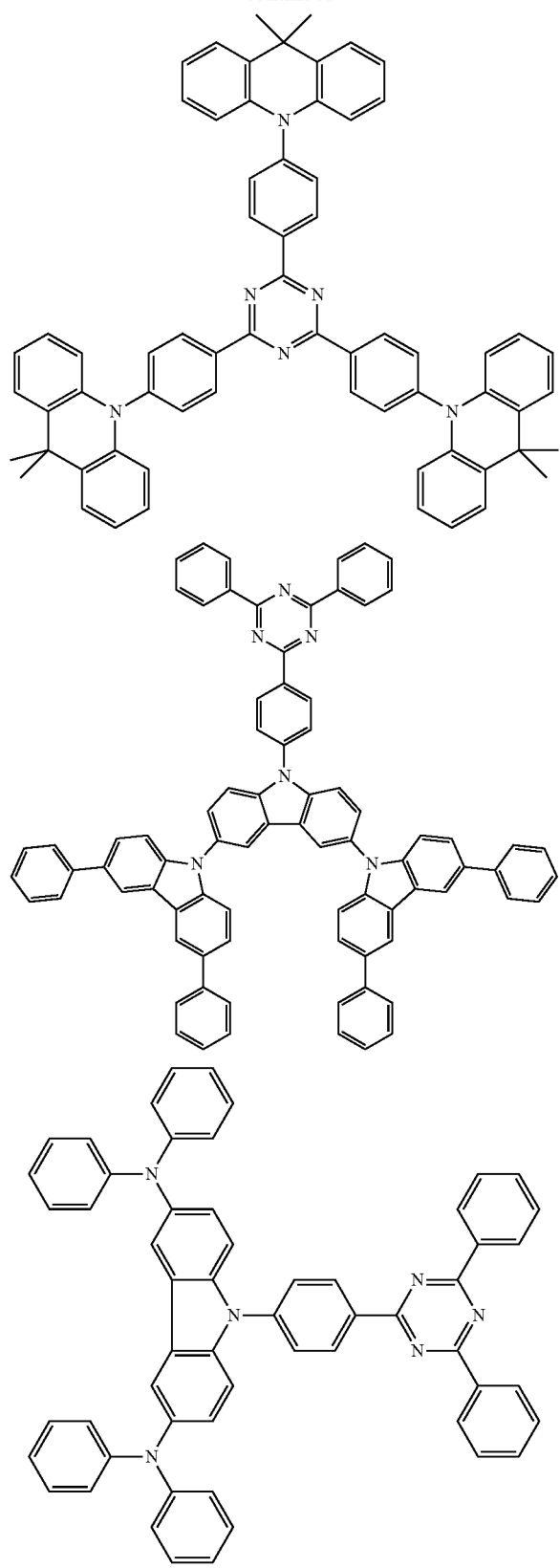
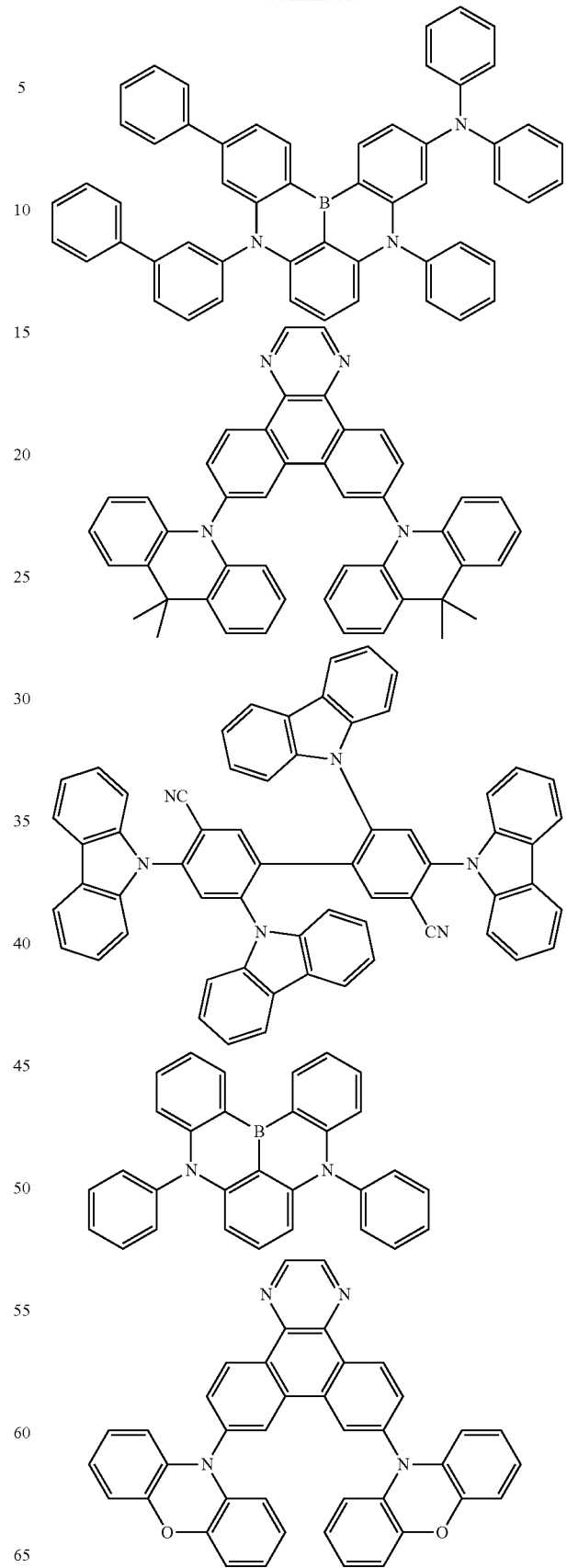

4. HTM

Suitable organic HIM materials may include any one or any combination of the compounds having the following structural units: phthalocyanines, porphyrins, amines, aryl amines, biphenyl triaryl amines, thiophenes, thiophenes, pyrroles, anilines, carbazoles, indenofluorenes, and derivatives thereof.

Examples of cyclic aromatic amine-derived compounds that can be used as HTM include, but are not limited to, the general structure as follows:

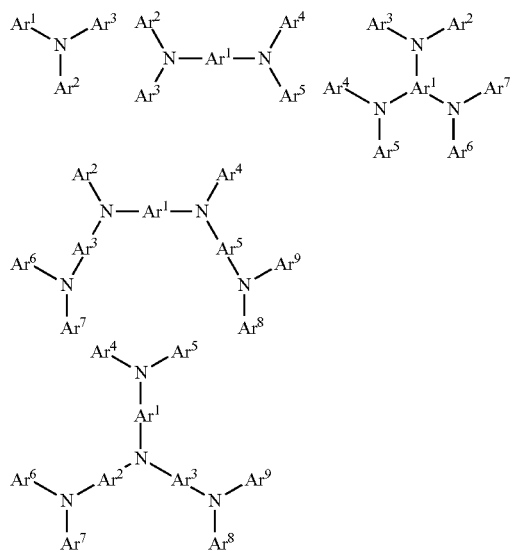

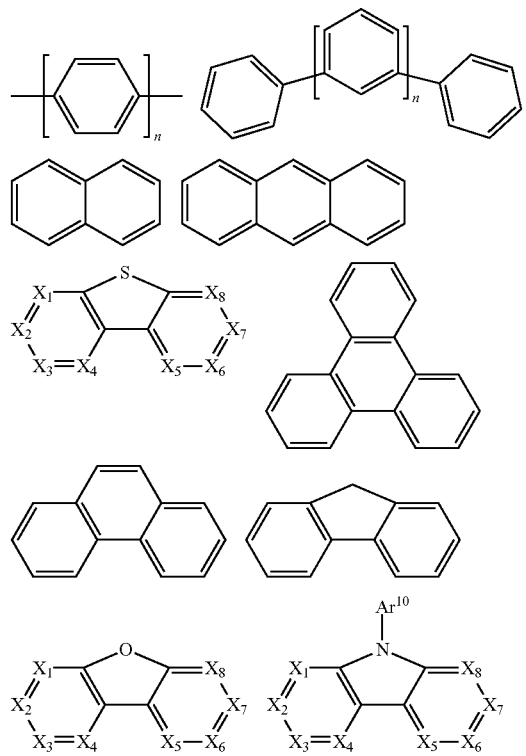

Where each $Ar^1$ to $Ar^9$ may be independently selected from: cyclic aryl groups such as benzene, biphenyl, triphenyl, benzo, naphthalene, anthracene, phenalene, phenanthrene, fluorene, pyrene, chrysene, perylene, azulene; and aromatic heterocyclic groups such as dibenzothiophene, dibenzofuran, furan, thiophene, benzofuran, benzothiophene, benzoselenophene, carbazole, pyrazole, imidazole, triazole, isoxazole, thiazole, oxadiazole, oxatriazole, dioxazole, thiadiazole, pyridine, pyridazine, pyrimidine, pyrazine, triazine, oxazine, oxathiazin, oxadiazine, indole, benzimidazole, indazole, indoxazine, bisbenzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenoxazine, dibenzoselenophene, benzoselenophene, benzofuropyridine, indolocarbazole, pyridylindole, pyrrolodipyridine, furodipyridine, benzothienopyridine, thienodipyridine, benzoselenophenopyridine, and selenophenodipyridine; groups comprising 2 to 10 ring structures which may be the same or different types of cyclic aryl or aromatic heterocyclic group and are bonded to each other directly or through at least one of the following groups, for example: oxygen atom, nitrogen atom, sulfur atom, silicon atom, phosphorus atom, boron atom, chain structural unit, and aliphatic cyclic group; and where each $Ar^1$ to $Ar^9$ may be further optionally substituted, and the substituents may optionally be hydrogen, alkyl, alkoxy, amino, alkene, alkyne, aralkyl, heteroalkyl, aryl and heteroaryl.

In one aspect, $Ar^1$ to $Ar^9$ may be independently selected from the group consisting of:

Where n is an integer from 1 to 20; each of $X_1$ to $X_8$ is CH or N: $Ar^{10}$ is defined as the above-mentioned $Ar^1$.

Additional examples of cyclic aryl amine-derived compounds may be found in U.S. Pat. Nos. 3,567,450, 4,720,432, 5,061,569, and 3,615,404.

Examples of suitable as HTM compounds are listed below:

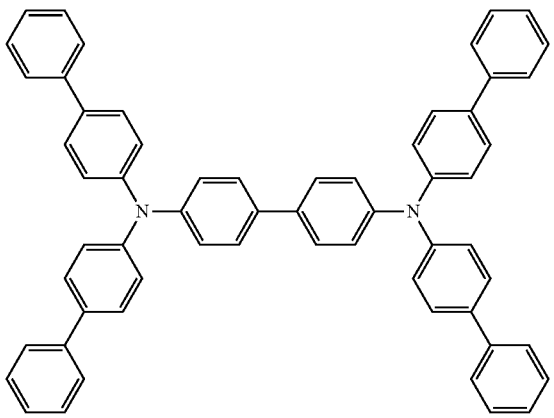

125
-continued
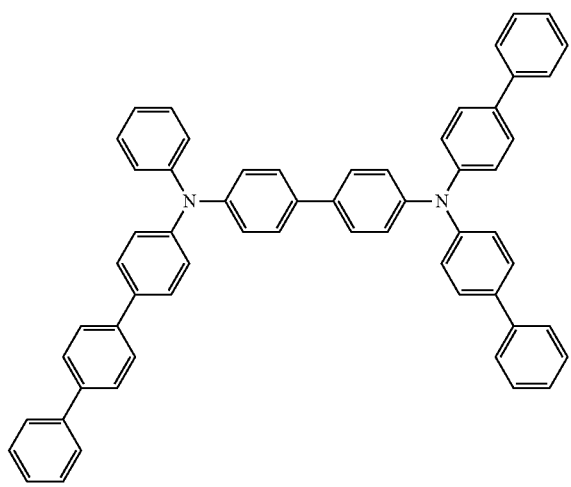
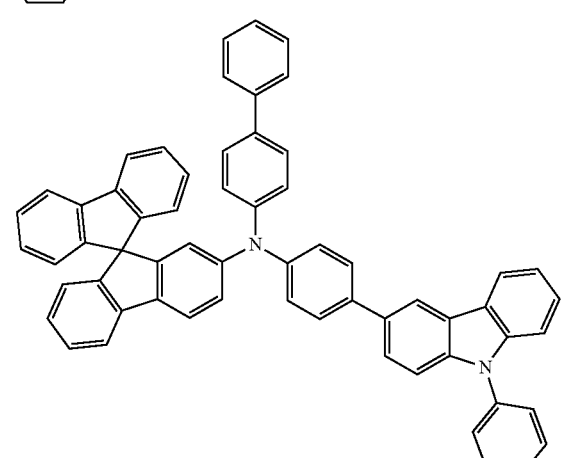
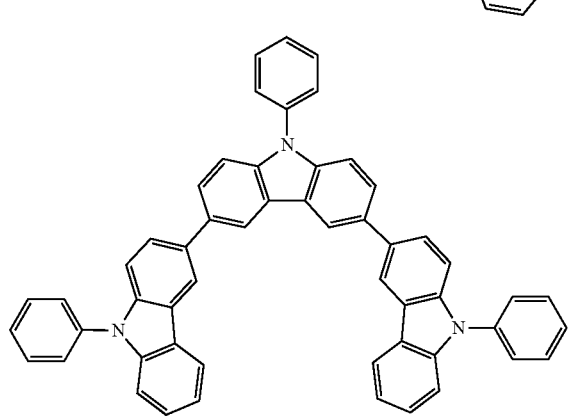
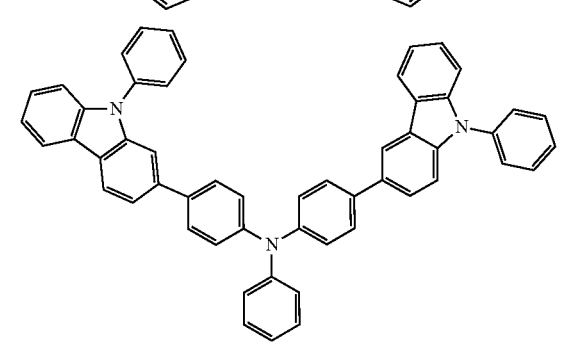
126
-continued
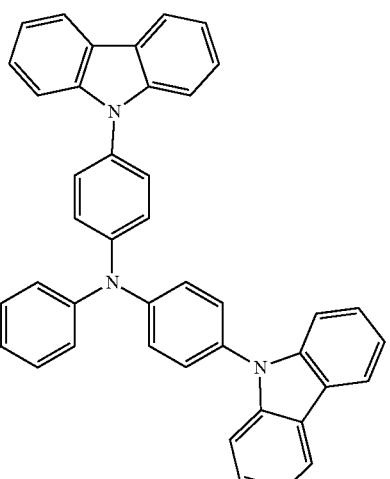
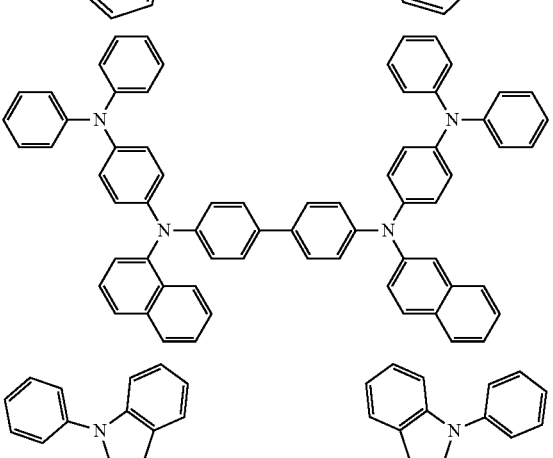
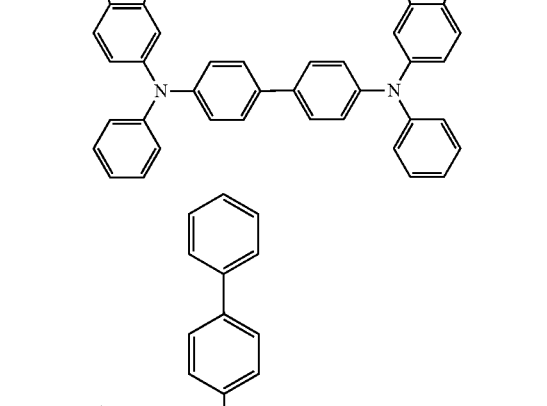
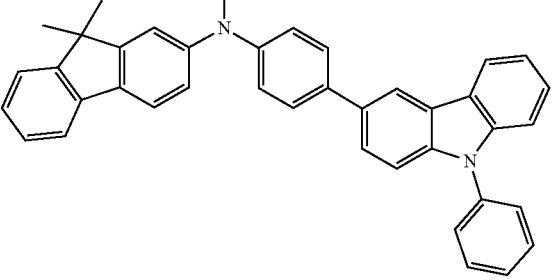

127
-continued

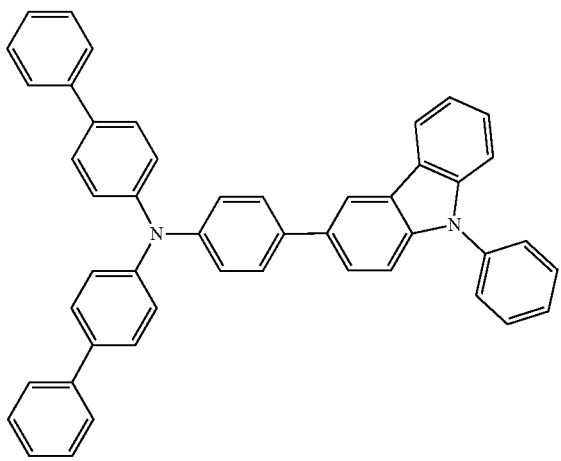

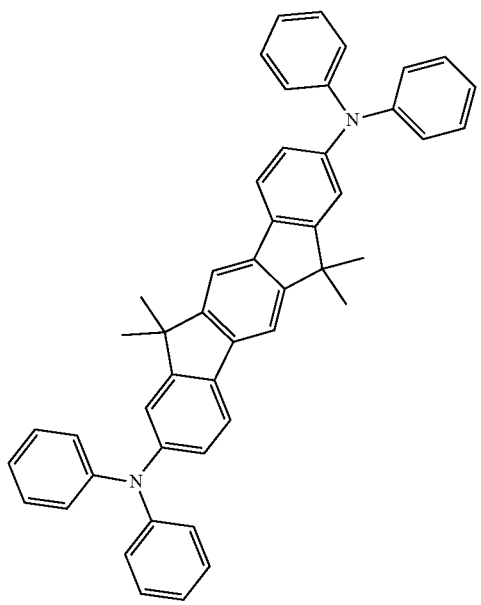

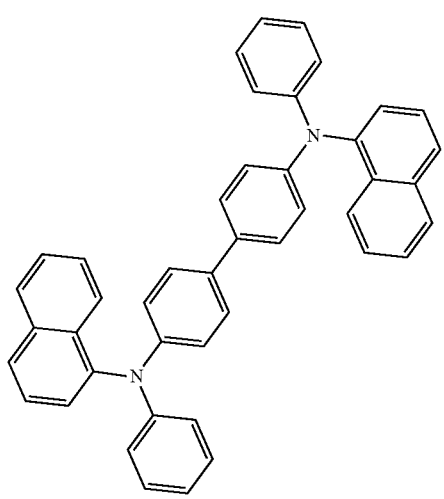

128
-continued

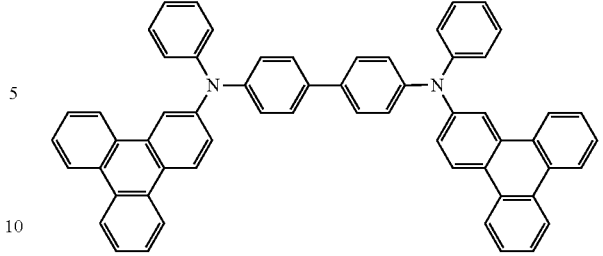

In yet another aspect, the present disclosure further provides a formulation or ink comprising an organic compound, or a mixture as described herein, and at least one organic solvent.

The viscosity and surface tension of the ink are important parameters in printing processes. A suitable ink surface tension is required for the specific substrates and the specific printing methods.

In some embodiments, the surface tension of the ink as described herein at 25° C. is in the range of 19 dynes/cm to 50 dynes/cm; more preferably in the range of 22 dyne/cm to 35 dyne/cm; and most preferably in the range of 25 dyne/cm to 33 dyne/cm.

In some embodiments, the viscosity of the ink as described herein at 25° C. is in the range of from about 1 cps to 100 cps; particularly in the range of 1 cps to 50 cps; more particularly in the range of 1.5 cps to 20 cps; and most particularly in the range of 4.0 cps to 20 cps. The resulting formulation will be particularly suitable for ink-jet printing.

The viscosity can be adjusted by different methods, such as by the selection of appropriate organic solvent and the concentration of the functional materials in the ink. In the ink comprising the above-mentioned metal-organic complexes or polymers as described herein facilitate the adjustment of the printing ink in the appropriate range according to the printing method used. Generally, in the formulation comprising the functional material as described herein, the weight ratio of the functional material ranges from 0.3 wt % to 30 wt %, preferably in the range of 0.5 wt % to 20 wt %, more preferably in the range of 0.5 wt % to 15 wt %, further preferably in the range of 0.5 wt % to 10 wt %, and most preferably in the range of 1 wt % to 5 wt %.

In the formulation as described herein, the at least one organic solvent is selected from aromatics, heteroaromatics, esters, aromatic ketones, aromatic ethers, aliphatic ketones, aliphatic ethers, alicyclic or olefinic compounds, borate, phosphorate, or mixtures of two or more of them.

In some embodiments, in the formulation as described herein, the at least one organic solvent is selected from aromatic or heteroaromatic-based solvents.

The aromatic or heteroaromatic-based solvents suitable for the present disclosure include, but not limited to: p-diisopropylbenzene, amylbenzene, tetrahydronaphthalene, cyclohexylbenzene, chloronaphthalene, 1,4-dimethylnaphthalene, 3-isopropylbenzene, p-methylisopropylbenzene, dipentylbenzene, tripentylbenzene, pentyltoluene, o-diethylbenzene, m-diethylbenzene, p-diethylbenzene, 1,2,3,4-tetramethylbenzene, 1,2,3,5-tetramethylbenzene, 1,2,4,5-tetramethylbenzene, butylbenzene, dodecylbenzene, dihexylbenzene, dibutylbenzene, p-diiisopropylbenzene, cyclohexylbenzene, benzylbutylbenzene, dimethylnaphthalene, 3-isopropylbiphenyl, p-methylisopropylbenzene, 1-methylnaphthalene, 1,2,4-trichlorobenzene, 4,4-difluorobenzenemethane, 1,2-dimethoxy-4-(1-propenyl) benzene, diphenylmethane, 2-phenylpyridine, 3-phenylpyridine, N-methyldiphenylamine, 4-isopropylbipheny, dichlorodiphenylmethane, 4-(3-phenylpropyl) pyridine, benzyl benzoate, 1,1-bis (3,4-dimethylphenyl) ethane, 2-isopropylnaphthalene, quinoline, isoquinoline, methyl 2-furanecarboxylate, ethyl 2-furanicarboxylate, etc.

The aromatic ketone-based solvents suitable for the present disclosure include, but not limited to: 1-tetrahydronaphthalone, 2-tetrahydronaphthalone, 2-(phenylepoxy)tetrahydronaphthalone, 6-(methoxy)tetrahydronaphthalone, acetophenone, phenylacetone, benzophenone, and derivatives thereof such as 4-methyl acetophenone, 3-methyl acetophenone, 2-methyl acetophenone, 4-methyl propanone, 3-methyl propanone, 2-methyl propanone, etc.

The aromatic ether solvents suitable for the present disclosure include, but not limited to: 3-phenoxytoluene, butoxybenzene, p-anisaldehyde dimethyl acetal, tetrahydro-2-phenoxy-2H-pyran, 1,2-dimethoxy-4-(1-propenyl)benzene, 1,4-benzodioxane, 1,3-dipropylbenzene, 2,5-dimethoxytoluene, 4-ethylphenyl ether, 1,3-dipropoxybenzene, 1,2,4-trimethoxybenzene, 4-(1-propenyl)-1,2-dimethoxybenzene, 1,3-dimethoxybenzene, glycidyl phenyl ether, dibenzyl ether, 4-tert-butyl anisole, trans-anethole, 1,2-dimethoxybenzene, 1-methoxynaphthalene, diphenyl ether, 2-phenoxymethyl ether, 2-phenoxytetrahydrofuran, ethyl-2-naphthyl ether.

In some embodiments, in the formulation as described herein, the at least one organic solvent can be selected from aliphatic ketones, such as, 2-nonanone, 3-nonanone, 5-nonanone, 2-decanone, 2,5-hexanedione, 2,6,8-trimethyl-4-nonanone, fenchone, phoron, isophorone, di-n-amyl ketone, etc; and the at least one organic solvent as described herein can be selected from aliphatic, ethers, such as, dipentyl ether, hexyl ether, dioctyl ether, ethylene glycol dibutyl ether, diethylene glycol diethyl ether, diethylene glycol butyl methyl ether, diethylene glycol dibutyl ether, triethylene glycol dimethyl ether, triethylene glycol ethyl methyl ether, triethylene glycol butyl methyl ether, tripropylene glycol dimethyl ether, tetraethylene glycol dimethyl ether, etc.

In some embodiments, in the formulation as described herein, the at least one organic solvent can be selected from: ester-based solvents including alkyl octanoate, alkyl sebacate, alkyl stearate, alkyl benzoate, alkyl phenylacetate, alkyl cinnamate, alkyl oxalate, alkyl maleate, alkyl lactone, alkyl oleate, etc. Particular preferred as octyl octanoate, diethyl sebacate, diallyl phthalate and isononyl isononanoate.

The solvent may be used alone or as mixtures of two or more organic solvents.

In some embodiments, the formulation as described herein comprises an organic compound, or a mixture as described herein, and at least one organic solvent, and can further comprise another organic solvent. Examples of the another organic solvent include, but not limited to: methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4 dioxane, acetone, methyl ethyl ketone, 1,2 dichloroethane, 3-phenoxytoluene, 1,1,1-trichloroethane, 1,1,2,2-tetrachloroethane, ethyl acetate, butyl acetate, dimethylformamide, dimethylacetamide, dimethylsulfoxide, tetrahydronaphthalene, decalin, indene, and/or mixtures thereof.

In yet another aspect, the present disclosure further provides the use of the formulation as coatings or printing inks in the preparation of organic electronic devices, particularly preferably by printing or coating processing methods.

Where suitable printing or coating techniques include, but are not limited to, ink-jet printing, gravure printing, typographic printing, screen printing, dip coating, spin coating, blade coating, roller printing, torsion roll printing, planographic printing, flexographic printing, rotary printing, spray printing, brush coating, pad printing, slit die coating, and so on. Preferred techniques are gravure printing, screen printing, and ink-jet printing. Gravure printing and ink-jet printing will be applied in the embodiments of the present disclosure. The solution or dispersion may additionally comprise one or more components, such as surfactants, lubricants, wetting agents, dispersing agents, hydrophobic agents, binders, etc, which are used to adjust the viscosity and film forming properties, or to improve adhesion, etc. For more information about printing technologies and their requirements for solutions, such as solvent, concentration, viscosity, etc, please refer to "Handbook of Print Media: Technologies and Production Methods", edited by Helmut Kipphan, ISBN 3-540-67326-1.

The preparation methods as described herein, where the formed functional layer has a thickness of 5 nm-1000 nm.

In yet another aspect, the present disclosure further provides the application of an organic compound or a mixture as described herein in organic electronic devices.

In yet another aspect, the present disclosure further provides an organic electronic device comprising an organic compound, or a polymer, or a mixture as described herein.

In some embodiments, the organic electronic device as described herein comprises a functional layer, the functional layer comprises an organic compound, or a polymer, or a mixture as described herein.

The organic electronic device may be selected from, but not limited to an organic light emitting diode (OLED), an organic photovoltaic cell (OPV), an organic light emitting electrochemical cell (OLEEC), an organic field effect transistor (OFET), an organic light emitting field effect transistor, an organic laser, an organic spintronic device, an organic sensor, an organic plasmon emitting diode (OPED), etc., particularly preferably an organic electroluminescent device, such as an OLED, an OLEEC, an organic light emitting field effect transistor.

In some embodiments, the organic electronic device is an organic electroluminescent device comprising a light-emitting layer, and the light-emitting layer comprises an organic compound or a polymer or a mixture as described herein.

In the organic electroluminescent devices described above, in particular an OLED, a substrate, an anode, at least one light-emitting layer, and a cathode are included.

The substrate should be opaque or transparent. A transparent substrate could be used to produce a transparent light emitting device (for example: Bulovic et al., Nature 1996, 380, p 29, and Gu et al., Appl. Phys. Lett. 1996, 68, p 2606). The substrate can be rigid/flexible, and can also be plastic, metal, semiconductor wafer, or glass. Preferably, the substrate has a smooth surface. Particularly desirable are substrates without surface defects. In some embodiments, the substrate is flexible and can be selected from a polymer film or plastic with a glass transition temperature Tg over 150° C., preferably over 200° C., more preferably over 250° C., and most preferably over 300° C. Examples of the suitable flexible substrate includes poly (ethylene terephthalate) (PET) and polyethylene glycol (2,6-naphthalene) (PEN).

The choice of anodes may include a conductive metal, a metal oxide, or a conductive polymer. The anode should be able to easily inject holes into a hole-injection layer (HIL), a hole-transport layer (HTL), or a light emitting layer. In some embodiments, the absolute value of the difference between the work function of the anode and the HOMO energy level of the emitter of the emitting layer, or the HOMO energy level/valence band energy level of the p-type semiconductor material for the hole-injection layer (HIL)/hole-transport layer (HTL)/electron-blocking layer (EBL) is less than 0.5 eV, preferably less than 0.3 eV, more preferably less than 0.2 eV. Examples of anode materials may include, but not limited to: Al, Cu, Au, Ag, Mg, Fe, Co, Ni, Mn, Pd, Pt, ITO, aluminum-doped zinc oxide (AZO), etc. Other suitable anode materials are known and can be readily selected for use by one of ordinary skill in the art. The anode material can be deposited using any suitable technique, such as a suitable physical vapor deposition method, including RF magnetron sputtering, vacuum thermal evaporation, e-beam, etc. In some embodiments, the anode is patterned. Patterned conductive ITO substrates are commercially available and can be used to produce the devices as described herein.

The choice of cathode may include a conductive metal and a metal oxide. The cathode should be able to easily inject electrons into the EIL, the ETL, or the directly into the emitting layer. In some embodiments, the absolute value of the difference between the work function of the cathode and the LUMO energy level of the emitter of the emitting layer, or the LUMO energy level/conduction band energy level of the n-type semiconductor material for electron-injection layer (EIL)/electron-transport layer (ETL)/hole-blocking layer (HBL) is less than 0.5 eV, preferably less than 0.3 eV, most preferably less than 0.2 eV. In principle, all materials that may be used as cathodes for OLEDs are possible to apply as cathode materials for the present disclosure. Examples of cathode materials include, but not limited to: Al, Au, Ag, Ca, Ba, Mg, LiF/Al, MgAg alloys, BaF2/Al, Cu, Fe, Co, Ni, Mn, Pd, Pt, ITO, etc. The cathode material can be deposited using any suitable technique, such as the suitable physical vapor deposition method, including RF magnetron sputtering, vacuum thermal evaporation, e-beam, etc.

The OLED may also comprise other functional layers, such as a hole-injection layer (HIL), a hole-transport layer (HTL), an electron-blocking layer (EBL), an electron-injection layer (EIL), an electron-transport layer (ETL), and a hole-blocking layer (HBL). Materials suitable for use in these functional layers are described in detail above and in WO2010135519A1, US20090134784A1, and WO2011110277A1, the entire contents of the these three documents are hereby incorporated herein for reference.

In some embodiments, the light-emitting layer of the organic electroluminescent device according to the present disclosure comprises an organic compound or a mixture as described herein.

In some embodiments, the light-emitting layer of the organic electroluminescent device according to the present disclosure can be formed by one of the following methods:
(1) The mixture comprising the organic compound H1 and the organic compound H2 is used as a source and is deposited by vacuum evaporation deposition.
(2) The organic compound H1 and the organic compound H2 are independently used as two separate sources, and are deposited by vacuum evaporation deposition.
(3) The formulation as described above is deposited by the method of solution processing, especially by printing method.

The light-emitting device as described herein has a light-emitting wavelength between 300 nm and 1000 nm, preferably between 350 nm and 900 nm, more preferably between 400 nm and 800 nm.

In yet another aspect, the present disclosure further provides the application of organic electroluminescent devices in various electronic equipment, including, but not limited to, display devices, lighting equipment, light sources, sensors, etc.

The present disclosure will be described below in conjunction with the preferred embodiments, but the present disclosure is not limited to the following embodiments. It should be understood that the scope of the present disclosure is covered by the scope of the claims of the present disclosure, and those skilled in the art should understand that certain changes may be made to the embodiments of the present disclosure.

Specific Embodiment

1. Synthesis of Compounds

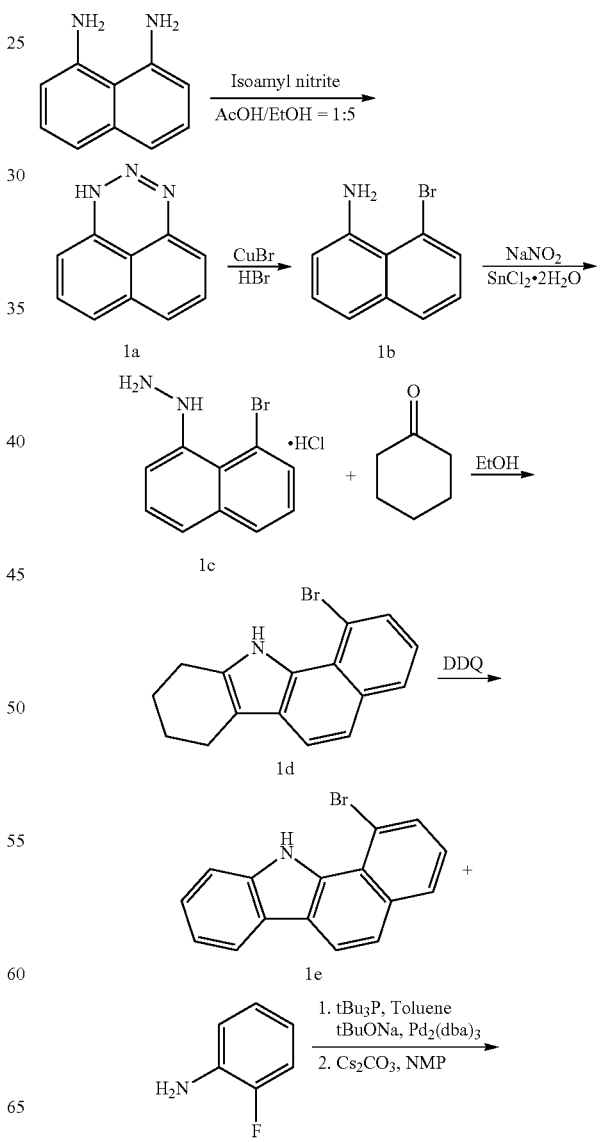

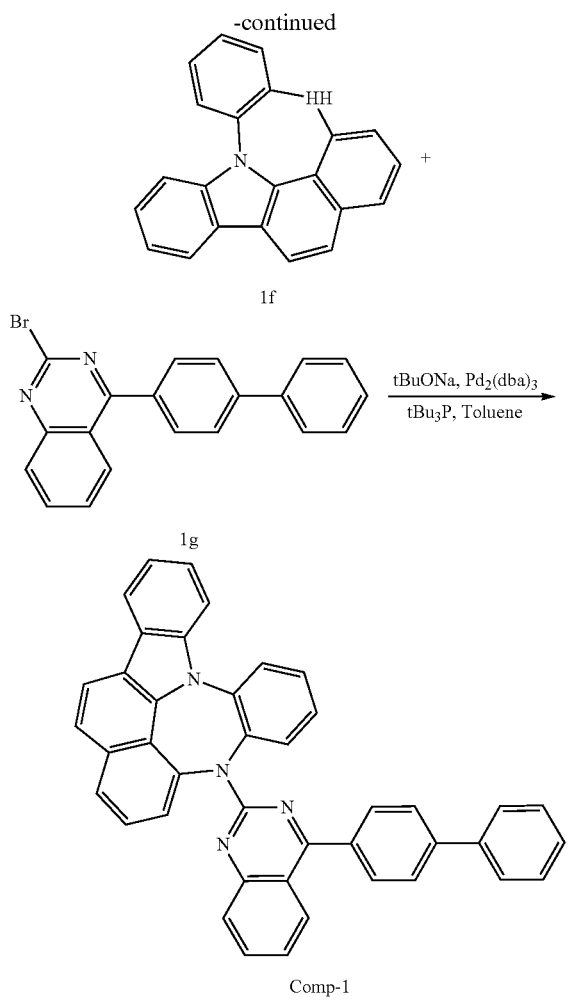

Synthesis of Comp 1:

1,8-Dinaphthylamine (100 g, 632 mmol), 200 mL of acetic acid, and 1 l of ethanol were added to a 2000 mL dry-clean three-necked flask. 130 mL of isoamyl nitrite (diluted with 400 mL of ethanol) was added dropwise at 0 to 5° C. under $N_2$ atmosphere, and the result was heated to room temperature and stirred overnight. After the reaction was completed, the result was filtrated and the residue was further washed with ethanol to obtain intermediate 1a (174 g).

Intermediate 1a (107 g, 633 mmol), 1100 mL of 40% hydrobromic acid solution were added to a 2000 mL dry-clean three-necked flask. 81.74 g of cuprous bromide was dissolved in hydrobromic acid and the resulting solution was slowly added into the flask, then the resulting solution was stirred and reacted at 60° C. for 2 h. After that, the resulting solution was cooled to room temperature, 600 mL of ice water was added, the pH of the mixture was adjusted to 7-8 with sodium carbonate at room temperature. The mixture was extracted with 1 l of ethyl acetate three times, the organic phases were combined, washed with saturated brine and then concentrated, the resulting sample was purified by column chromatography to obtain a pale red solid (intermediate 1b, 90 g).

Intermediate 1b (20 g, 90 mmol) and 170 mL of deionized water were added to a 2000 mL dry-clean three-necked flask, 400 mL of hydrochloric acid was slowly added at room temperature. 7.49 g of sodium nitrite aqueous solution (50 mL water) was added dropwise added at −10° C. under $N_2$ atmosphere, then stirred at −10° C. for another 2 h. Stannous chloride dihydrate (51.13 g, 226 mmol) was dissolved in 100 mL of hydrochloric acid and the resulting mixture was then slowly added to the system, then stirred for another 3 h. After the reaction was completed, the result was filtrated and the solid was further washed with water to obtain intermediate 1c (75 g).

Intermediate 1c (24.48 g, 90.5 mmol), cyclohexanone (8.88 g, 90.5 mmol), and 500 mL ethanol were added to a 1000 mL dry-clean three-necked flask. The resulting solution was stirred in reflux for 1.5 h under $N_2$ atmosphere. After the reaction was terminated, the result was cooled down to room temperature, and the sample was purified using a silicon gel column chromatography to obtain intermediate 1d (20.39 g).

Intermediate 1d (6.64 g, 22.2 mmol), 100 mL of acetonitrile, and 100 mL of tetrahydrofuran were added to a 500 mL dry-clean three-necked flask. 20.16 g of dichlorodicyanoquinone solution (50 mL of acetonitrile+50 mL of tetrahydrofuran) was added dropwise at 0-5° C. under $N_2$ atmosphere, then reacted for 2 h at room temperature. After concentration, the result was extracted with ethyl acetate and then washed with saturated potassium phosphate, The resulting organic phase was concentrated and the sample was further purified using a silicon gel column chromatography to obtain intermediate 1e (1.2 g, pale yellow solid).

Intermediate 1e (7.0 g, 22.8 mmol), o-fluoroaniline (8.2 g, 22.7 mmol), dipalladium tribenzylideneacetone (1.04 g, 1.14 mmol), and sodium tert-butoxide (2.63 g, 27.4 mmol) were added to a 500 mL three-necked flask, and 200 mL of dry toluene was added to dissolved the above mixture. Then tri-tert-butylphosphine (4.6 g, 22.8 mmol) was slowly added dropwise into the flask under $N_2$ atmosphere, and the result was stirred in reflux for 12 h. After the reaction was completed, the solvent was removed by rotary evaporation, and then the product was dissolved in dichloromethane and extracted with saturated brine three times. After that, the combined organic phases were separated and purified by silica gel column chromatography (dichloromethane:petroleum ether=1:20). The obtained product and cesium carbonate (13 g, 40 mmol) were added to a 250 mL three-neck flask and dissolved in 100 mL of N,N-dimethylpyrrolidone. The mixture was heated to 180° C. and reacted for 24 h. After the reaction, the solvent was removed by rotary evaporation, and then the product was dissolved in hot toluene and passed through the short silica gel column. The sample was recrystallized in xylene to obtain 10 g (82% yield) of intermediate 1f.

Intermediate 1f (7.0 g, 22.8 mmol), compound 1g (8.2 g, 22.7 mmol), dipalladium tridibenzylideneacetone (1.04 g, 1.14 mmol), and sodium tert-butoxide (2.63 g, 27.4 mmol) were dissolved in 200 mL of dry toluene in a 500 mL three-necked flask. Then tri-tert-butylphosphine (4.6 g, 22.8 mmol) was slowly added dropwise into the flask under $N_2$ atmosphere, and the mixture was heated to 110° C. and refluxed for 12 h. After the reaction was completed, the reaction mixture was poured into 500 mL of deionized water, rapidly stirred, and the precipitate formed during the period. The sample was collected through the filtration, then dissolved in dichloromethane, washed with saturated brine three times. The combined organic phases were separated and purified by silica gel column chromatography (eluent: dichloromethane:petroleum ether=1:20) to yield 7.79 g (58.6% yield) of compound 1.

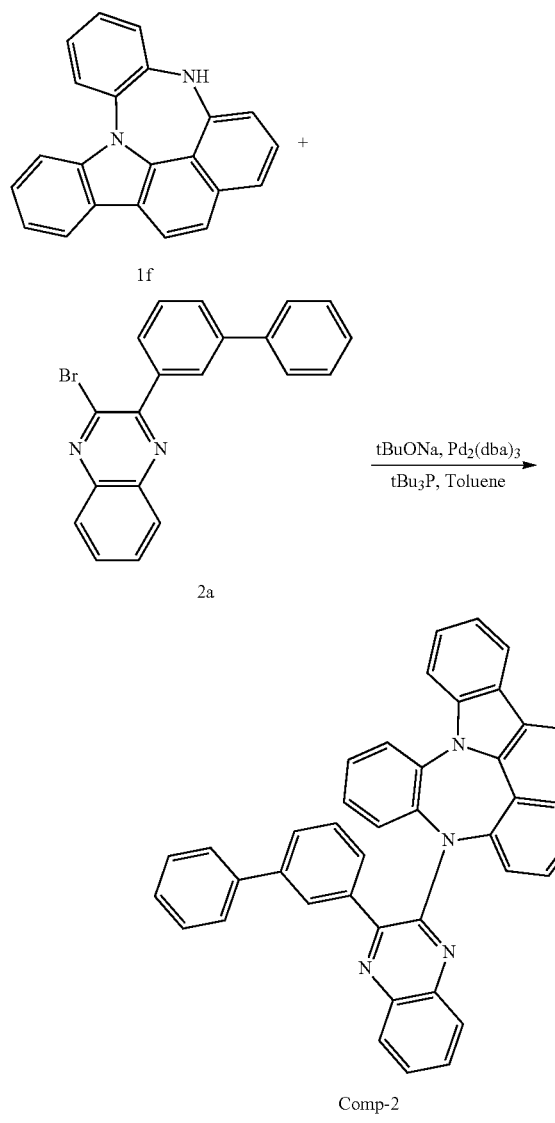

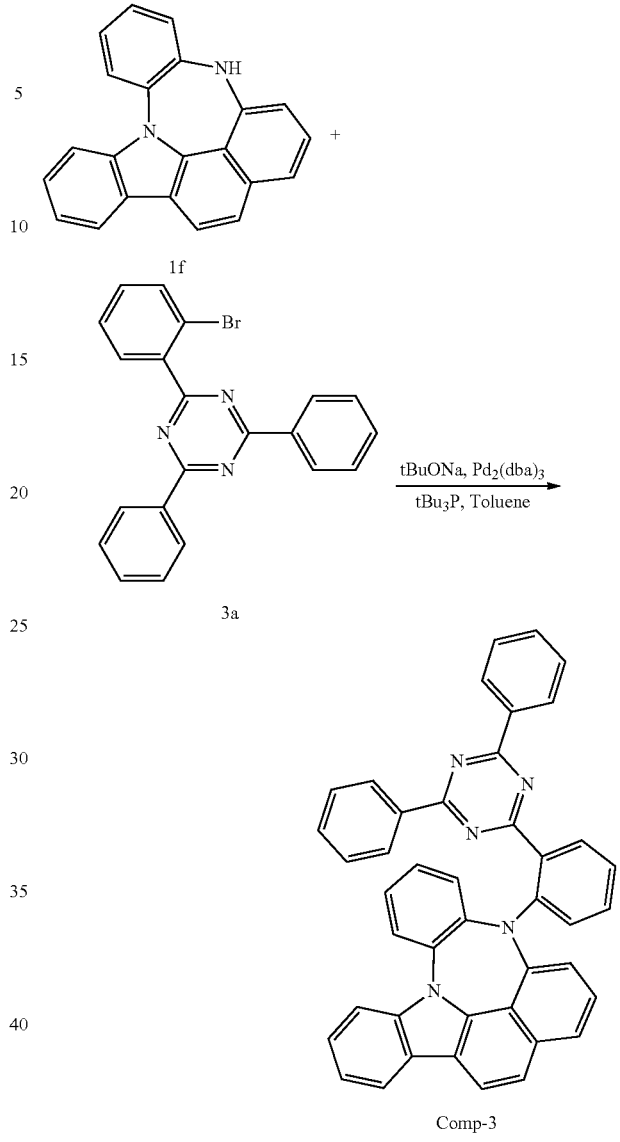

Synthesis of Comp 2:

Intermediate 1f (7.0 g, 22.8 mmol), compound 2a (8.2 g, 22.7 mmol), dipalladium tridibenzylideneacetone (1.04 g, 1.14 mmol), and sodium tert-butoxide (2.63 g, 27.4 mmol) were dissolved in 200 mL of dry toluene in a 500 mL three-necked flask. Then tri-tert-butylphosphine (4.6 g, 22.8 mmol) was slowly added dropwise into the flask under $N_2$ atmosphere, and the mixture was heated to 110° C. and refluxed for 12 h. After the reaction was completed, the reaction mixture was poured into 500 mL of deionized water, rapidly stirred, and the precipitate formed during the period. The sample was collected through the filtration, then dissolved in dichloromethane, washed with saturated brine three times. The combined organic phases were separated and purified by silica gel column chromatography (eluent: dichloromethane:petroleum ether=1:20) to yield 8.24 g (62% yield) of compound 2.

Synthesis of Comp 3:

Intermediate 1f (10.0 g, 32.6 mmol), compound 3a (12.7 g, 32.6 mmol), dipalladium tridibenzylideneacetone (1.5 g, 1.63 mmol), and sodium tert-butoxide (3.76 g, 39.1 mmol) were dissolved in 200 mL of dry toluene in a 500 mL three-necked flask. Then tri-tert-butylphosphine (6.6 g, 32.6 mmol) was slowly added dropwise into the flask under $N_2$ atmosphere, and the mixture was heated to 110° C. and refluxed for 12 h. After the reaction was completed, the reaction mixture was poured into 500 mL of deionized water, rapidly stirred, and the precipitate formed during the period. The sample was collected through the filtration, then dissolved in dichloromethane, washed with saturated brine three times. The combined organic phases were separated and purified by silica gel column chromatography (eluent: dichloromethane:petroleum ether=1:16) to yield 11.06 g (55.2% yield) of compound 3.

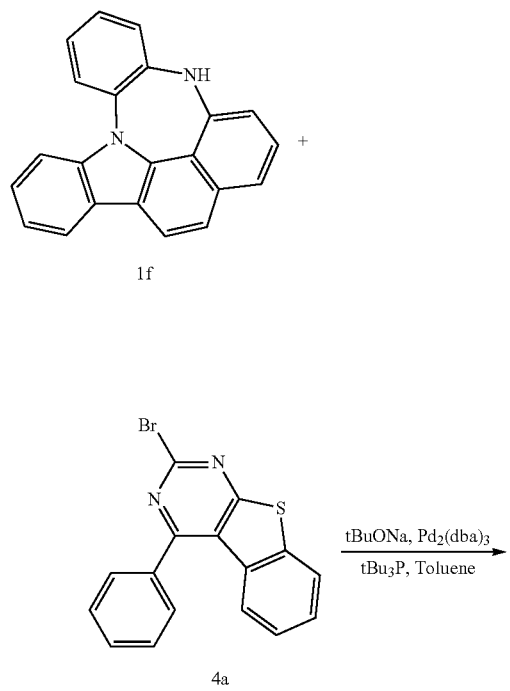

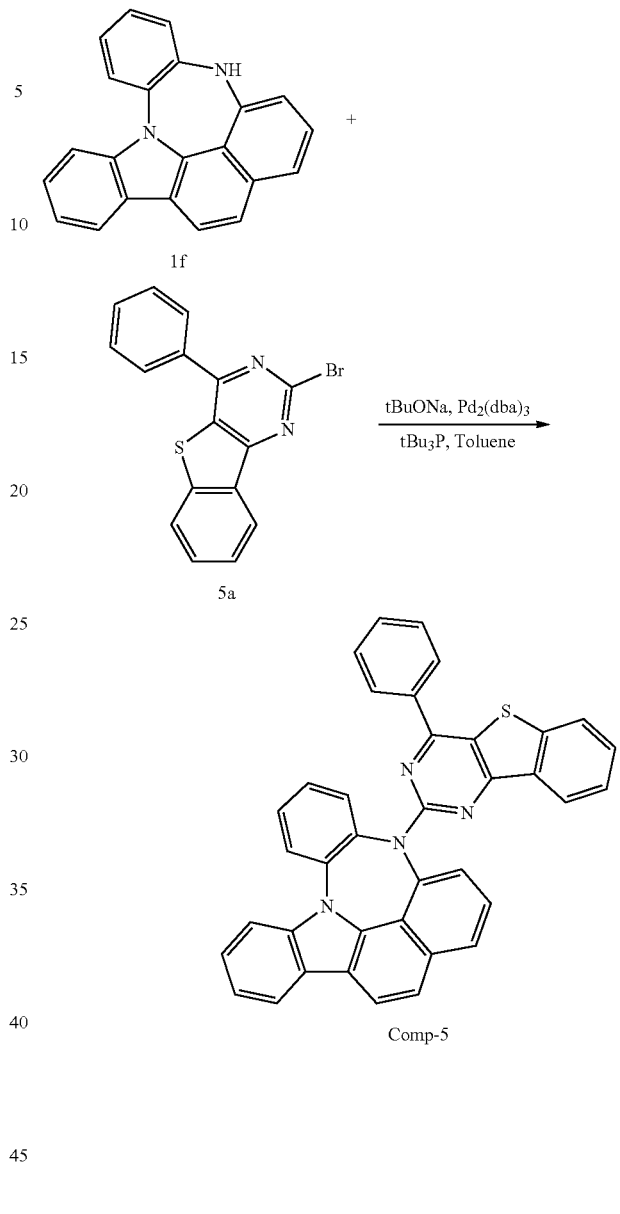

Synthesis of Comp 4:

Intermediate 1f (8.0 g, 26.1 mmol), compound 4a (8.9 g, 26.1 mmol), dipalladium tridibenzylideneacetone (1.2 g, 1.3 mmol), and sodium tert-butoxide (2.5 g, 26.1 mmol) were dissolved in 200 mL of dry toluene in a 500 mL three-necked flask. Then tri-tert-butylphosphine (5.28 g, 26.1 mmol) was slowly added dropwise into the flask under $N_2$ atmosphere, and the mixture was heated to 110° C. and refluxed for 12 h. After the reaction was completed, the reaction mixture was poured into 500 mL of deionized water, rapidly stirred, and the precipitate formed during the period. The sample was collected through the filtration, then dissolved in dichloromethane, washed with saturated brine three times. The combined organic phases were separated and purified by silica gel column chromatography (eluent:dichloromethane:petroleum ether=1:10) to yield 8.1 g (54.7% yield) of compound 4.

Synthesis of Comp 5:

Intermediate 1f (8.0 g, 26.1 mmol), compound 5a (8.9 g, 26.1 mmol), dipalladium tridibenzylideneacetone (1.2 g, 1.3 mmol), and sodium tert-butoxide (2.5 g, 26.1 mmol) were dissolved in 200 mL of dry toluene in a 500 mL three-necked flask. Then tri-tert-butylphosphine (5.28 g, 26.1 mmol) was slowly added dropwise into the flask under $N_2$ atmosphere, and the mixture was heated to 110° C. and refluxed for 12 h. After the reaction was completed, the reaction mixture was poured into 500 mL of deionized water, rapidly stirred, and the precipitate formed during the period. The sample was collected through the filtration, then dissolved in dichloromethane, washed with saturated brine three times. The combined organic phases were separated and purified by silica gel column chromatography (eluent:dichloromethane:petroleum ether=1:10) to yield 9.3 g (62.9% yield) of compound 5.

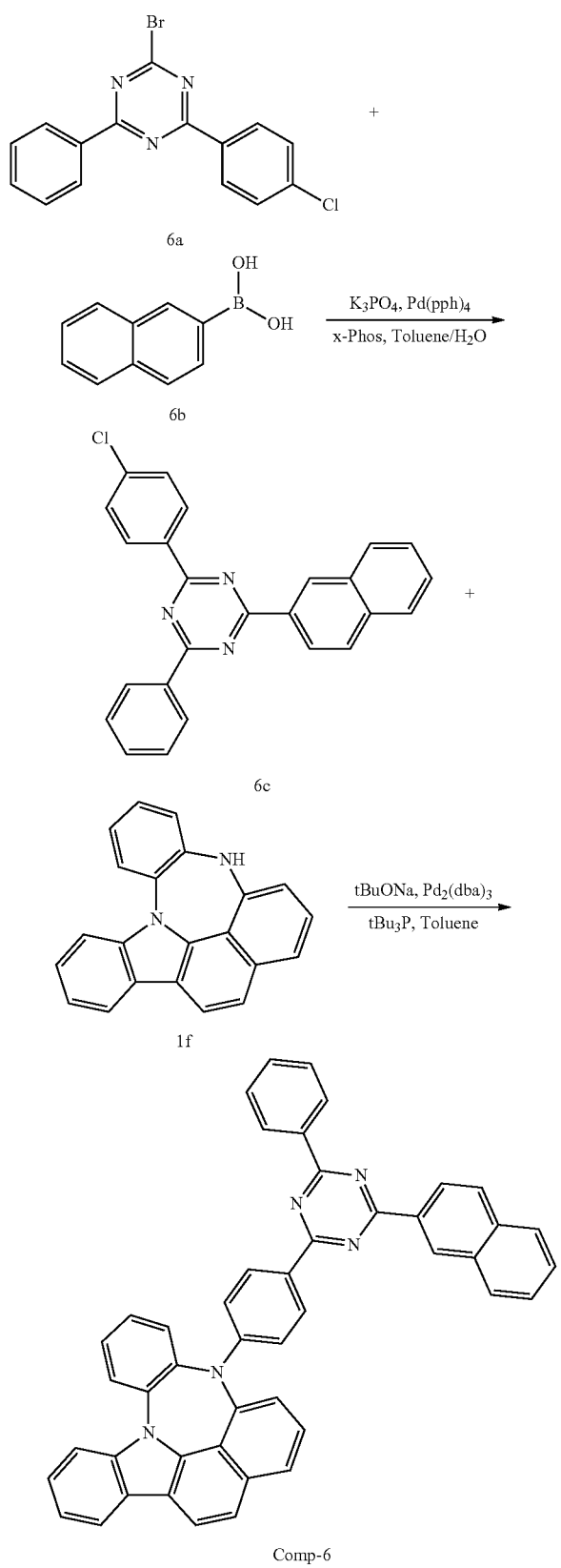

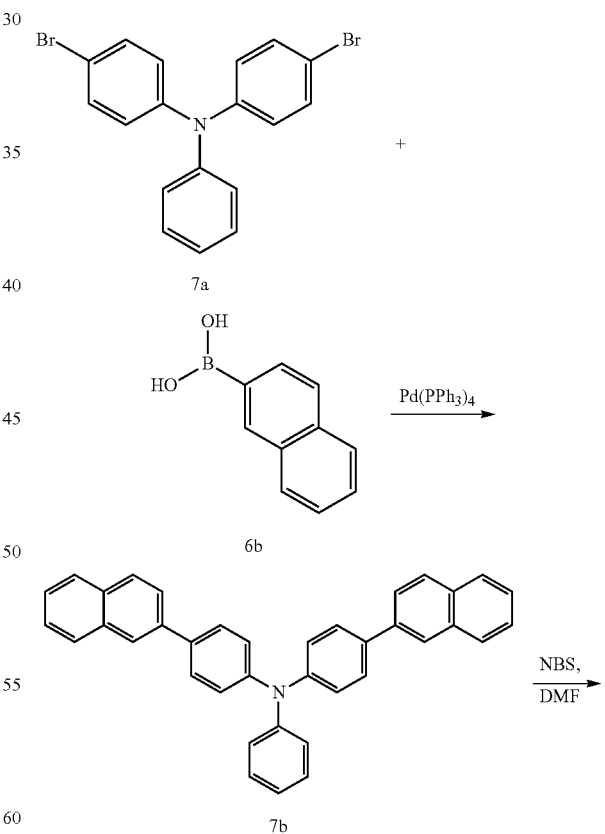

0.52 mmol), and X-Phos (0.6 g, 1.3 mmol) were dissolved in 200 mL of dry toluene in a 500 mL three-necked flask. Then 50 mL aqueous solution of potassium phosphate (13.2 g, 62.3 mmol) was slowly added dropwise into a flask under $N_2$ atmosphere, and the result was heated to 110° C. and refluxed for 8 h. After that, the solvent was removed by rotary evaporation, the resulting sample was dissolved in dichloromethane and washed with deionized water three times, then the combined organic phases were separated and purified by silica gel column chromatography (eluent:petroleum ether) to yield 16.8 g (72.6% yield) of intermediate 6c.

Intermediate 1f (12.4 g, 40.6 mmol), intermediate 6c (16 g, 40.6 mmol), dipalladium tridibenzylideneacetone (1.86 g, 2.03 mmol), and sodium tert-butoxide (4.68 g, 48.7 mmol) were dissolved in 200 mL of dry toluene, then tri-tert-butylphosphine (8.2 g, 40.6 mmol) was slowly added dropwise into the flask under $N_2$ atmosphere, and the mixture was heated to 110° C. and refluxed for 12 h. After the reaction was completed, the reaction mixture was poured into 500 mL of deionized water, rapidly stirred, and the precipitate formed during the period. After the filtration, the product was dissolved in dichloromethane and washed with saturated brine three times, then the combined organic phases were separated and purified by silica gel column chromatography (eluent:dichloromethane:petroleum ether=1:20) to yield 18.9 g (70.3% yield) of compound 6.

Synthesis of Comp 6:
Compound 6a (18.0 g, 51.9 mmol), compound 6b (8.9 g, 51.9 mmol), tetrakis(triphenylphosphine)palladium (0.6 g, -continued

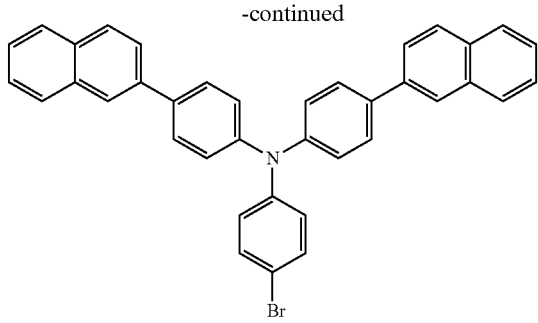

Comp 7

Synthesis of Comp 7:

Compound 7a (20.2 g, 50 mmol), compound 6a (17.2 g, 100 mmol), tetrakis(triphenylphosphine)palladium (3.5 g, 3 mmol), tetrabutylammonium bromide (8.1 g, 25 mmol), and sodium hydroxide (4 g, 100 mmol) were dissolved in a mixture of toluene (200 mL) and deionized water (50 mL) under $N_2$ atmosphere. The resulting mixture was heated to 110° C. and stirred for 24 h. After the reaction was completed, most of the solvent was removed by rotary evaporation, then the sample was dissolved in dichloromethane, washed with water three times. After that, the organic phases were combined and purified by silica gel column chromatography (eluent:petroleum ether) to yield 18.7 g (75% yield) of intermediate 7b.

Intermediate 7b (14.9 g, 30 mmol) and 100 mL of N,N-dimethylformamide were added into a 250 mL single-neck bottle, then 30 mmol N,N-dimethylformamide solution of NBS was added dropwise under ice bath, and the reaction was stirred and reacted for 12 h in dark. After the reaction was completed, the result was poured into 300 mL of water, filtered, then the residue was recrystallized to obtain 17.3 g (90% yield) of intermediate 7c.

Intermediate 7c (34.4 g, 20 mmol), compound 7d (11.5 g, 20 mmol), tetrakis(triphenylphosphine) palladium (0.7 g, 0.6 mmol), tetrabutylammonium bromide (3.2 g, 10 mmol), and sodium hydroxide (1.6 g, 40 mmol) were dissolved in the mixture of toluene (200 mL) and water (50 mL) in a 500 mL three-necked flask under $N_2$ atmosphere, then the mixture was heated to 110° C. and refluxed for 12 h. After the reaction was completed, the solvent was removed by rotary evaporation, then the product was dissolved in dichloromethane and washed with saturated brine three times. After that, the combined organic phases were separated and purified by silica gel column chromatography (eluent:dichloromethane:petroleum ether=1:10) to yield 18.7 g (85% yield) of a compound 7.

Synthesis of Comp 8:

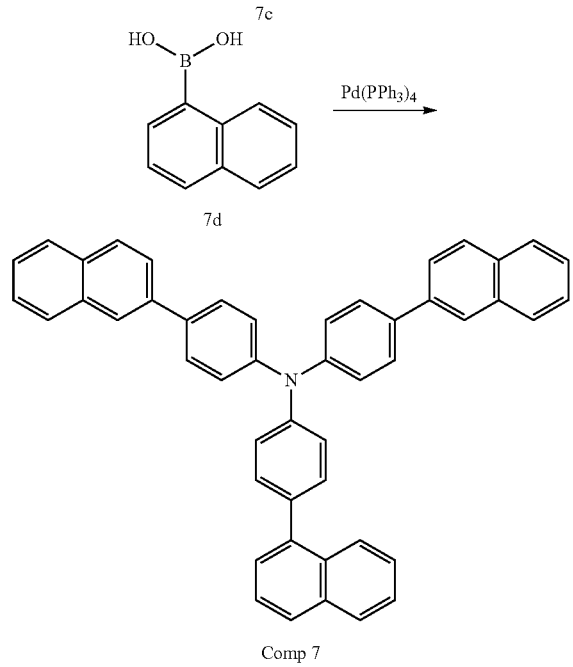

Comp 8

Intermediate 7c (11.5 g, 20 mmol), compound 8a (44.4 g, 20 mmol), tetrakis(triphenylphosphine)palladium (0.7 g, 0.6 mmol), tetrabutylammonium bromide (3.2 g, 10 mmol), sodium hydroxide (1.6 g, 40 mmol) were dissolved in the mixture of toluene (80 mL) and water (10 mL) under $N_2$ atmosphere. The result was heated to 110° C., and reacted for 12 h. After the reaction was completed, most of the solvent was removed by rotary evaporation, then the sample was dissolved in dichloromethane, washed with water three times. After that, the combined organic phases were separated and purified by silica gel column chromatography (eluent:dichloromethane:petroleum ether=1:10) to yield 21.8 g (85% yield) of a compound 8.

Synthesis of Comp 9:

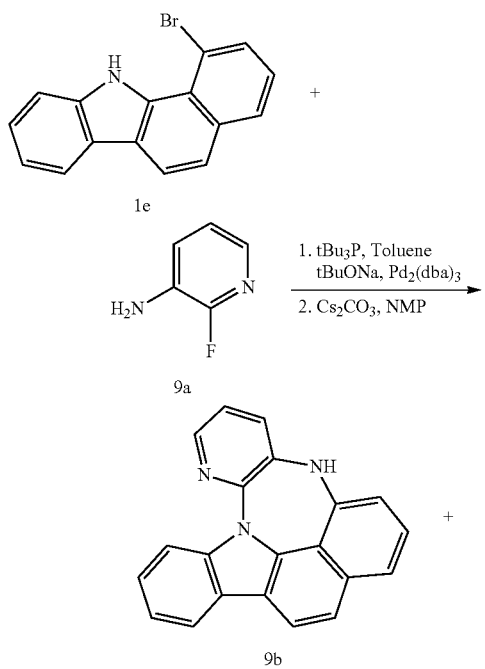

Intermediate 1e (7.0 g, 22.8 mmol), intermediate 9a (8.2 g, 22.7 mmol), dipalladium tridibenzylideneacetone (1.04 g, 1.14 mmol), and sodium tert-butoxide (2.63 g, 27.4 mmol) were dissolved in 200 mL of dry toluene under $N_2$ atmosphere, then tri-tert-butylphosphine (4.6 g, 22.8 mmol) was slowly added dropwise into the flask. The result was heated to 110° C. and refluxed for 12 h. After the reaction was completed, the solvent was removed by rotary evaporation, and then the product was dissolved in dichloromethane and washed with saturated brine three times. After that, the combined organic phases were separated and purified by silica gel column chromatography (eluent:dichloromethane: petroleum ether=1:20). The obtained product and cesium carbonate (13 g, 40 mmol) were added to a 250 mL three-neck flask, 100 mL of N,N-dimethylpyrrolidone was added thereto, and the result was heated to 180° C. for 24 h. After cooling down, the solvent was removed by rotary evaporation, and then the product was dissolved in hot toluene, and passed through the short silica gel column. The crude product was collected by removing solvent, and recrystallized in xylene to obtain 10.6 g (83% yield) of compound 9b.

Intermediate 9b (7.0 g, 20.3 mmol), compound 1g (10.4 g, 20.1 mmol), dipalladium tridibenzylideneacetone (1.04 g, 1.14 mmol), and sodium tert-butoxide (2.32 g, 20.5 mmol) were dissolved in 200 mL of dry toluene under $N_2$ atmosphere, then tri-tert-butylphosphine (4.6 g, 22.8 mmol) was slowly added dropwise into the flask. The result was heated to 110° C. and refluxed for 12 h. After the reaction was completed, the reaction mixture was poured into 500 mL of deionized water, rapidly stirred, and the precipitate formed during the period. After the suction filtration, the product was dissolved in dichloromethane and washed with saturated brine three times. After that, the combined organic phases were separated and purified by silica gel column chromatography (eluent:dichloromethane:petroleum ether=1:20) to yield 6.62 g (50.1% yield) of compound 9.

Synthesis of Comp 10:

-continued

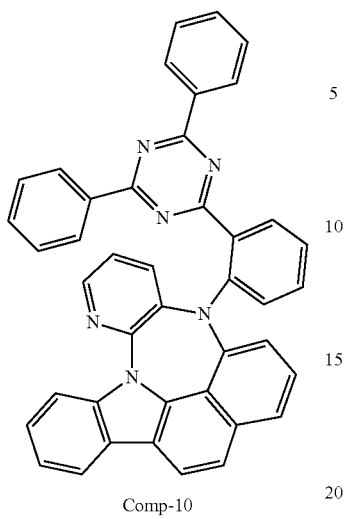

Comp-10

Intermediate 9b (7.0 g, 20.3 mmol), compound 3a (10.4 g, 20.1 mmol), tridibenzylidene acetone dipalladium (1.04 g, 1.14 mmol), and sodium tert-butoxide (2.63 g, 20.5 mmol) were dissolved in 200 mL of dry toluene under N2 atmosphere, then tri-tert-butylphosphine (4.6 g, 22.8 mmol) was slowly added dropwise into the flask. The resulting mixture was heated to 110° C. and refluxed for 12 h. After the reaction was completed, the reaction mixture was poured into 500 mL of deionized water, quickly stirred, and the precipitate formed during the period. After the filtration, the product was dissolved in dichloromethane and washed with saturated brine three times. After that, the combined organic phases were separated and purified by silica gel column chromatography (eluent:dichloromethane:petroleum ether=1:20) to yield 7.23 g (56.5% yield) of compound 10.

Synthesis of Comp 11:

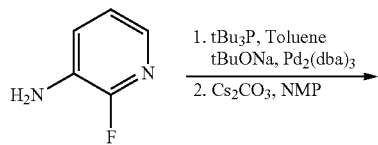

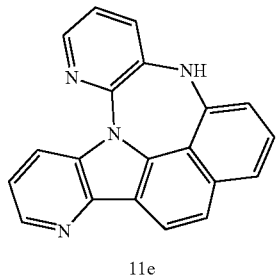

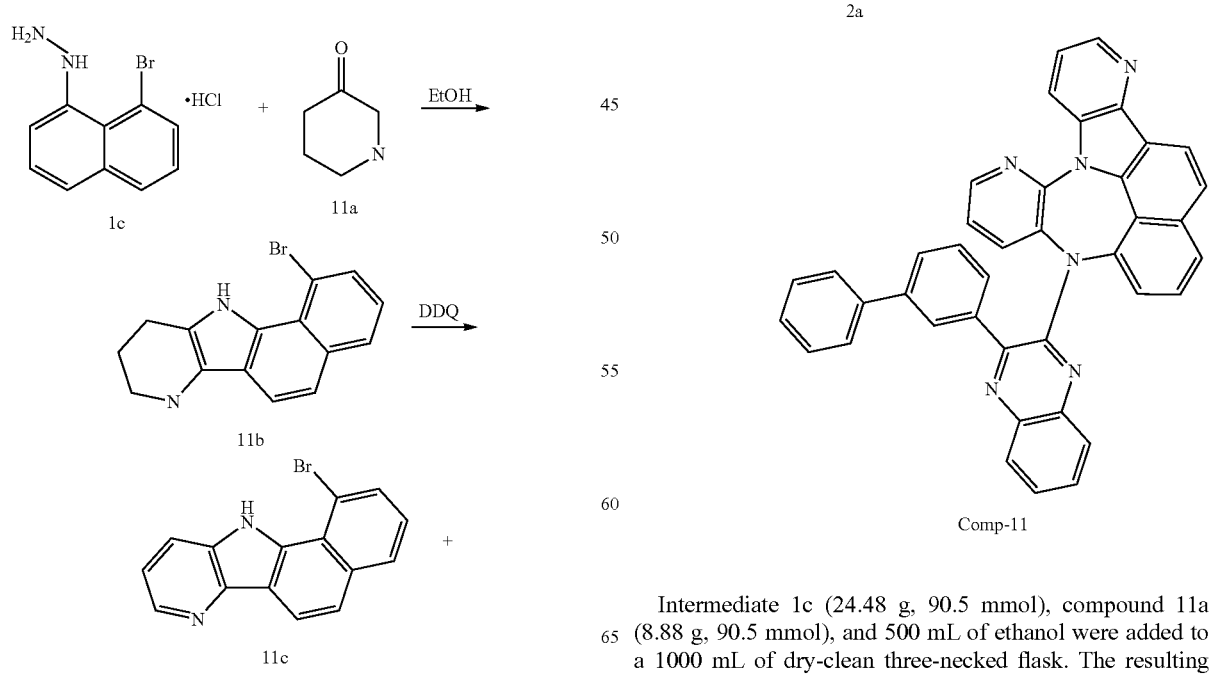

Comp-11

Intermediate 1c (24.48 g, 90.5 mmol), compound 11a (8.88 g, 90.5 mmol), and 500 mL of ethanol were added to a 1000 mL of dry-clean three-necked flask. The resulting mixture was heated and refluxed for 1.5 h. After cooling down, the sample was further purified through the silicon gel column chromatography to yield 21.23 g of intermediate 11b.

Intermediate 11b (6.64 g, 22.2 mmol) was dissolved in the mixture of 100 mL of acetonitrile and 100 mL of tetrahydrofuran. Then 20.16 g of dichlorodicyanoquinone solution (50 mL of acetonitrile+50 mL of tetrahydrofuran) was added dropwise under $N_2$ atmosphere at 0-5° C. The resulting mixture was stirred at room temperature for 2 h. After concentration, the mixture was extracted with ethyl acetate and washed with saturated potassium phosphate aqueous solution. The combined organic phases were concentrated, and purified through a silicon gel column chromatography to yield 0.5 g of intermediate 11c (pale yellow solid).

Intermediate 11c (7.0 g, 22.8 mmol), compound 11d (8.2 g, 22.7 mmol), tridibenzylidene acetone dipalladium (1.04 g, 1.14 mmol), and sodium tert-butoxide (2.63 g, 27.4 mmol) were dissolved in 200 mL of dried toluene under $N_2$ atmosphere, then tri-tert-butylphosphine (4.6 g, 22.8 mmol) was slowly added dropwise into the flask. The resulting mixture was heated to 110° C. and refluxed for 12 h. After the reaction was completed, the solvent was removed by rotary evaporation, then the product was dissolved in dichloromethane and washed with saturated brine three times. After that, the combined organic phases were separated and purified by silica gel column chromatography (eluent:dichloromethane:petroleum ether=1:20). The obtained product and cesium carbonate (13 g, 40 mmol) were added to a 250 mL three-neck flask, 100 mL of N,N-dimethylpyrrolidone was added thereto, and the result was heated to 180° C. for 24 h. After the reaction, the solvent was removed by rotary evaporation, then the product was dissolved in hot toluene, and passed through the short silica gel column. The crude product was collected by removing solvent, and recrystallized in xylene to obtain 10.3 g (83% yield) of Intermediate 11e.

Intermediate 11e (7.0 g, 20.1 mmol), compound 2a (8.2 g, 20.2 mmol), tridibenzylidene acetone dipalladium (1.04 g, 1.14 mmol), and sodium tert-butoxide (2.63 g, 27.4 mmol) were dissolved in 200 mL of dry toluene under $N_2$ atmosphere, then tri-tert-butylphosphine (4.6 g, 22.8 mmol) was slowly added dropwise into the flask, heated to 110° C. and refluxed for 12 h. After the reaction was completed, the reaction mixture was poured into 500 mL of deionized water, quickly stirred, and the precipitate formed during the period. After the filtration, the product was dissolved in dichloromethane and washed with saturated brine three times. After that, the combined organic phases were separated and purified by silica gel column chromatography (eluent:dichloromethane:petroleum ether=1:20) to yield 6.85 g (52.6% yield) of compound 11.

Synthesis of Comp 12:

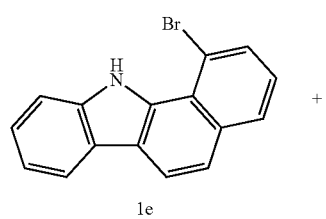

1e

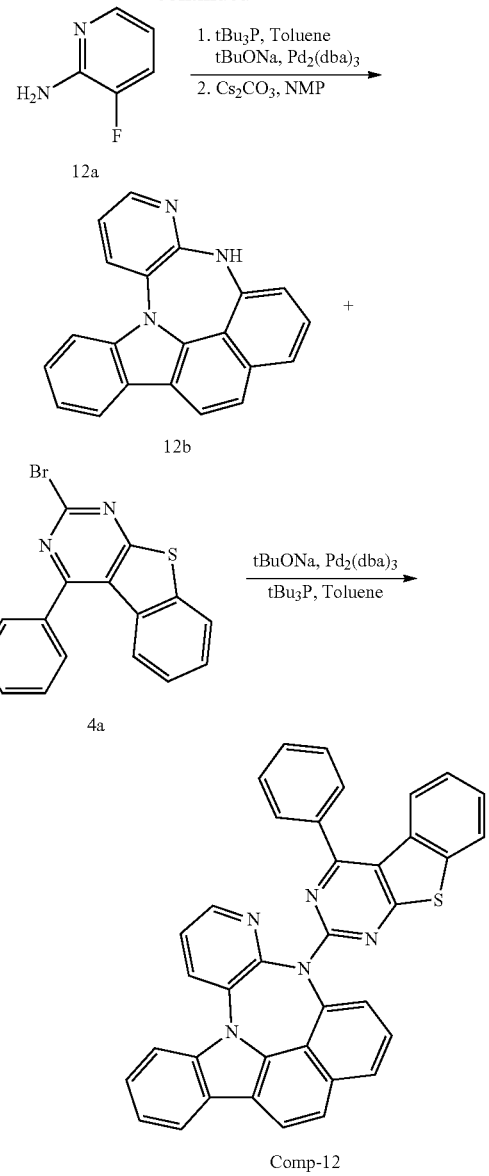

Comp-12

Intermediate 1e (7.0 g, 22.8 mmol), intermediate 12a (8.2 g, 22.7 mmol), tridibenzylidene acetone dipalladium (1.04 g, 1.14 mmol), and sodium tert-butoxide (2.63 g, 27.4 mmol) were dissolved in 200 mL of dried toluene under $N_2$ atmosphere, then tri-tert-butylphosphine (4.6 g, 22.8 mmol) was slowly added dropwise into the flask. The resulting mixture was heated to 110° C. and refluxed for 12 h. After the reaction was completed, the solvent was removed by rotary evaporation, and then the product was dissolved in dichloromethane and washed with saturated brine three times. After that, the combined organic phases were separated and purified by silica gel column chromatography (eluent:dichloromethane:petroleum ether=1:20). The obtained product and cesium carbonate (13 g, 40 mmol) were added to a 250 mL three-neck flask, 100 mL of N,N-dimethylpyrrolidone was added thereto, and the result was heated to 180° C. for 24 h. After cooling down, the solvent was removed by rotary evaporation, then the product was dissolved in hot toluene, and passed through the insulated silica gel column.

The crude product was collected by removing solvent, and recrystallized in xylene to obtain 10 g (82% yield) of Intermediate 12b.

Intermediate 12b (7.0 g, 20.1 mmol), compound 4a (8.2 g, 20.1 mmol), tridibenzylidene acetone dipalladium (1.04 g, 1.14 mmol), and sodium tert-butoxide (2.63 g, 27.4 mmol) were dissolved in 200 mL of dry toluene under N₂ atmosphere, then tri-tert-butylphosphine (4.6 g, 22.8 mmol) was slowly added dropwise into the flask. The resulting mixture was heated to 110° C. and refluxed for 12 h. After the reaction was completed, the reaction mixture was poured into 500 mL of deionized water, quickly stirred, and the precipitate formed during the period. After the filtration, the product was dissolved in dichloromethane and washed with saturated brine three times. After that, the combined organic phases were separated and purified by silica gel column chromatography (eluent:dichloromethane:petroleum ether=1:20) to yield 7.45 g (57.2% yield) of compound 12.

Synthesis of Comp 13:

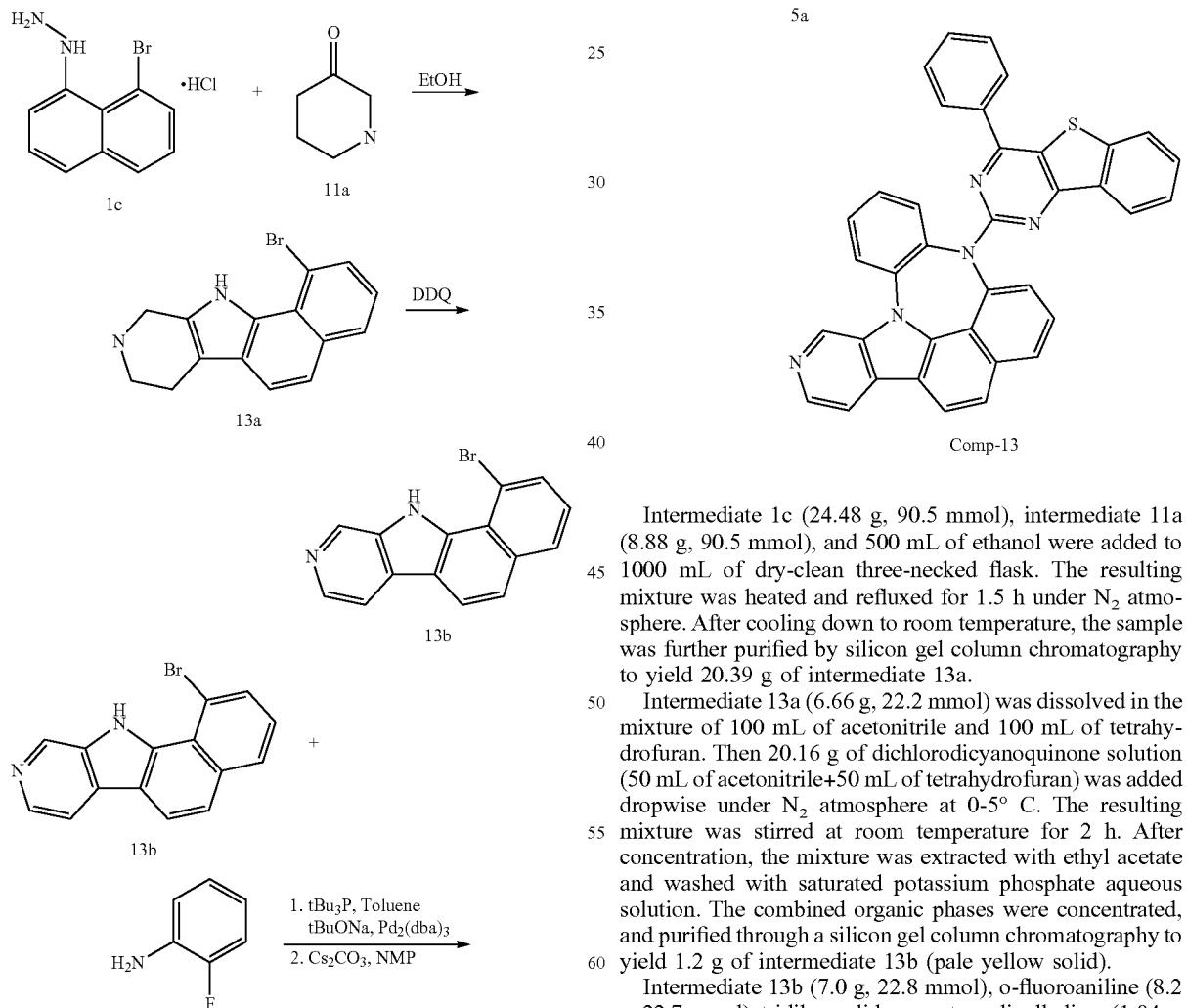

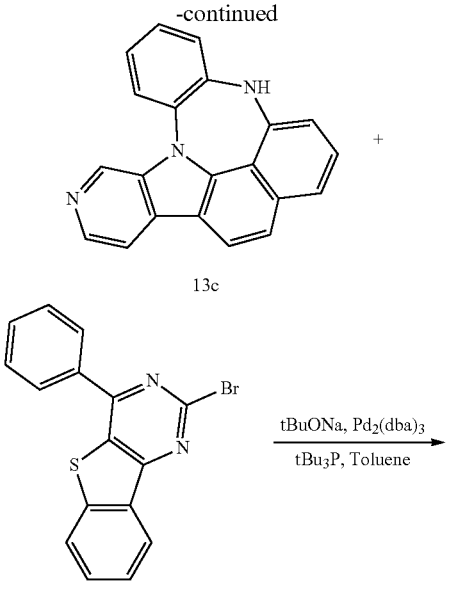

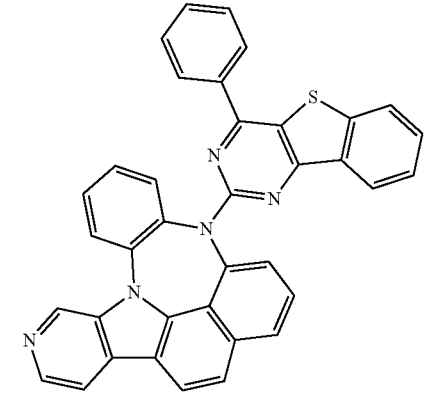

Intermediate 1c (24.48 g, 90.5 mmol), intermediate 11a (8.88 g, 90.5 mmol), and 500 mL of ethanol were added to 1000 mL of dry-clean three-necked flask. The resulting mixture was heated and refluxed for 1.5 h under N₂ atmosphere. After cooling down to room temperature, the sample was further purified by silicon gel column chromatography to yield 20.39 g of intermediate 13a.

Intermediate 13a (6.66 g, 22.2 mmol) was dissolved in the mixture of 100 mL of acetonitrile and 100 mL of tetrahydrofuran. Then 20.16 g of dichlorodicyanoquinone solution (50 mL of acetonitrile+50 mL of tetrahydrofuran) was added dropwise under N₂ atmosphere at 0-5° C. The resulting mixture was stirred at room temperature for 2 h. After concentration, the mixture was extracted with ethyl acetate and washed with saturated potassium phosphate aqueous solution. The combined organic phases were concentrated, and purified through a silicon gel column chromatography to yield 1.2 g of intermediate 13b (pale yellow solid).

Intermediate 13b (7.0 g, 22.8 mmol), o-fluoroaniline (8.2 g, 22.7 mmol), tridibenzylidene acetone dipalladium (1.04 g, 1.14 mmol), and sodium tert-butoxide (2.63 g, 27.4 mmol) were dissolved in 200 mL of dry toluene under N₂ atmosphere, tri-tert-butylphosphine (4.6 g, 22.8 mmol) was then slowly added dropwise into the flask. The result was heated to 110° C. and refluxed for 12 h. After the reaction was completed, the solvent was removed by rotary evaporation, and then the product was dissolved in dichloromethane and washed with saturated brine for three times. After that, the combined organic phases were separated and purified by silica gel column chromatography (eluent:dichloromethane: petroleum ether=1:20). The obtained product and cesium carbonate (13 g, 40 mmol) were added to a 250 mL three-neck flask, 100 mL of N,N-dimethylpyrrolidone was added, the result was heated to 180° C. and reacted for 24 h. After the reaction, the solvent was removed by rotary evaporation, and then the product was dissolved in hot toluene and passed through the silica gel column. The sample was collected by removing the solvent and then recrystallized in xylene to obtain 10 g (82% yield) of intermediate 13c.

Intermediate 13c (7.0 g, 20.1 mmol), compound 5a (8.2 g, 20.2 mmol), tridibenzylidene acetone dipalladium (1.04 g, 1.14 mmol), and sodium tert-butoxide (2.63 g, 27.4 mmol) were dissolved in 200 mL of dry toluene under $N_2$ atmosphere, then tri-tert-butylphosphine (4.6 g, 22.8 mmol) was slowly added dropwise into the flask. The mixture was heated to 110° C. and refluxed for 12 h. After the reaction was completed, the reaction mixture was poured into 500 mL of deionized water, quickly stirred, and the precipitate formed during the period. After the filtration, the product was dissolved in dichloromethane and washed with saturated brine three times. After that, the combined organic phases were separated and purified by silica gel column chromatography (eluent:dichloromethane:petroleum ether=1:20) to yield 7.69 g (58.1% yield) of compound 13.

Synthesis of Comp 14:

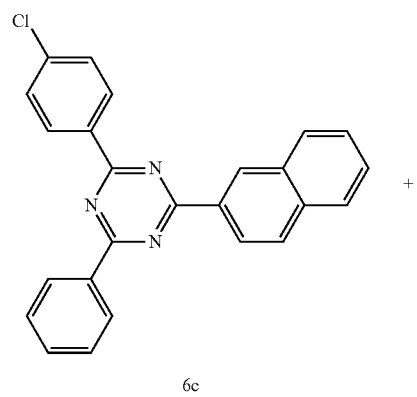

6c

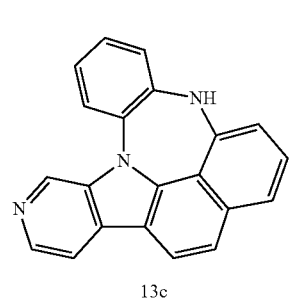

13c tBuONa, Pd$_2$(dba)$_3$
tBu$_3$P, Toluene

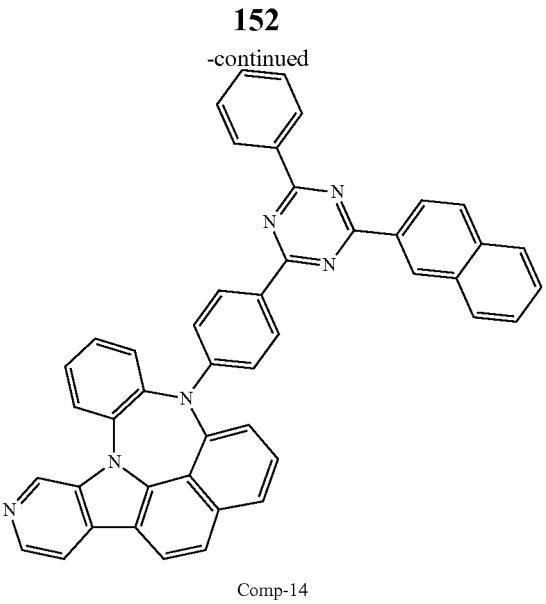

Comp-14

Intermediate 6c (7.0 g, 20.1 mmol), compound 13c (8.2 g, 20.1 mmol), tridibenzylidene acetone dipalladium (1.04 g, 1.14 mmol), and sodium tert-butoxide (2.63 g, 27.4 mmol) were dissolved in 200 mL of dry toluene under $N_2$ atmosphere, then tri-tert-butylphosphine (4.6 g, 22.8 mmol) was slowly added dropwise into the flask. The mixture was heated to 110° C. and refluxed for 12 h. After the reaction was completed, the reaction mixture was poured into 500 mL of deionized water, quickly stirred, and the precipitate formed during the period. After the suction filtration, the product was dissolved in dichloromethane and washed with saturated brine three times. After that, the combined organic phases were separated and purified by silica gel column chromatography (eluent:dichloromethane:petroleum ether=1:20) to yield 8.23 g (61% yield) of compound 14.

Synthesis of Comp 15:

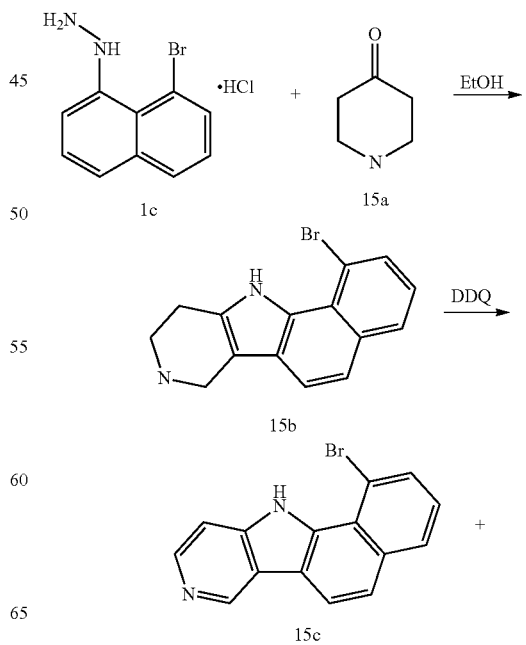

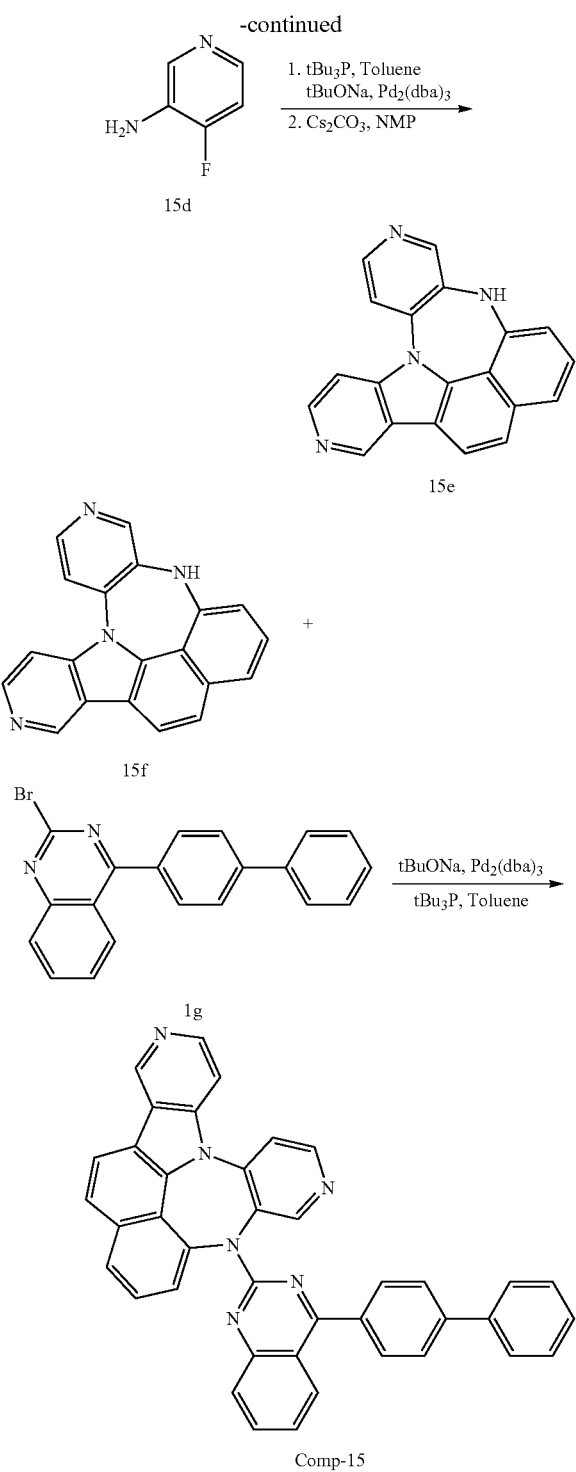

(50 mL of acetonitrile+50 mL of tetrahydrofuran) was added dropwise under $N_2$ atmosphere at 0-5° C. The resulting mixture was stirred at room temperature for 2 h. After concentration, the mixture was extracted with ethyl acetate and washed with saturated potassium phosphate aqueous solution. The combined organic phases were concentrated, and purified through a silicon gel column chromatography to yield 1.2 g of intermediate 15c (pale yellow solid).

Intermediate 15c (7.0 g, 22.8 mmol), intermediate 15d (8.2 g, 22.7 mmol), tridibenzylidene acetone dipalladium (1.04 g, 1.14 mmol), and sodium tert-butoxide (2.63 g, 27.4 mmol) were dissolved in 200 mL of dry toluene under $N_2$ atmosphere, then tri-tert-butylphosphine (4.6 g, 22.8 mmol) was slowly added dropwise into the flask. The resulting mixture was heated to 110° C. and refluxed for 12 h. After the reaction was completed, the solvent was removed by rotary evaporation, and then the product was dissolved in dichloromethane and washed with saturated brine for three times. After that, the combined organic phases were separated and purified by silica gel column chromatography (eluent:dichloromethane:petroleum ether=1:20). The obtained product and cesium carbonate (13 g, 40 mmol) were added to a 250 mL three-neck flask, 100 mL of N,N-dimethylpyrrolidone was added, the result was heated to 180° C. and reacted for 24 h. After the reaction, the solvent was removed by rotary evaporation, and then the product was dissolved in hot toluene and passed through the short silica gel column. The crude product was collected by removing the solvent and then recrystallized in xylene to obtain 10 g (82% yield) of intermediate 15e.

Intermediate 15f (7.0 g, 20.1 mmol), compound 1g (8.2 g, 20.2 mmol), tridibenzylidene acetone dipalladium (1.04 g, 1.14 mmol), and sodium tert-butoxide (2.63 g, 27.4 mmol) were dissolved in 200 mL of dry toluene, then tri-tert-butylphosphine (4.6 g, 22.8 mmol) was slowly added dropwise into the flask under $N_2$ atmosphere. The mixture was heated to 110° C. and refluxed for 12 h. After the reaction was completed, the reaction mixture was poured into 500 mL of deionized water, quickly stirred, and the precipitate formed during the period. The sample was collected by the filtration, dissolved in dichloromethane and washed with saturated brine three times. After that, the combined organic phases were separated and purified by silica gel column chromatography (eluent:dichloromethane:petroleum ether=1:20) to yield 7.23 g (58.2% yield) of compound 15.

Synthesis of Comp 16:

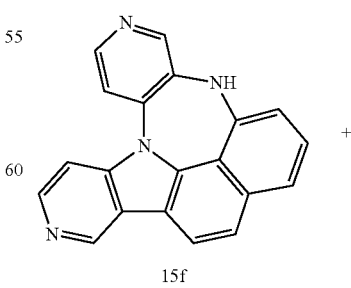

Intermediate 1c (24.48 g, 90.5 mmol), intermediate 15a (8.88 g, 90.5 mmol), and 500 mL of ethanol were added to a 1000 mL of dry-clean three-necked flask. The resulting mixture was heated and refluxed for 1.5 h under $N_2$ atmosphere. After cooling down to room temperature, the mixture was concentrated and further purified through the silicon gel column chromatography to yield 20.39 g of compound 15b.

Intermediate 15b (6.66 g, 22.2 mmol) was dissolved in the mixture of 100 mL of acetonitrile and 100 mL of tetrahydrofuran. Then 20.16 g of dichlorodicyanoquinone solution -continued

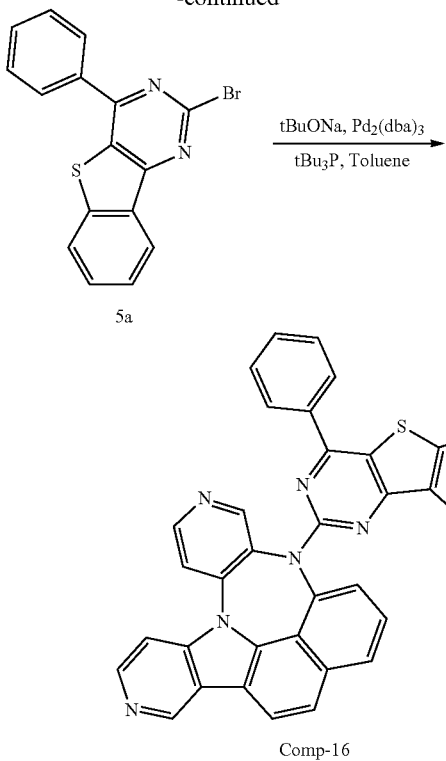

Comp-16

Intermediate 15f (7.0 g, 20.1 mmol), compound 5a (8.2 g, 20.2 mmol), tridibenzylidene acetone dipalladium (1.04 g, 1.14 mmol), and sodium tert-butoxide (2.63 g, 27.4 mmol) were dissolved in 200 mL of dry toluene, then tri-tert-butylphosphine (4.6 g, 22.8 mmol) was slowly added dropwise into the flask under $N_2$ atmosphere, and the result was heated to 110° C. and refluxed for 12 h. After the reaction was completed, the reaction mixture was poured into 500 mL of deionized water, quickly stirred, and the precipitate formed during the period. The sample was collected by the filtration, dissolved in dichloromethane and washed with saturated brine three times. After that, the combined organic phases were separated and purified by silica gel column chromatography (eluent:dichloromethane:petroleum ether=1:20) to yield 7.21 g (58.1% yield) of compound 16.

2. Energy Structure of Organic Compound

The energy level of the organic material can be calculated by quantum computation, for example, using TD-DFT (time-dependent density functional theory) by Gaussian09W (Gaussian Inc.), the specific simulation methods of which can be found in WO2011141110. Firstly, the molecular geometry is optimized by semi-empirical method "Ground State/Semi-empirical/Default Spin/AM1" (Charge 0/Spin Singlet), and then the energy structure of organic molecules is calculated by TD-DFT (time-dependent density functional theory) "TD-SCF/DFT/Default Spin/B3PW91" and the basis set "6-31G (d)" (Charge 0/Spin Singlet). The HOMO and LUMO levels are calculated using the following calibration formula, where S1 and T1 are used directly.

HOMO(eV)=((HOMO(G)×27.212)−0.9899)/1.1206

LUMO(eV)=((LUMO(G)×27.212)−2.0041)/1.385

Where HOMO(G) and LUMO(G) are the direct calculation results of Gaussian 09W, in units of Hartree. The results are shown in Table 1:

TABLE 1

| Material | HOMO [eV] | LUMO [eV] | ΔHOMO [eV] | ΔLUMO [eV] | T1 [eV] | S1 [eV] |
|---|---|---|---|---|---|---|
| comp-1 | −5.54 | −2.99 | 0.35 | 0.71 | 2.48 | 2.94 |
| comp-2 | −5.64 | −3.22 | 0.47 | 0.88 | 2.57 | 3.10 |
| comp-3 | −5.41 | −2.79 | 0.28 | 0.09 | 2.54 | 2.77 |
| comp-4 | −5.60 | −2.69 | 0.34 | 0.36 | 2.52 | 3.29 |
| comp-5 | −5.58 | −2.92 | 0.28 | 0.58 | 2.52 | 3.02 |
| comp-6 | −5.52 | −2.98 | 0.28 | 0.10 | 2.45 | 2.68 |
| comp-7 | −5.33 | −2.40 | 0.73 | 0.04 | 2.47 | 3.23 |
| comp-8 | −5.34 | −2.42 | 0.70 | 0.01 | 2.47 | 3.24 |
| comp-9 | −5.56 | −3.09 | 0.38 | 0.72 | 2.49 | 2.87 |
| comp-10 | −5.41 | −3.03 | 0.26 | 0.13 | 2.32 | 2.35 |
| comp-11 | −5.85 | −3.06 | 0.24 | 0.57 | 2.56 | 3.24 |
| comp-12 | −5.67 | −2.54 | 0.30 | 0.21 | 2.52 | 3.39 |
| comp-13 | −5.76 | −2.95 | 0.19 | 0.51 | 2.55 | 3.15 |
| comp-14 | −5.73 | −2.98 | 0.23 | 0.03 | 2.45 | 2.89 |
| comp-15 | −5.88 | −3.14 | 0.29 | 0.64 | 2.51 | 3.10 |
| comp-16 | −5.89 | −2.89 | 0.22 | 0.38 | 2.51 | 3.18 |

3. Preparation and Measurement of OLED Devices

The preparation process of the OLEDs will be described in detail with reference to specified examples below. The structure of the red-emitting OLED is as follows: ITO/HI/HT-1/HT-2/EML/ET:Liq/Liq/Al.

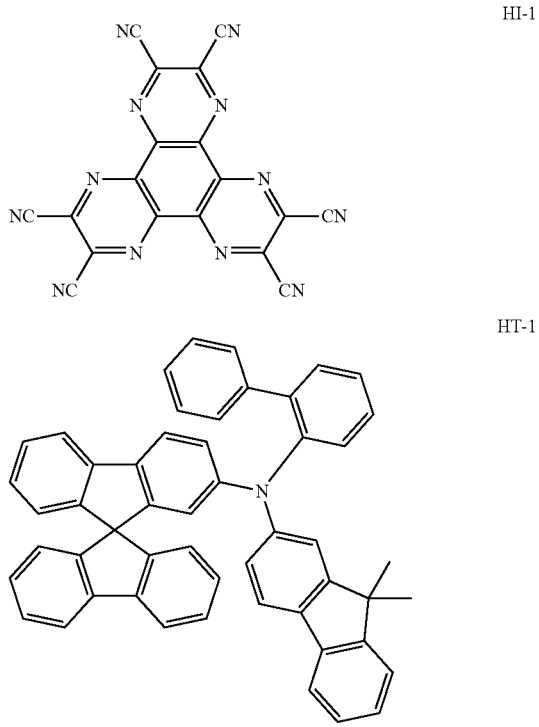

HI-1

HT-1

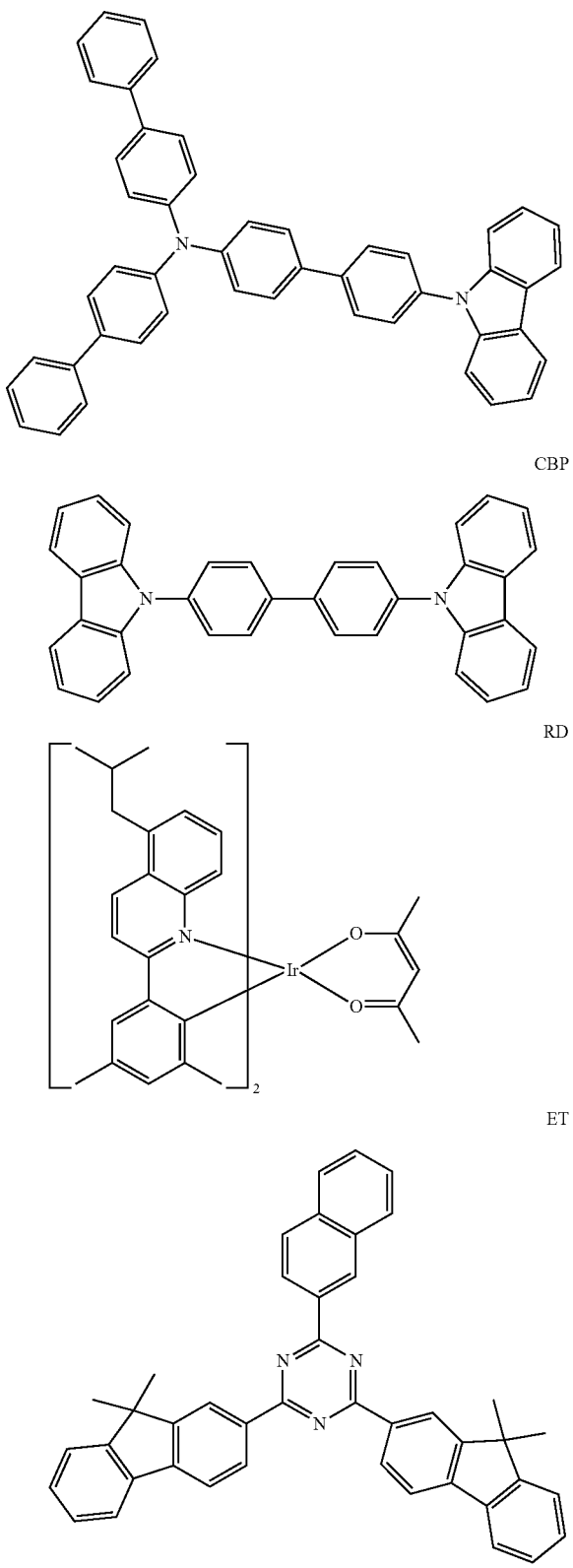

The preparation steps are as follows:
a. Cleaning of the ITO (Indium Tin Oxide) conductive glass substrate: the substrates are washed with various solvents (such as one or more of chloroform, ketone, or isopropyl alcohol), and then treated with UV and ozone;
b. The materials were vacuum-deposited in high vacuum ($1\times10^{-6}$ mbar) to form the following layers: HI (30 nm), HT-1 (60 nm), HT-2 (10 nm), host material: 3% RD (40 nm), ET: Liq (50:50, 30 nm), Liq (1 nm), and Al (100 nm). After cleaning, the resultant ITO substrate was mounted on a vacuum deposition apparatus, compound HI-1 was vacuum-deposited on the anode to form a hole-injection layer having a thickness of 30 nm, then compound HT-1 and compound HT-2 were vacuum-deposited sequentially on the hole-injection layer to form two hole-transport layers having a thickness of 60 nm and 10 nm, respectively. Comp-1 (host) and compound RD (dopant) were placed in two different evaporation sources, and co-deposited on the hole transport layer at a weight ratio of 100:3 to form an emitting layer having a thickness of 40 nm. Subsequently, compound ET and Liq were placed in two different evaporation sources, and co-deposited on the light emitting layer at a weight ratio of 50:50 to form an electron transport layer having a thickness of 30 nm. Liq was then deposited on the electron transport layer to form an electron injection layer having a thickness of 1 nm and Al was deposited on the electron injection layer to form a cathode having a thickness of 100 nm.
c. Encapsulation: encapsulating the device in a nitrogen-regulated glove box with UV curable resin.

Device Examples 2-22 and Comparative Example 1 were implemented in the same way as device example 1, except that corresponding compounds and the different co-hosts shown in Table 1 were utilized instead of comp-1 in forming an emitting layer. The co-host refers to that two compounds were respectively placed in different evaporation sources, and control the weight ratio of materials during the co-evaporation.

The current-voltage and luminescence (IVL) characteristics of the red-emitting OLEDs were studied. The current efficiency and the device lifetime were summarized in Table 2. The lifetime of each Device Examples 1-22 is a relative value of that of Comparative Example 1.

TABLE 2

| OLED Device | Host | Current efficiency CE@1000 nits (cd/A) | T95@1000 nits |
|---|---|---|---|
| Device Example 1 | comp-1 | 21.8 | 208% |
| Device Example 2 | comp-2 | 22.5 | 222% |
| Device Example 3 | comp-3 | 22.9 | 247% |
| Device Example 4 | comp-4 | 22.1 | 226% |
| Device Example 5 | comp-5 | 22.3 | 233% |

TABLE 2-continued

| OLED Device | Host | Current efficiency CE@1000 nits (cd/A) | T95@1000 nits |
|---|---|---|---|
| Device Example 6 | comp-6 | 22.0 | 195% |
| Device Example 7 | comp-9 | 22.2 | 183% |
| Device Example 8 | comp-10 | 22.6 | 201% |
| Device Example 9 | comp-11 | 22.0 | 189% |
| Device Example 10 | comp-12 | 21.4 | 194% |
| Device Example 11 | comp-13 | 20.7 | 183% |
| Device Example 12 | comp-15 | 21.0 | 204% |
| Device Example 13 | comp-2: comp-7 = 7:3 | 24.1 | 304% |
| Device Example 14 | comp-3: comp-7 = 7:3 | 24.4 | 298% |
| Device Example 15 | comp-6: comp-7 = 7:3 | 24.8 | 325% |
| Device Example 16 | comp-10: comp-7 = 7:3 | 25.0 | 316% |
| Device Example 17 | comp-12: comp-7 = 7:3 | 24.4 | 300% |
| Device Example 18 | comp-14: comp-7 = 7:3 | 24.3 | 293% |
| Device Example 19 | comp-3: comp-8 = 7:3 | 24.0 | 311% |
| Device Example 20 | comp-6: comp-8 = 7:3 | 24.2 | 307% |
| Device Example 21 | comp-10: comp-8 = 7:3 | 23.8 | 302% |
| Device Example 22 | comp-14: comp-8 = 7:3 | 24.5 | 296% |
| Comparative Example 1 | CBP | 16.7 | 100% |

Table 2 shows that the luminescence efficiency and the lifetime of the device embodiments 1-22 are obviously improved compared with the comparative example 1. It means that the luminescence efficiency and the lifetime of the OLED prepared with the organic compound as described herein are greatly improved.

The technical features of the above-described embodiments can be combined in any ways. For the sake of brevity, not all possible combinations of the technical features of the above-described embodiments have been described. However, as long as there are no contradictions in the combination of these technical features, they should be considered to be within the scope of this specification.

What described above are several embodiments of the present disclosure, and they are specific and in detail, but not intended to limit the scope of the present disclosure. It will be understood that improvements can be made without departing from the concept of the present disclosure, and all these modifications and improvements are within the scope of the present disclosure. The scope of the present disclosure shall be subject to the appended claims.

What is claimed is:

1. An organic compound, comprising a structure of formula (I):

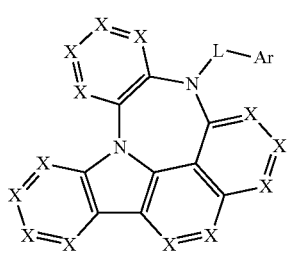

(I)

wherein:
each X independently represents N or $CR_1$, at least one X is $CR_1$;
each $R_1$ is independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof;

L is a linking group selected from the group consisting of a single bond, a $C_6$-$C_{60}$ arylene group, a $C_2$-$C_{60}$ heteroaromatic group, a $C_3$-$C_{60}$ aliphatic ring, a $C_6$-$C_{60}$ fused aromatic ring group, and any combination thereof;

Ar is selected from the group consisting of a substituted/unsubstituted aromatic or heteroaromatic group containing 5 to 40 ring atoms, an aryloxy or heteroaryloxy group containing 5 to 40 ring atoms, and any combination thereof, wherein one or more Ars may form a monocyclic or polycyclic aliphatic or aromatic ring system with each other and/or with the rings bonded thereto.

2. The organic compound according to claim 1, wherein at least one X is N atom.

3. The organic compound according to claim 2, wherein Ar comprises an electron-accepting group.

4. The organic compound according to claim 1, wherein the organic compound comprises a structure of formula (II):

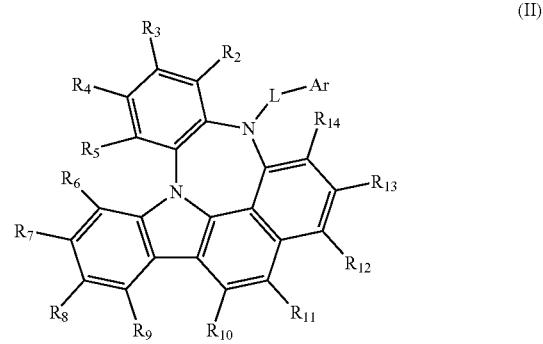

(II)

wherein:
L is a linking group selected from the group consisting of a single bond, a $C_6$-$C_{60}$ arylene group, a $C_2$-$C_{60}$ heteroaromatic group, a $C_3$-$C_{60}$ aliphatic ring, a $C_6$-$C_{60}$ fused aromatic ring group, and any combination thereof;

Ar is selected from the group consisting of a substituted/unsubstituted aromatic or heteroaromatic group containing 5 to 40 ring atoms, an aryloxy or heteroaryloxy group containing 5 to 40 ring atoms, and any combination thereof, wherein one or more Ars may form a monocyclic or polycyclic aliphatic or aromatic ring system with each other and/or with the rings bonded thereto;

each of $R_2$ to $R_{14}$ is a substituent, and at each occurrence is independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof.

5. The organic compound according to claim 4, wherein $R_1$-$R_{14}$, L, Ar are independently selected from one or combinations of more than one of the following groups:

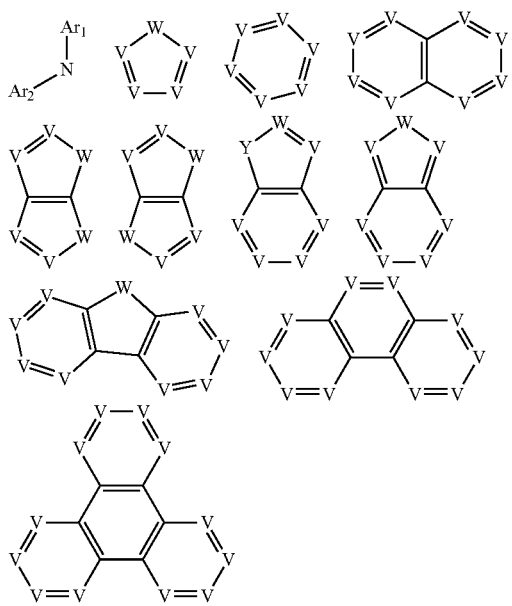

wherein: V in multiple occurrences, is independently selected from $CR_{15}$ or N;

W in multiple occurrences, is independently selected from $CR_{16}R_{17}$, $SiR_{18}R_{19}$, $NR_{20}$, C(=O), S, or O;

$Ar_1$ and $Ar_2$ are defined as Ar, Ar is selected from the group consisting of a substituted/unsubstituted aromatic or heteroaromatic group containing 5 to 40 ring atoms, an aryloxy or heteroaryloxy group containing 5 to 40 ring atoms, and any combination thereof, wherein one or more Ars may form a monocyclic or polycyclic aliphatic or aromatic ring system with each other and/or with the rings bonded thereto;

$R_{15}$ to $R_{20}$ at each occurrence are independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof.

6. The organic compound according to claim 5, wherein Ar comprises an electron-accepting group.

7. The organic compound according to claim 4, wherein Ar comprises an electron-accepting group.

8. The organic compound according to claim 1, wherein Ar comprises an electron-accepting group.

9. The organic compound according to claim 8, wherein the electron-accepting group is selected from F, a cyano group, or one of the following groups:

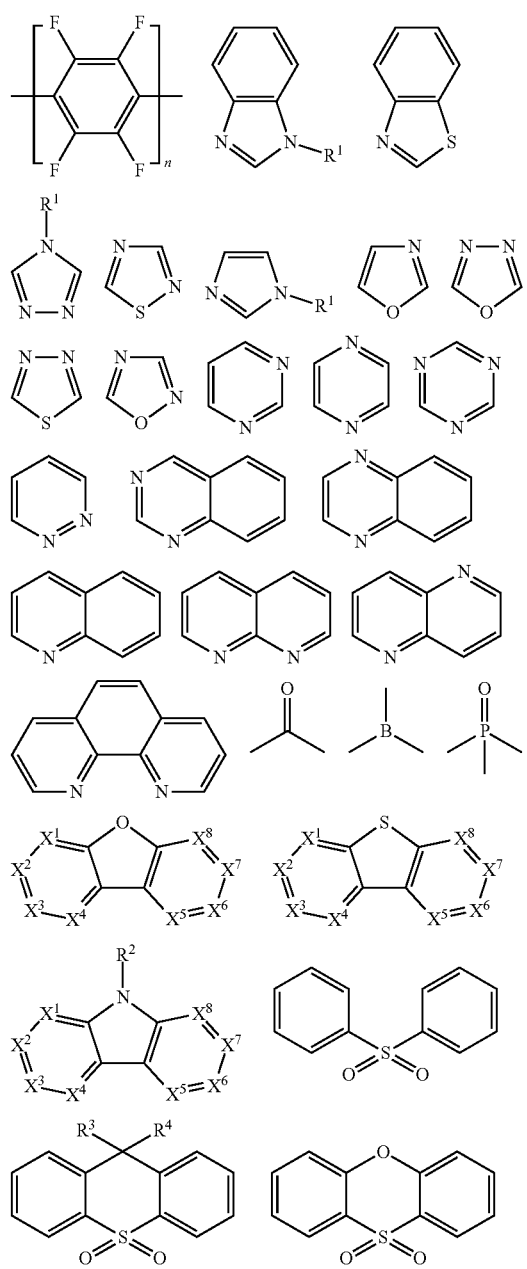

-continued

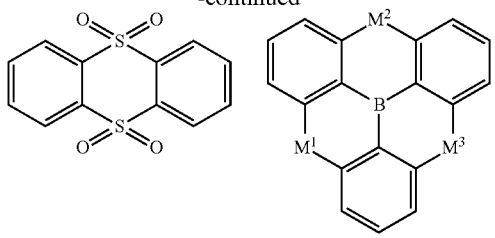

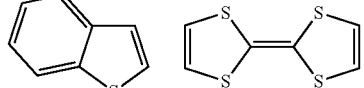
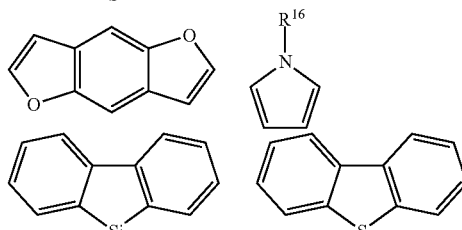
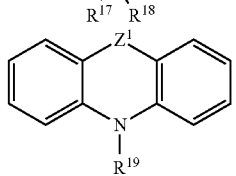
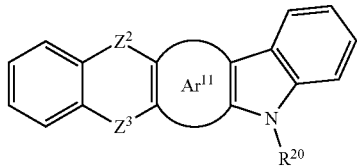
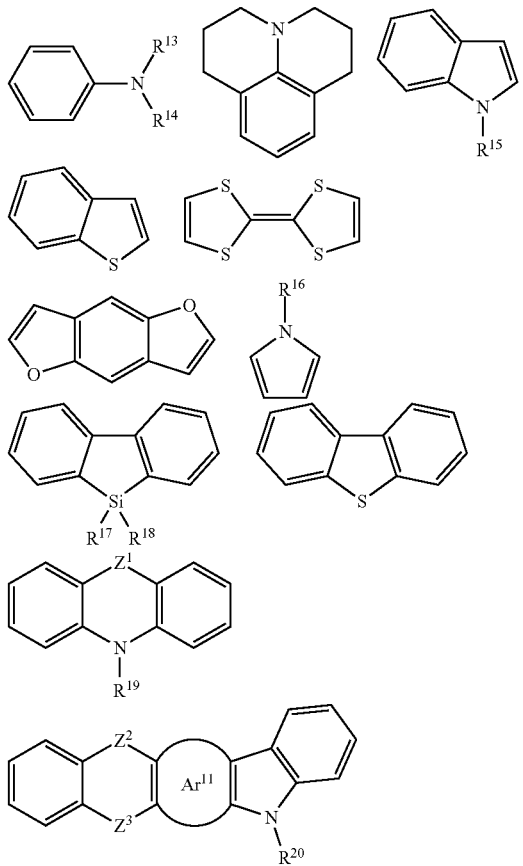

wherein,
n is an integer from 1 to 3;
each of $X^1$ to $X^8$ is $CR_5$ or N, at least one of $X^1$ to $X^8$ is N, and any adjacent two $R_5$ can form a monocyclic or polycyclic aliphatic or aromatic ring system;
$M^1$, $M^2$, $M^3$ independently represent $N(R_6)$, $C(R_7)_2$, $Si(R_8)_2$, $C=N(R_9)$, $C=C(R_{10})_2$, $P(R_{11})$, $P(=O)R_{12}$, O, S, S=O, $SO_2$, or null;
$R_1$ to $R_{12}$ are independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof, wherein one or more $R_1$ to $R_{12}$ may form a ring system with each other and/or with the groups bonded thereto.

10. A mixture, comprising an organic compound H1 and an organic compound H2, wherein the organic compound H1 is selected from an organic compound according to claim 1, the organic compound H2 is another organic functional material, and is selected from one or more of the following: a hole-injection material, a hole-transport material, an electron-transport material, an electron-injection material, an electron-blocking material, a hole-blocking material, an emitting material, a host material, an organic dye.

11. The mixture according to claim 10, wherein the organic compound H2 comprises a structure of formula (III):

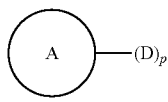

(III)

wherein, A is selected from a $C_1$-$C_{30}$ substituted/unsubstituted alkyl group, a $C_3$-$C_{30}$ substituted/unsubstituted cycloalkyl group, or a $C_5$-$C_{60}$ substituted/unsubstituted aromatic hydrocarbon or aromatic heterocyclic group;
D is an electron-rich group; p is an integer from 1 to 6.

12. The mixture according to claim 11, wherein the electron-rich group comprises any one of the following groups:

wherein,
$Ar_{11}$ represents a $C_5$-$C_{40}$ aromatic or heteroaromatic group;
$Z^1$, $Z^2$, $Z^3$ are independently selected from a single bond, $CR_{21}R_{22}$, $SiR_{23}R_{24}$, $NR_{25}$, O, C(=O), S, S-O, or $SO_2$, and $Z^2$ and $Z^3$ are not single bonds at the same time;
$R_{13}$ to $R_{25}$ are independently selected from the group consisting of —H, -D, a $C_1$-$C_{20}$ linear alkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ substituted ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a cross-linkable group, a substituted/unsubstituted aromatic or heteroaromatic group containing 5 to 40 ring atoms, an aryloxy or heteroaryloxy group containing 5 to 40 ring atoms, and any combination thereof, wherein one or more $R_{13}$-$R_{25}$ may form a ring system with each other and/or with the groups bonded to thereto.

13. The mixture according to claim 10, wherein the mixture further comprises an emitting material, and the emitting material is selected from the group consisting of a singlet emitting material, a triplet emitting material, and a thermally-activated delayed fluorescent (TADF) material.

14. An organic electronic device, comprising a functional layer, wherein the functional layer comprises the mixture according to claim 10.

15. The organic electronic device according to claim 14, wherein the organic electronic device is selected from an organic light emitting diode, an organic photovoltaic cell, an organic light emitting electrochemical cell, an organic field effect transistor, an organic light emitting field effect transistor, an organic laser, an organic spintronic device, a photodiode, an organic sensor, or an organic plasmon emitting diode.

16. The organic electronic device according to claim 15, wherein the organic electronic device is an organic electroluminescent device comprising the mixture.

17. An organic electronic device, comprising a functional layer, wherein the functional layer comprises the organic compound according to claim 1.

18. The organic electronic device according to claim 17, wherein the organic electronic device is selected from an organic light emitting diode, an organic photovoltaic cell, an organic light emitting electrochemical cell, an organic field effect transistor, an organic light emitting field effect transistor, an organic laser, an organic spintronic device, a photodiode, an organic sensor, or an organic plasmon emitting diode.

19. The organic electronic device according to claim 18, wherein the organic electronic device is an organic electroluminescent device comprising the organic compound.

\* \* \* \* \*